United States Patent
Ohba

(10) Patent No.: US 9,748,217 B2
(45) Date of Patent: Aug. 29, 2017

(54) METHOD OF PRODUCING SEMICONDUCTOR DEVICE

(75) Inventor: Takayuki Ohba, Kanagawa (JP)

(73) Assignee: The University of Tokyo, Tokyo (JP)

( * ) Notice: Subject to any disclaimer, the term of this patent is extended or adjusted under 35 U.S.C. 154(b) by 106 days.

(21) Appl. No.: 14/003,288

(22) PCT Filed: Mar. 8, 2012

(86) PCT No.: PCT/JP2012/056005
§ 371 (c)(1),
(2), (4) Date: Sep. 5, 2013

(87) PCT Pub. No.: WO2012/121344
PCT Pub. Date: Sep. 13, 2012

(65) Prior Publication Data
US 2013/0344655 A1    Dec. 26, 2013

(30) Foreign Application Priority Data

Mar. 9, 2011  (WO) .................. PCT/JP2011/055486

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/6835* (2013.01); *H01L 21/76898* (2013.01);
(Continued)

(58) Field of Classification Search
CPC ....... H01L 2924/00; H01L 2924/00014; H01L 2924/1461; H01L 2224/48091;
(Continued)

(56) References Cited

U.S. PATENT DOCUMENTS 7,676,912 B2    3/2010  Sasaki et al.
2002/0025587 A1  2/2002  Wada
(Continued)

FOREIGN PATENT DOCUMENTS

JP    2001-094039    4/2001
JP    2001-217386    8/2001
(Continued)

OTHER PUBLICATIONS

International Search Report mailed on Jun. 12, 2012.
(Continued)

*Primary Examiner* — Robert Bachner
(74) *Attorney, Agent, or Firm* — IPUSA, PLLC

(57) ABSTRACT

A semiconductor device production method where separate semiconductor chips are stacked on a semiconductor substrate having a main surface on which multiple semiconductor chips including semiconductor integrated circuits are formed, the semiconductor chips in different layers are connected to each other to enable signal transmission, and a structure formed thereby is separated into multiple stacks of the semiconductor chips. The method includes a first step of forming an insulating layer on the main surface of the semiconductor substrate; a second step of stacking the separate semiconductor chips, which include the integrated semiconductor circuits on main surfaces thereof, via the insulating layer on the semiconductor chips formed on the semiconductor substrate such that opposite surfaces of the separate semiconductor chips opposite to the main surfaces face the insulating layer; and a third step of forming connecting parts that enable signal transmission between the semiconductor chips in different layers.

19 Claims, 66 Drawing Sheets

(51) Int. Cl.
  *H01L 23/31* (2006.01)
  *H01L 23/48* (2006.01)
  *H01L 21/768* (2006.01)
  *H01L 25/065* (2006.01)
  *H01L 21/683* (2006.01)
  *H01L 21/56* (2006.01)
  *H01L 23/544* (2006.01)

(52) U.S. Cl.
  CPC ...... *H01L 23/3114* (2013.01); *H01L 23/3121* (2013.01); *H01L 23/481* (2013.01); *H01L 25/0657* (2013.01); *H01L 21/561* (2013.01); *H01L 23/544* (2013.01); *H01L 2221/6834* (2013.01); *H01L 2221/68327* (2013.01); *H01L 2221/68363* (2013.01); *H01L 2221/68381* (2013.01); *H01L 2223/54426* (2013.01); *H01L 2224/16145* (2013.01); *H01L 2225/06513* (2013.01); *H01L 2225/06541* (2013.01); *H01L 2225/06544* (2013.01); *H01L 2225/06548* (2013.01); *H01L 2924/1461* (2013.01)

(58) Field of Classification Search
  CPC . H01L 2924/12042; H01L 2224/48465; H01L 25/0657; H01L 2924/01006; H01L 2924/01029; H01L 2924/01033; H01L 2924/01078; H01L 2924/15
  See application file for complete search history.

(56) References Cited

U.S. PATENT DOCUMENTS

| | | |
|---|---|---|
| 2005/0048698 A1 | 3/2005 | Yamaguchi |
| 2006/0038300 A1 | 2/2006 | Tanida et al. |
| 2007/0287265 A1 | 12/2007 | Hatano et al. |
| 2009/0026629 A1 | 1/2009 | Suh |
| 2009/0260228 A1* | 10/2009 | Val .................. H01L 21/561 29/830 |
| 2010/0167467 A1 | 7/2010 | Aoi |
| 2010/0171208 A1 | 7/2010 | Fujii |
| 2011/0165730 A1* | 7/2011 | Ohba .................. B81C 1/00238 438/107 |

FOREIGN PATENT DOCUMENTS

| | | | |
|---|---|---|---|
| JP | 2002-016212 | | 1/2002 |
| JP | 2005-051150 | | 2/2005 |
| JP | 2006-060067 | | 3/2006 |
| JP | 2007-220726 | * | 3/2007 |
| JP | 2007-317822 | | 12/2007 |
| JP | 2009-033108 | | 2/2009 |
| JP | 2009-065111 | | 3/2009 |
| JP | 2009-111384 | | 5/2009 |
| JP | 2010-080752 | | 4/2010 |
| JP | 2010-161102 | | 7/2010 |
| JP | 2010-278279 | | 12/2010 |
| WO | 2010/032729 | | 3/2010 |

OTHER PUBLICATIONS

3D Large Scale Integration Technology Using Wafer-on-Wafer (WOW) Stacking, Takayuki Ohba et al., The Transactions of the Institute of Electronics, Information and Communication Engineers C, No. 11, P464-P476.

TSV(Through Silicon Via) Interconnection on Wafer-on-a-Wafer (WOW) With MEMS Technology, K. Fujimoto et al., Solid-state Sensors, Actuators and Microsystems Conference, 2009. Transducers 2009. International, 2009. 10, P1877-P1880.

Japanese Office Action mailed Sep. 2, 2014.

* cited by examiner

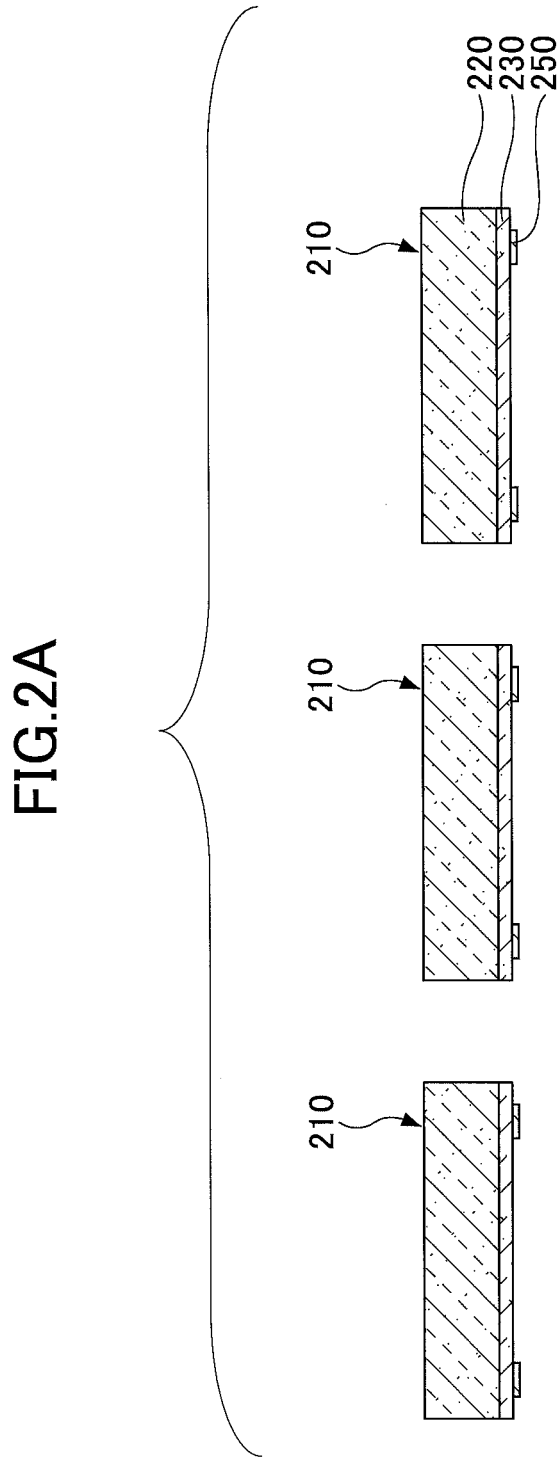

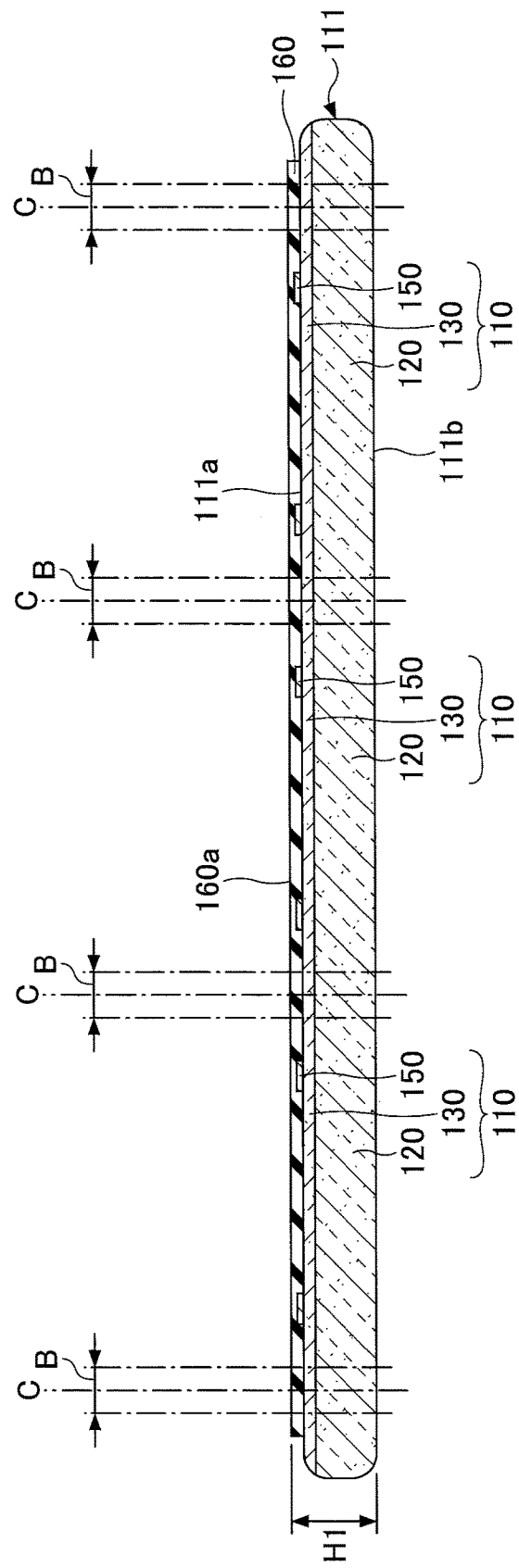

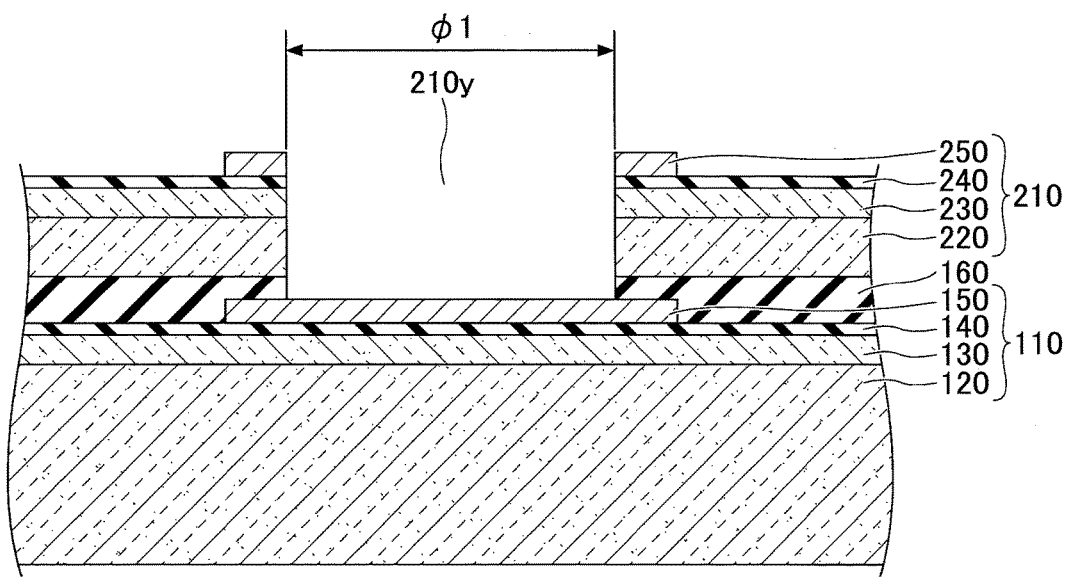
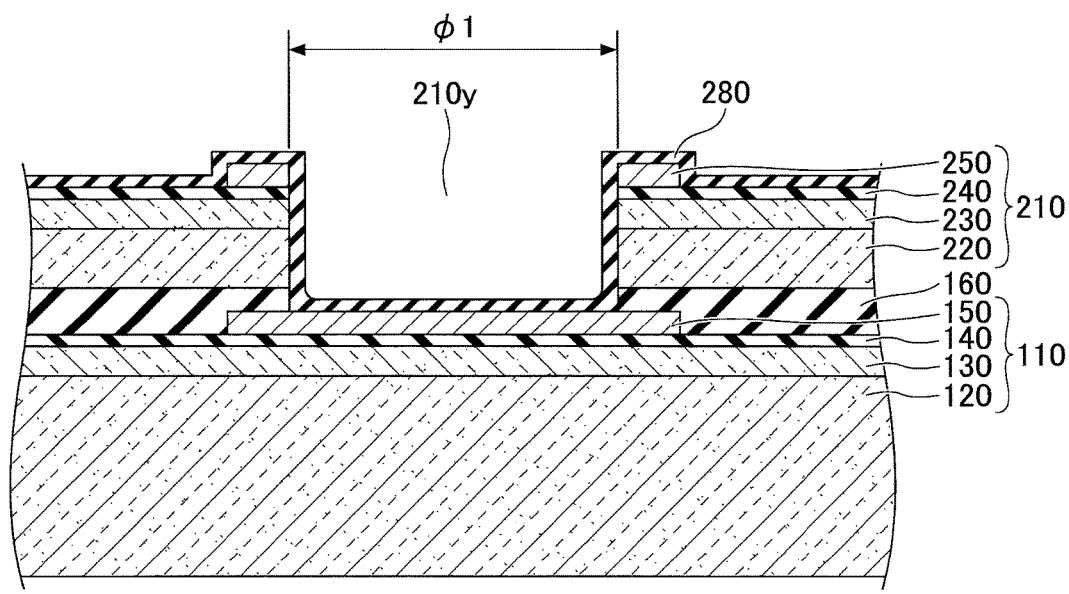

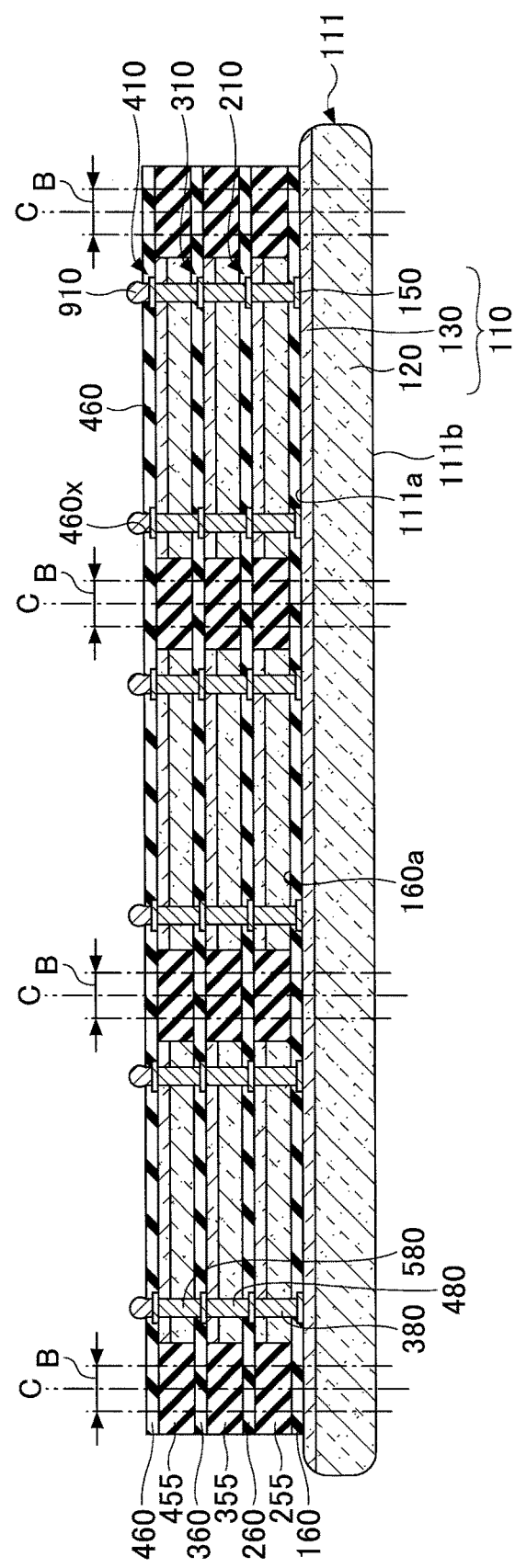

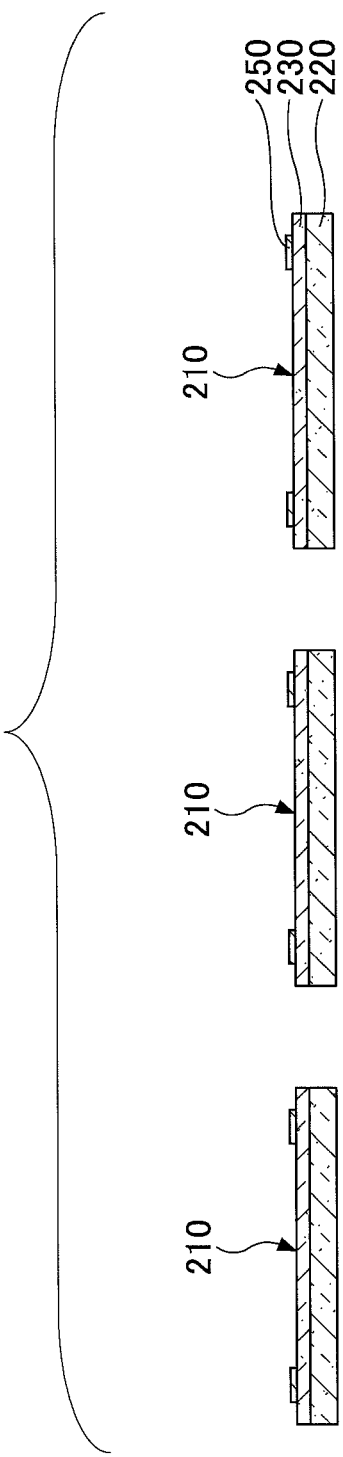

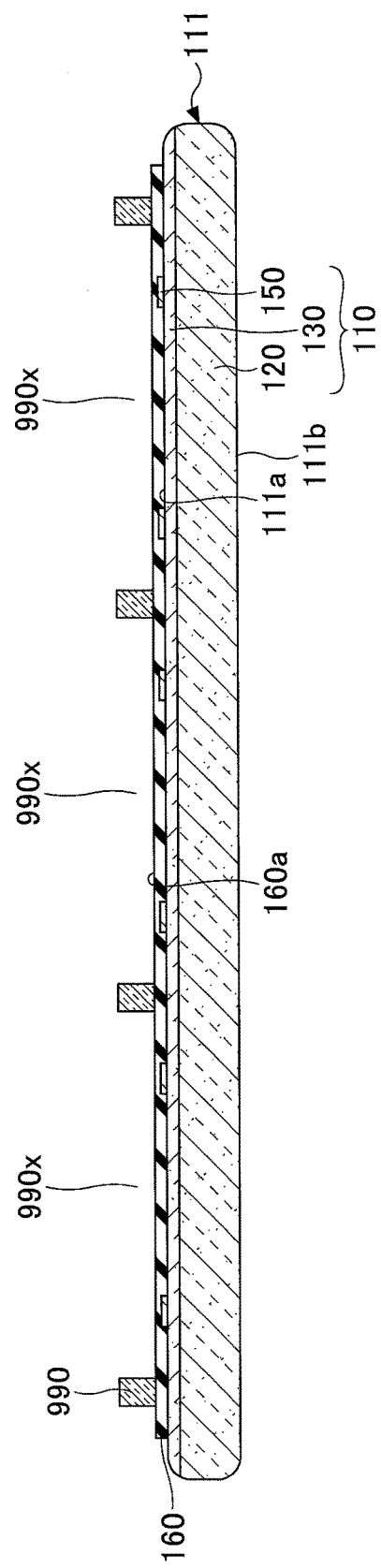

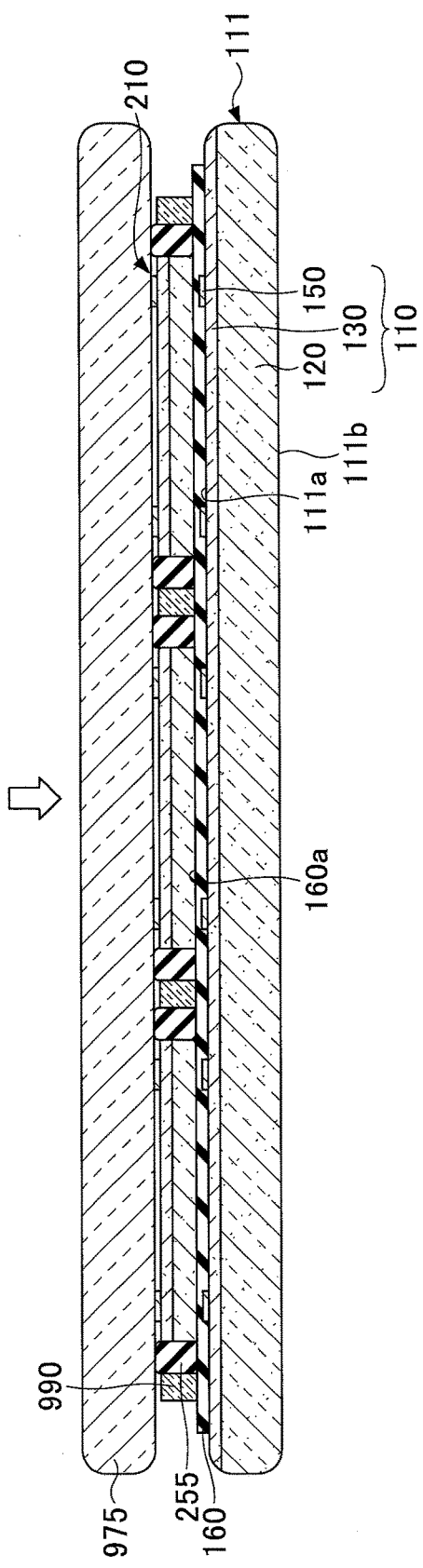

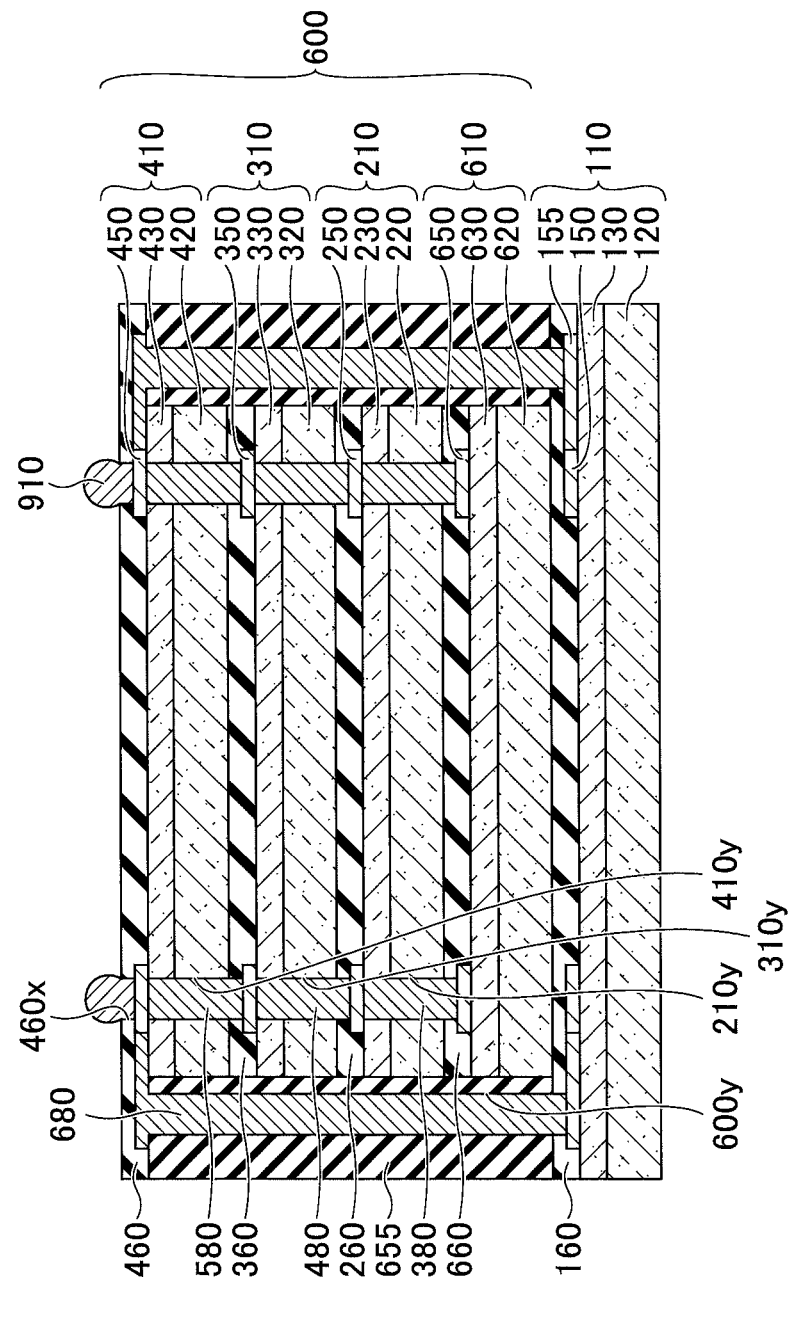

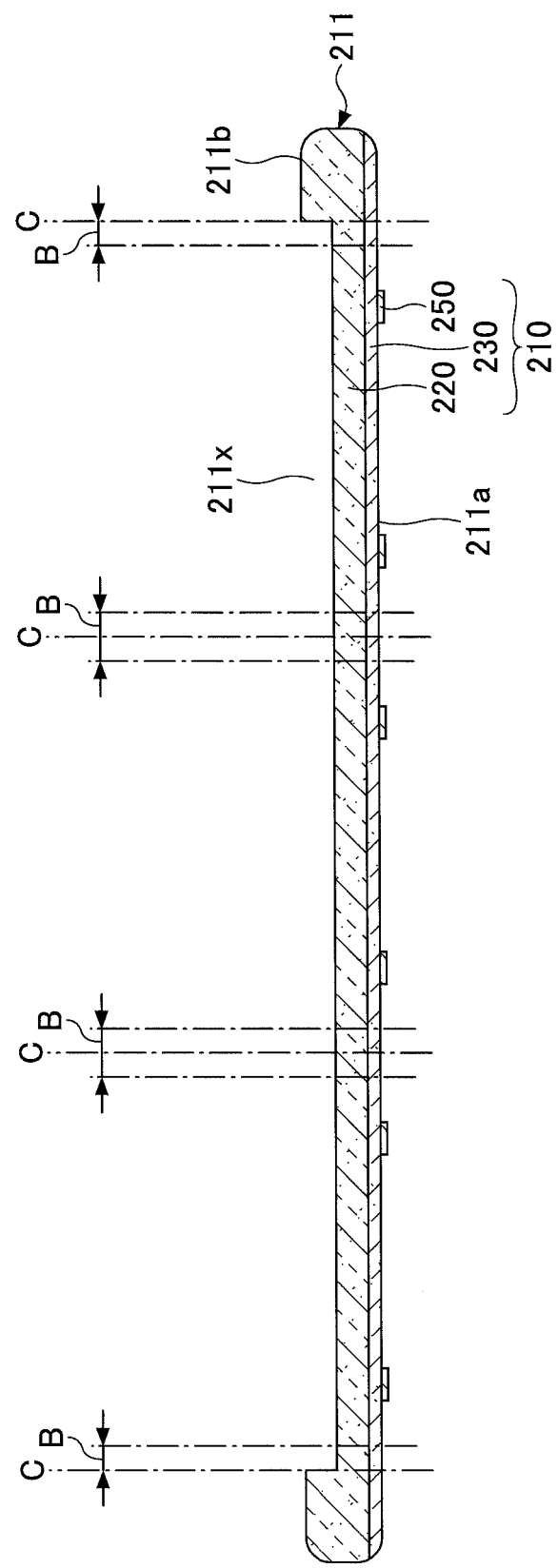

FIG.17H
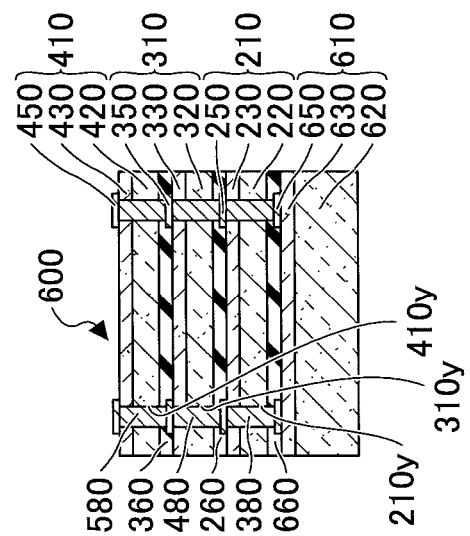
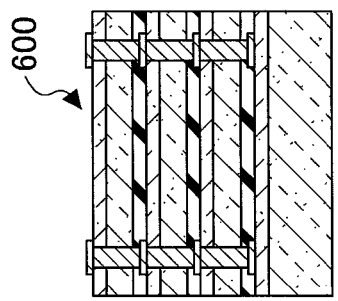
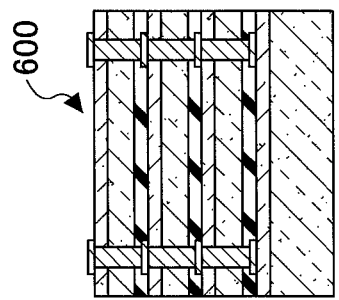

METHOD OF PRODUCING SEMICONDUCTOR DEVICE

TECHNICAL FIELD

The present invention generally relates to a semiconductor device production method. More particularly, the present invention relates to a semiconductor device production method in which separate semiconductor chips are stacked on a semiconductor substrate on which multiple semiconductor chips are formed, the semiconductor chips in different layers are connected to each other to enable signal transmission, and a structure formed thereby is separated into multiple stacks of the semiconductor chips.

BACKGROUND ART

Semiconductor products, particularly for mobile devices such as digital cameras and cell phones, are becoming smaller, thinner, and lighter at a rapid pace. Along with this trend, there is a demand for smaller and high-density semiconductor devices used for such semiconductor products. To meet the demand, chip on wafer (COW) technologies, where a semiconductor chip is directly stacked on a wafer-like semiconductor chip, have been proposed.

RELATED-ART DOCUMENT

Patent Document

[Patent document 1] Japanese Laid-Open Patent Publication No. 2010-278279

DISCLOSURE OF INVENTION

Problems to be Solved by the Invention

In the related-art COW technologies, for example, connecting holes (or through silicon vias (TSV)) with a high aspect ratio are formed through semiconductor chips and the semiconductor chips are connected to each other using bumps or metal protrusions; or semiconductor chips are connected to each other using connecting holes (or through silicon vias (TSV)) after arranging the semiconductor chips such that their device surfaces (on which semiconductor integrated circuits are formed) face each other, and thinning the semiconductor chips.

With the former method, it is necessary to form bumps or metal protrusions on via holes exposed from semiconductor chips to be connected. Accordingly, this method results in low productivity and increases the production costs of semiconductor devices. With the latter method, because semiconductor chips are bonded together such that their device surfaces face each other, a wiring design needs to be determined in advance. Accordingly, with this method, the flexibility of connection wiring is low, and it is not possible to stack three or more semiconductor chips by simply repeating the same process. That is, with this method, a special process is necessary to stack three or more semiconductor chips. Thus, this method also results in low productivity and increases the production costs of semiconductor devices.

Also, with either of the above described methods, a long time and a large amount of material are needed to form a deep via hole and fill the via hole with metal. This in turn increases the production costs of semiconductor devices.

Further, with either of the above described methods, when via holes are formed by, for example, dry etching, the diameters of the ends of the via holes vary depending on the sizes, density, and depths of the via holes. Accordingly, the diameters of via holes exposed when semiconductor chips are thinned to a desired thickness become non-uniform. As a result, the electric resistance of the via holes becomes non-uniform and the reliability is reduced.

One object of the present invention is to prevent the above-described problems of the related-art technologies and provide a reliable, highly-productive, and low-cost method for producing a semiconductor device.

Means for Solving the Problems

In an aspect of this disclosure, there is provided a semiconductor device production method in which separate semiconductor chips are stacked on a semiconductor substrate having a main surface on which multiple semiconductor chips including semiconductor integrated circuits are formed, the semiconductor chips in different layers are connected to each other to enable signal transmission, and a structure formed thereby is separated into multiple stacks of the semiconductor chips. The method includes a first step of forming an insulating layer on the main surface of the semiconductor substrate; a second step of stacking the separate semiconductor chips, which include the integrated semiconductor circuits on main surfaces thereof, via the insulating layer on the semiconductor chips formed on the semiconductor substrate such that opposite surfaces of the separate semiconductor chips opposite to the main surfaces face the insulating layer; and a third step of forming connecting parts that enable signal transmission between the semiconductor chips in different layers.

Advantageous Effect of the Invention

An aspect of the present invention makes it possible to provide a reliable, highly-productive, and low-cost method for producing a semiconductor device.

BRIEF DESCRIPTION OF THE DRAWINGS

FIG. 2A is a drawing (1) used to describe an exemplary process of producing a semiconductor device according to the first embodiment;

FIG. 2F is a drawing (6) used to describe an exemplary process of producing a semiconductor device according to the first embodiment;

FIG. 2L is a drawing (12) used to describe an exemplary process of producing a semiconductor device according to the first embodiment;

FIG. 2M is a drawing (13) used to describe an exemplary process of producing a semiconductor device according to the first embodiment;

FIG. 2W is a drawing (23) used to describe an exemplary process of producing a semiconductor device according to the first embodiment;

FIG. 3A is a drawing (1) used to describe an exemplary process of producing a semiconductor device according to a first variation of the first embodiment;

FIG. 4A is a drawing (1) used to describe an exemplary process of producing a semiconductor device according to a second variation of the first embodiment;

FIG. 4C is a drawing (3) used to describe an exemplary process of producing a semiconductor device according to the second variation of the first embodiment;

FIG. 16 is a cut-away side view of a semiconductor device according to an eighth embodiment;

FIG. 17C is a drawing (3) used to describe an exemplary process of producing a semiconductor device according to the eighth embodiment;

FIG. 17H is a drawing (8) used to describe an exemplary process of producing a semiconductor device according to the eighth embodiment;

DESCRIPTION OF EMBODIMENTS

Preferred embodiments of the present invention are described below with reference to the accompanying drawings. Throughout the accompanying drawings, the same reference numbers are used for the same components, and overlapping descriptions of those components may be omitted.

First Embodiment

Structure of Semiconductor Device of First Embodiment

Figure 1:
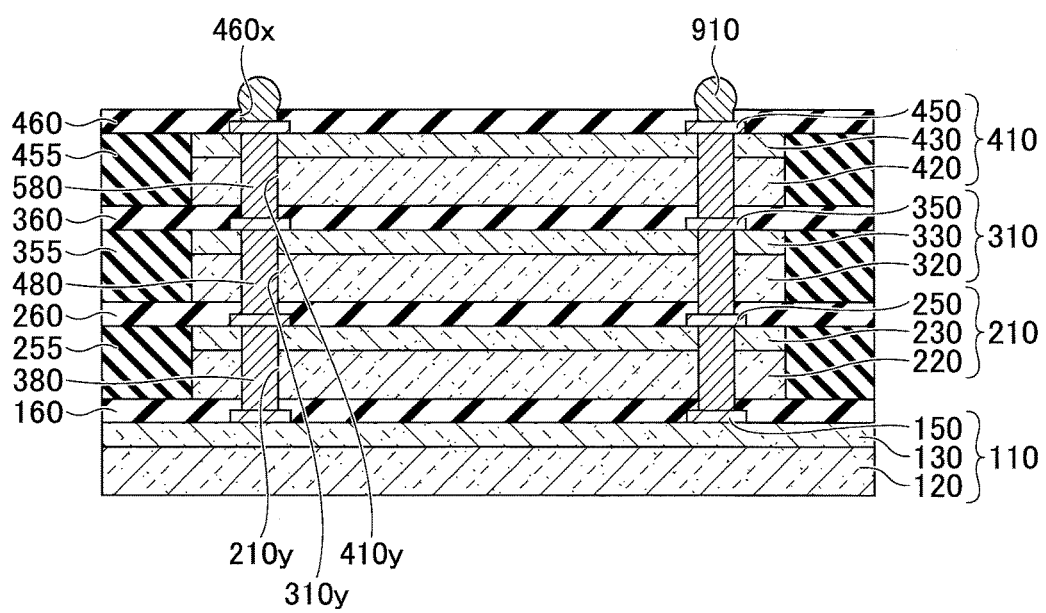
FIG. 1 is a cut-away side view of a semiconductor device according to a first embodiment.

First, an exemplary structure of a semiconductor device according to a first embodiment is described. FIG. 1 is a cut-away side view of a semiconductor device according to the first embodiment. Referring to FIG. 1, a semiconductor device 100 of the first embodiment has a structure where a semiconductor chip 110, a semiconductor chip 210, a semiconductor chip 310, and a semiconductor chip 410 are stacked on each other. Side surfaces of the semiconductor chips 210 through 410 are sealed, respectively, by resin layers 255 through 455 that are sealing insulating layers.

The semiconductor chips 110 through 410 include main substrates 120 through 420, semiconductor integrated circuits 130 through 430, and electrode pads 150 through 450, respectively. The main substrates 120 through 420 include, for example, silicon. Each of the semiconductor integrated circuits 130 through 430 may be implemented by, for example, a silicon substrate where a diffusion layer (not shown), an insulating layer (not shown), via holes (not shown), and a wiring layer (not shown) are formed. Each of the semiconductor integrated circuits 130 through 430 is provided on one surface of the corresponding one of the main substrates 120 through 420. Hereafter, the surfaces of the semiconductor chips 110 through 410, where the semiconductor integrated circuits 130 through 430 are provided, are referred to as "main surfaces" or "device surfaces".

The electrode pads 150 through 450 are provided on the corresponding semiconductor integrated circuits 130 through 430 via insulating layers (not shown). The electrode pads 150 through 450 are electrically connected to wiring layers (not shown) provided on the corresponding semiconductor integrated circuits 130 through 430. Each of the electrode pads 150 through 450 may be implemented, for example, by a laminated structure where an Au layer is laminated on a Ti layer. Also, each of the electrode pads 150 through 450 may be implemented by a laminated structure where an Au layer is laminated on an Ni layer; a laminated structure where a Pd layer and an Au layer are laminated sequentially on an Ni layer; a laminated structure where a Cu layer or an Al layer is laminated on a layer made of a refractory metal such as Co, Ta, Ti, or TiN instead of Ni; or wiring having a damascene structure.

The semiconductor chip 110 and the semiconductor chip 210 are bonded together via a resin layer 160 that is an insulating layer. The electrode pad 150 of the semiconductor chip 110 and the electrode pad 250 of the semiconductor chip 210 are electrically connected to each other via a metal layer 380 filling a via hole 210y. The semiconductor chip 210 and the semiconductor chip 310 are bonded together via a resin layer 260 that is an insulating layer. The electrode pad 250 of the semiconductor chip 210 and the electrode pad 350 of the semiconductor chip 310 are electrically connected to each other via a metal layer 480 filling a via hole 310y. The semiconductor chip 310 and the semiconductor chip 410 are bonded together via a resin layer 360 that is an insulating layer. The electrode pad 350 of the semiconductor chip 310 and the electrode pad 450 of the semiconductor chip 410 are electrically connected to each other via a metal layer 580 filling a via hole 410y.

Here, a via hole is a connecting hole for connecting semiconductor chips (that are not necessarily vertically adjacent). For example, a metal layer or an optical waveguide is formed inside of the via hole to connect semiconductor chips with each other to enable signal transmission. Such a metal layer or an optical waveguide formed inside of a via hole may be referred to as "connecting part".

A solder resist layer 460, which is an insulating layer and has an opening 460x, is formed on the main surface of the semiconductor chip 410. An external connection terminal 910 is formed on the electrode pad 450 exposed in the opening 460x. The external connection terminal 910 electrically connects the semiconductor device 100 to, for example, a wiring board provided outside of the semiconductor device 100. The external connection terminal 910 is electrically connected to the electrode pad 450. The external connection terminal 910 may be implemented, for example, by a solder ball, an Au bump, or a conductive paste. When a solder ball is used as the external connection terminal 910, for example, an alloy including Pb, an alloy of Sn and Cu, an alloy of Sn and Ag, or an alloy of Sn, Ag, and Cu may be used as a material for the external connection terminal 910.

Process of Producing Semiconductor Device of First Embodiment

Next, an exemplary process of producing a semiconductor device according to the first embodiment is described. FIGS. 2A through 2X are drawings used to describe an exemplary process of producing a semiconductor device according to the first embodiment.

At a step illustrated by FIG. 2A, multiple semiconductor chips 210 are prepared by dicing a semiconductor wafer. The thickness of each of the semiconductor chips 210 has not been reduced and is, for example, about 600 µm to about 800 µm.

Figure 2B:
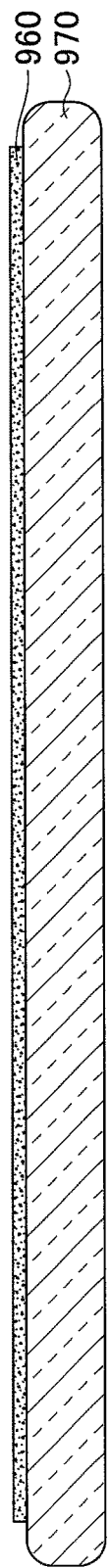
FIG. 2B is a drawing (2) used to describe an exemplary process of producing a semiconductor device according to the first embodiment.

At a step illustrated by FIG. 2B, a support 970 is prepared and an adhesive layer 960 is formed on one surface of the support 970. The support 970 is preferably implemented by a substrate that can transmit light during an alignment step. For example, the support 970 may be implemented by a silica glass substrate. The adhesive layer 960 may be implemented by an adhesive that softens at a heating temperature (e.g., about 200° C. or lower) used in a step illustrated by FIG. 2G. The adhesive layer 960 may be formed on one surface of the support 970 by, for example, spin coating. Also, instead of by spin coating, the adhesive layer 960 may be formed by attaching an adhesive film on one surface of the support 970.

Figure 2C:
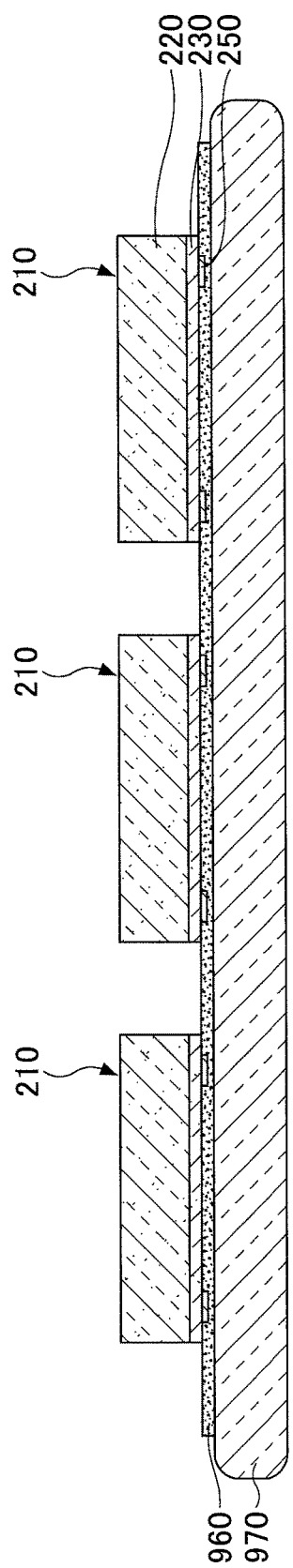
FIG. 2C is a drawing (3) used to describe an exemplary process of producing a semiconductor device according to the first embodiment.

At a step illustrated by FIG. 2C, the semiconductor chips 210 are (temporarily) bonded, with their faces down, via the adhesive layer 960 onto the surface of the support 970. The semiconductor chips 210 are bonded at positions corresponding to a device layout of a semiconductor substrate 111 that is stacked at a step of FIG. 2G described later.

Figure 2D:
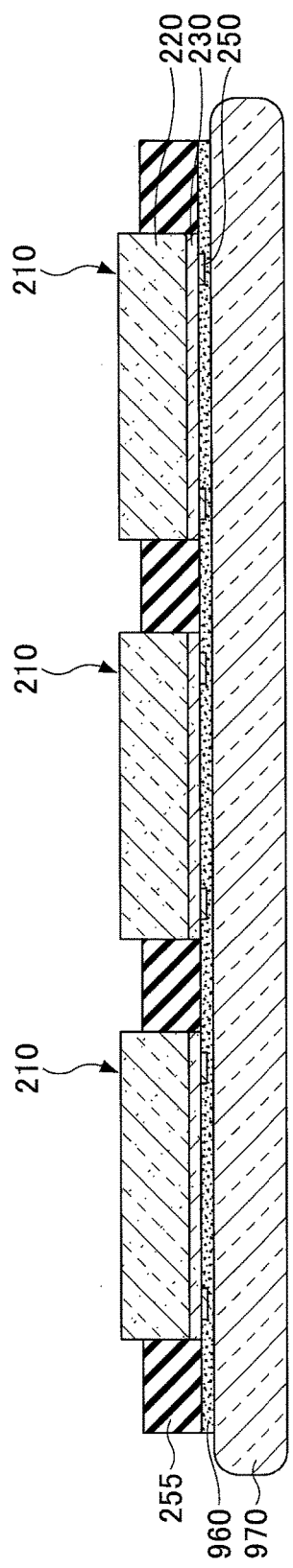
FIG. 2D is a drawing (4) used to describe an exemplary process of producing a semiconductor device according to the first embodiment.

At a step illustrated by FIG. 2D, the resin layer 255 is formed on the adhesive layer 960 to seal at least parts of side surfaces of each semiconductor chip 210. At this step, the side surfaces of each semiconductor chip 210 are sealed to such an extent that the side surfaces of the semiconductor chip 210 are completely sealed by the resin layer 255 after the thickness of the semiconductor chip 210 is reduced at a step of FIG. 2E described later. Alternatively, the side surfaces as well as a back surface (where no device is formed) of the semiconductor chip 210 may be sealed with the resin layer 255. In this case, the resin layer 255 sealing parts of the side surfaces and the back surface of the semiconductor chip 210 is removed and the thickness of the semiconductor chip 210 is reduced at the step of FIG. 2E described later.

As a material of the resin layer 255, a thermosetting insulating resin including, for example, benzocyclobutene (BCB) as a primary component may be used. Other exemplary materials of the resin layer 255 include a thermosetting insulating resin including an epoxy resin, an acrylic resin, or a polyimide resin as a primary component; and an insulating composite to which fine solid powder such as silica is added. For example, the resin layer 255 may be formed by applying a thermosetting insulating resin including benzocyclobutene (BCB) as a primary component on the adhesive layer 960 using a spin coating method and heating the thermosetting insulating resin to a setting temperature. A squeegee process may also be performed before heating the thermosetting insulating resin. Also, instead of by a spin coating method, the resin layer 255 may be formed by a vapor deposition method or by pasting a resin film.

Figure 5:
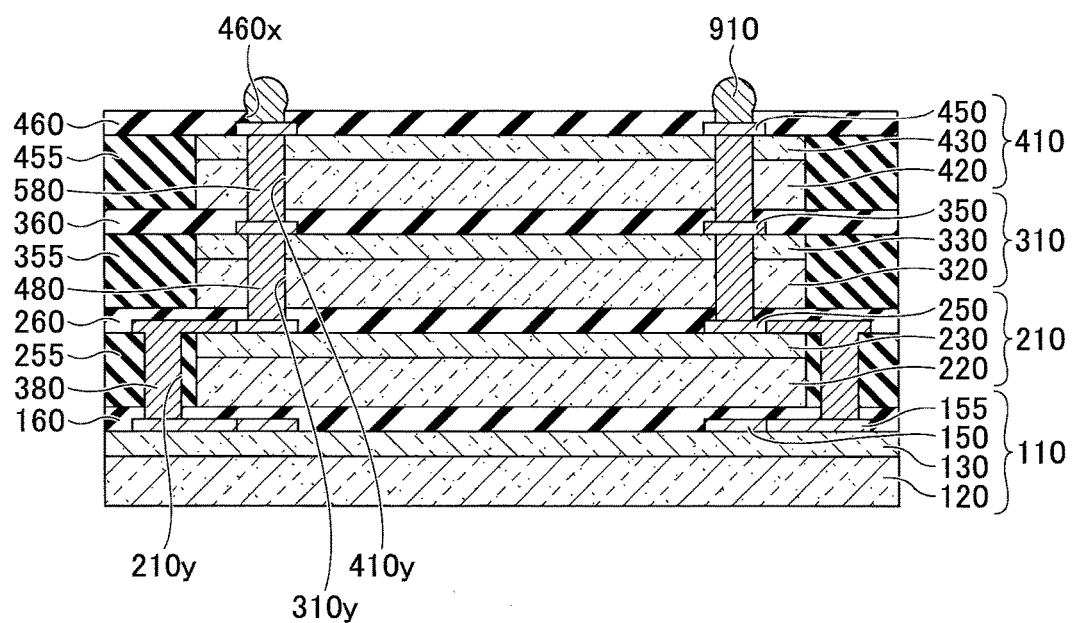
FIG. 5 is a cut-away side view (1) of a semiconductor device according to a second embodiment.

The resin layer 255 includes a function to provide a surface that is flat enough to perform lithography for rewiring, a function as a process material used to form a via hole that passes through the resin layer 255 as illustrated in FIG. 5, a function to protect the semiconductor chips 210 from being damaged when they are separated by a dicer, and a function to provide moisture resistance.

Figure 2E:
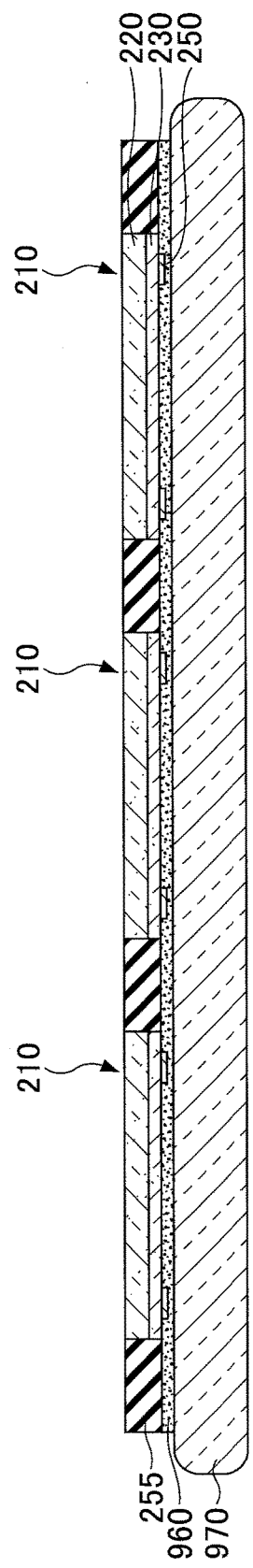
FIG. 2E is a drawing (5) used to describe an exemplary process of producing a semiconductor device according to the first embodiment.

At a step illustrated by FIG. 2E, unnecessary parts of the resin layer 255 and a part of the main substrate 220 at the back of each semiconductor chip 210 are ground by, for example, a grinder to reduce the thickness of the semiconductor chip 210 (thinning step). As a result of this thinning step, the thickness of each semiconductor chip 210 is reduced and the side surfaces of the semiconductor chip 210 with a reduced thickness are sealed by the resin layer 255. For the thinning step, dry polishing or wet etching may be used together with grinding. The thickness of each semiconductor chip 210 after the thinning step is, for example, about 1 µm to about 100 µm.

The thickness of each semiconductor chip 210 after the thinning step is preferably greater than or equal to 1 µm because of the reasons described below. To prevent a defect or contamination occurred on the back surface of the semiconductor chip 210 from spreading to the device, the thickness of the semiconductor chip 210 after the thinning step needs to be at least five times or more greater than a device isolation depth (not shown) of devices such as transistors of the semiconductor integrated circuit 230. Here, it is assumed that the device isolation depth (not shown) of devices such as transistors of the semiconductor integrated circuit 230 is about 200 nm to about 500 nm. Accordingly, in this case, the thickness of the semiconductor chip 210 after the thinning step needs to be greater than or equal to 1 µm, which is five times greater than the minimum device isolation depth of 200 nm.

At a step illustrated by FIG. 2F, the semiconductor substrate 111 is prepared and a resin layer 160 is formed on a main surface 111a of the semiconductor substrate 111. The semiconductor substrate 111 includes multiple semiconductor chips 110 and scribe regions B for separating the semiconductor chips 110. "C" in each scribe region B indicates a position (cutting position C) at which the semiconductor substrate 111 is cut by, for example, a dicing blade. The diameter of the semiconductor substrate 111 may be, for example, 6 inches (about 150 mm), 8 inches (about 200 mm), or 12 inches (about 300 mm). The thickness of the semiconductor substrate 111 may be, for example, 0.625 mm (when the diameter is 6 inches), 0.725 mm (when the diameter is 8 inches), or 0.775 mm (when the diameter is 12 inches).

As described above, each of the semiconductor chips 110 includes the main substrate 120, the semiconductor integrated circuit 130, and the electrode pads 150. At this stage, the thickness of the semiconductor chips 110 has not been reduced. The material of the resin layer 160 and the method of forming the resin layer 160 are substantially the same as those of the resin layer 255, and therefore their descriptions are omitted here.

In FIG. 2F, when a back surface 111b (on which no device is formed) of the semiconductor substrate 111 is a reference surface, a surface 160a (that is not in contact with the main surface 111a of the semiconductor substrate 111) of the resin layer 160 is preferably parallel to the reference surface. For example, when the surface 160a of the resin layer 160 is not parallel to the reference surface, the via hole 210y formed in a step of FIG. 2K described later may become tilted, and the metal layer 380 is formed in the tilted via hole 210y. This may reduce the reliability of connection between stacked semiconductor chips. Here, "parallel to the reference surface" indicates that the variation of a height H1 of the surface 160a of the resin layer 160 from the reference surface is less than or equal to 1 µm. A step of determining the variation of the height H1 is preferably performed after the resin layer 160 is formed. When the variation of the height H1 is greater than 1 µm, an additional step is preferably performed to process the surface 160a of the resin layer 160 to make the variation of the height H1 less than or equal to 1 µm. The surface 160a of the resin layer 160 may be processed (or ground), for example, by CMP.

When (n−1) layers of semiconductor chips have already been stacked on a semiconductor substrate of the lowest layer (first layer) and a resin layer is to be formed on the semiconductor chip of the uppermost layer (n-th layer), the back surface (where no device is formed) of the semiconductor substrate of the lowest layer may be used as a reference surface and the resin layer is preferably formed such that its upper surface becomes parallel to the reference surface. In this case, "parallel to the reference surface" indicates that the variation of the height of the upper surface of the resin layer from the reference surface is less than or equal to (1×n) µm. As described above, when a resin layer is formed on a single semiconductor substrate, the variation of the height of the upper surface of the resin layer from the reference surface is preferably less than or equal to 1×1=1 µm. Meanwhile, when, for example, a resin layer is formed on a semiconductor substrate on which 9 semiconductor chips are stacked, the variation of the height of the upper surface of the resin layer from the reference surface (i.e., the back surface of the lowest semiconductor substrate) is preferably less than or equal to 1×10=10 µm.

Figure 2G:
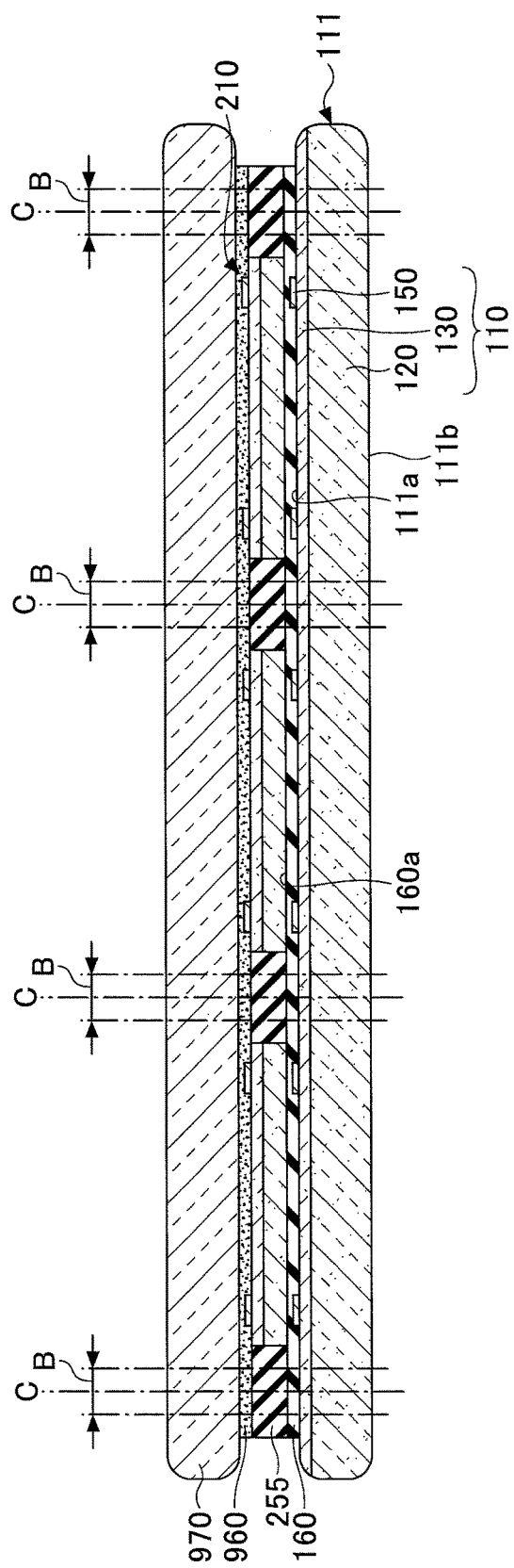
FIG. 2G is a drawing (7) used to describe an exemplary process of producing a semiconductor device according to the first embodiment.

At a step illustrated by FIG. 2G, the structure illustrated by FIG. 2E is turned upside down and bonded via the resin layer 160 onto the main surface 111a of the semiconductor substrate 111. More specifically, the structure of FIG. 2E is placed on the semiconductor substrate 111 such that the back surfaces of the semiconductor chips 210 contact the resin layer 160 formed on the main surface 111a of the semiconductor substrate 111. Alignment marks are formed in advance on the semiconductor chips 210 and the semiconductor substrate 111 to accurately align them with each other. The structure of FIG. 2E can be placed on the semiconductor substrate 111 based on the alignment marks according to a known method. The alignment accuracy is, for example, less than or equal to 2 µm.

Next, the structure of FIG. 2E and the semiconductor substrate 111 are heated at a heating temperature of, for example, 250° C., and the structure is pressed from the side of the support 970 to bond the back surfaces of the semiconductor chips 210 of the structure to the surface 160a of the resin layer 160. As a result, the resin layer 160 sets, and the structure of FIG. 2E is bonded to the main surface 111a of the semiconductor substrate 111. Although a heating temperature greater than or equal to 300° C. can be used, the heating temperature is preferably less than or equal to 200° C. When a high temperature of, for example, 300° C. is used, stress is generated due to variation in thermal expansion. As the number of stacked layers increases, the stress may cause the layers to come apart and cause cracks in semiconductor substrates.

Figure 2H:
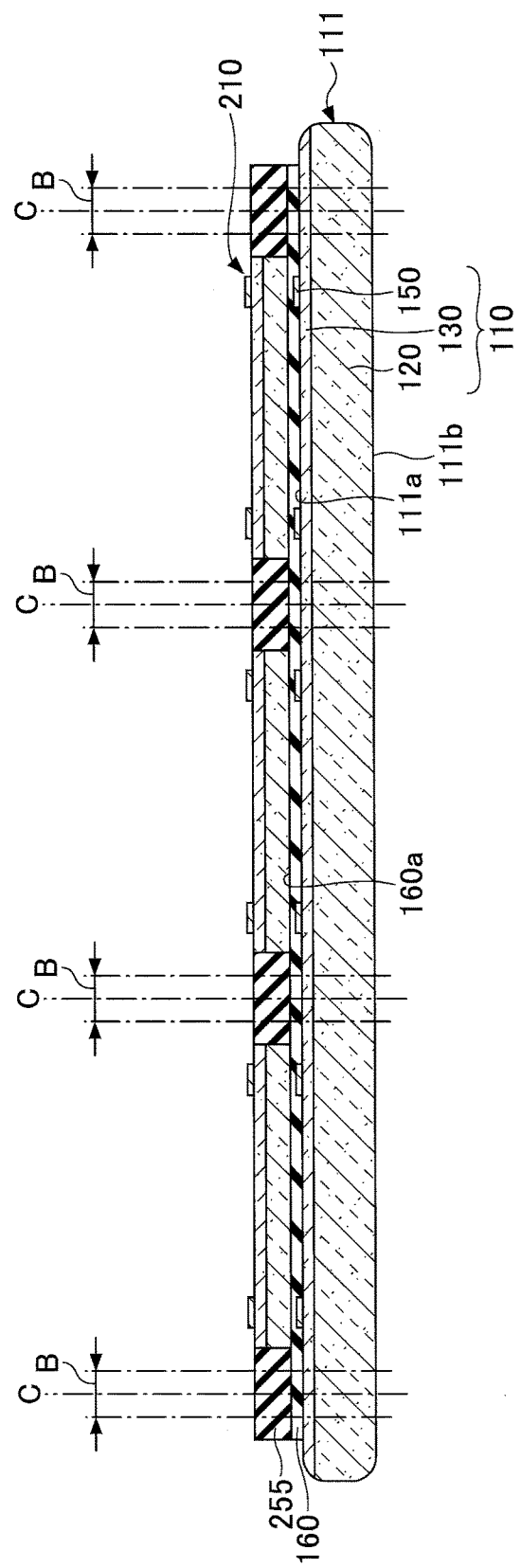
FIG. 2H is a drawing (8) used to describe an exemplary process of producing a semiconductor device according to the first embodiment.

At a step illustrated by FIG. 2H, the adhesive layer 960 and the support 970 illustrated in FIG. 2G are removed. Because the adhesive layer 960 is implemented by an adhesive that softens at a heating temperature (e.g., about 200° C. or lower) used in the step of FIG. 2G, the support 970 can be easily removed after the resin layer 160 is caused to set and the structure of FIG. 2E is bonded to the main surface 111a of the semiconductor substrate 111. That is, the steps of FIG. 2G and FIG. 2H can be performed concurrently.

Figure 2I:
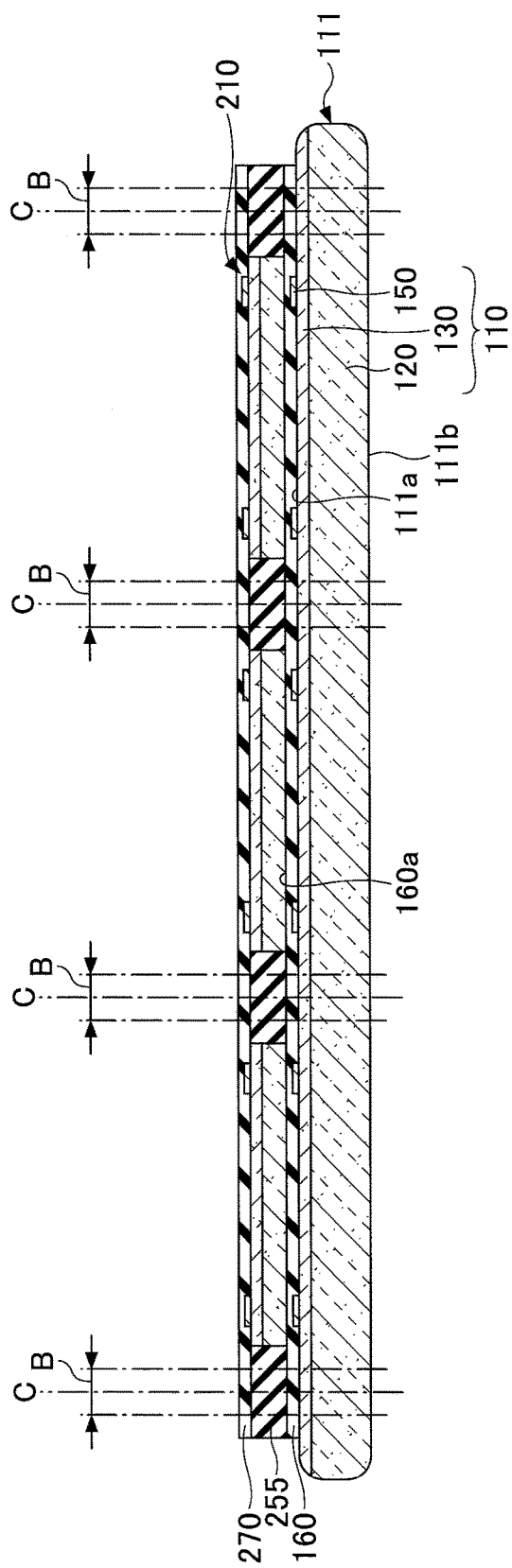
FIG. 2I is a drawing (9) used to describe an exemplary process of producing a semiconductor device according to the first embodiment.

At a step illustrated by FIG. 2I, a photosensitive resist film 270 is formed to cover the main surfaces of the semiconductor chips 210 and the upper surface of the resin layer 255. The resist film 270 may be formed, for example, by applying a liquid resist to the main surfaces of the semiconductor chips 210 and the upper surface of the resin layer 255. The thickness of the resist film 270 may be, for example, about 10 μm.

Figure 2J:
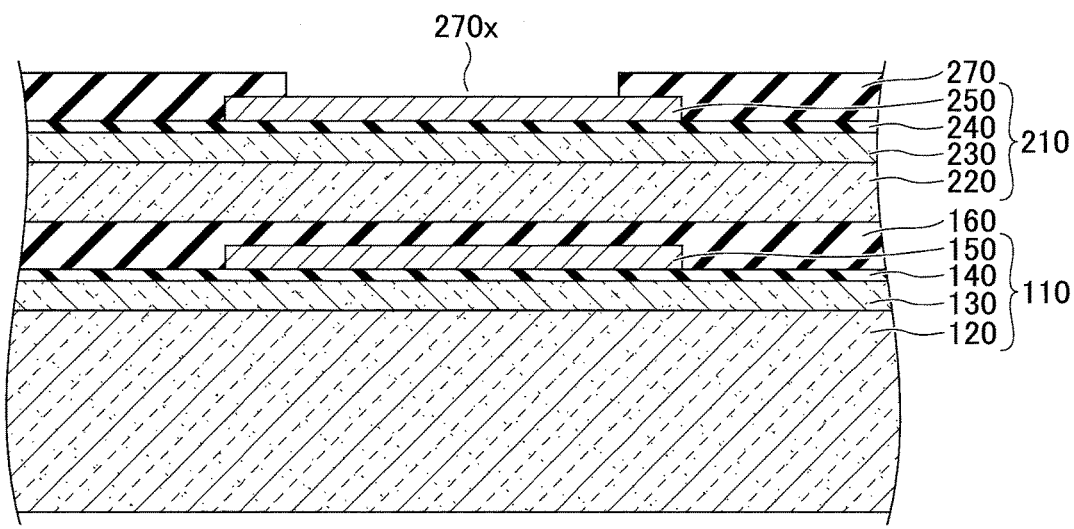
FIG. 2J is a drawing (10) used to describe an exemplary process of producing a semiconductor device according to the first embodiment.

At a step illustrated by FIG. 2J, the resist film 270 illustrated in FIG. 2I is exposed via a mask and the exposed resist film 270 is developed to form an opening 270x in the resist film 270. For brevity, FIGS. 2J through 2U illustrate only an enlarged view of a part (around the electrode pad 150 and the electrode pad 250) of the structure of FIG. 2I. In FIG. 2J, reference numbers 140 and 240 indicate insulating layers provided, respectively, on the semiconductor integrated circuit 130 and the semiconductor integrated circuit 230. The insulating layers 140 and 240 are omitted in FIGS. 2A through 2I. The insulating layers 140 and 240 may include, for example, $Si_3N_4$ or $SiO_2$. The thickness of the insulating layers 140 and 240 may be, for example, about 0.1 μm to about 2.0 μm with which the insulating layers 140 and 240 can electrically insulate the semiconductor integrated circuit 130 and the semiconductor integrated circuit 230.

Figure 2K:
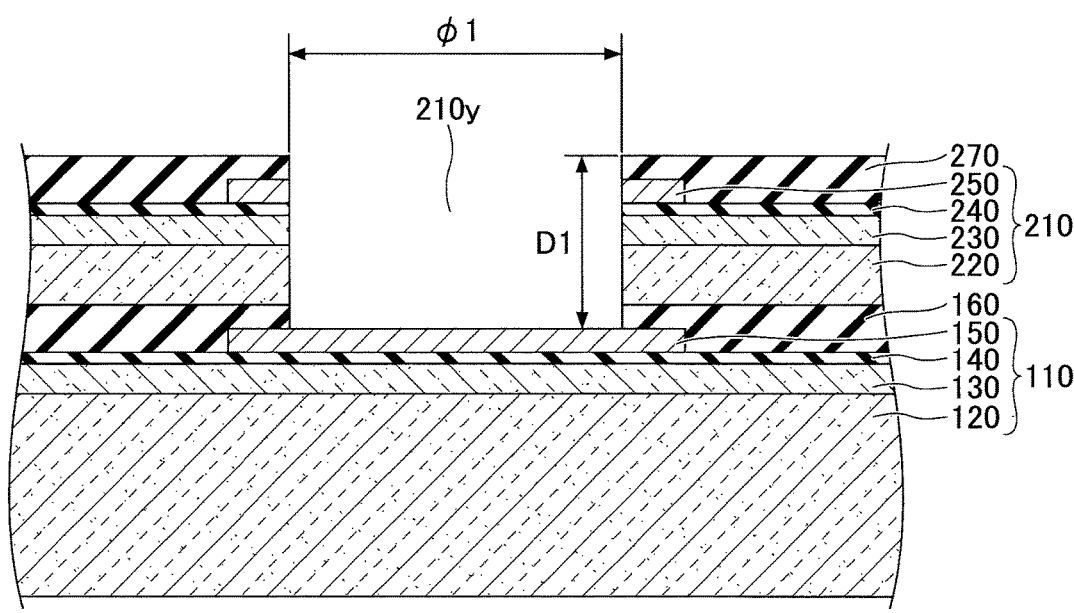
FIG. 2K is a drawing (11) used to describe an exemplary process of producing a semiconductor device according to the first embodiment.

At a step illustrated by FIG. 2K, the via hole 210y is formed in each semiconductor chip 210. The via hole 210y is formed to pass through a part of the semiconductor chip 210 (i.e., the main substrate 220, the semiconductor integrated circuit 230, the insulating layer 240, and the electrode pad 250) and a part of the resin layer 160 that correspond to the opening 270x such that the electrode pad 150 of the semiconductor chip 110 of the semiconductor substrate 111 is exposed. For example, the via hole 210y may be formed by dry etching. The via hole 210y may have a circular shape in plan view, and a diameter φ1 of the via hole 210y may be, for example, about 1 μm to about 30 μm. Here, the diameter φ1 of the via hole 210y is preferably set at a value that makes the aspect ratio (depth D1/diameter φ1) of the via hole 210y greater than or equal to 0.5 and less than or equal to 5. Setting the diameter φ1 of the via hole 210y such that the aspect ratio (depth D1/diameter φ1) becomes greater than or equal to 0.5 and less than or equal to 5 makes it possible to improve the etching rate in forming the via hole 210y and makes it easier to fill the via hole 210y with the metal layer 380.

At a step illustrated by FIG. 2L, the resist film 270 illustrated in FIG. 2K is removed. At a step illustrated by FIG. 2M, an insulating layer 280 is formed to cover the upper surface of the insulating layer 240, the upper and side surfaces of the electrode pad 250, the wall surface of the via hole 210y, and the upper surface of the electrode pad 150 exposed at the bottom of the via hole 210y. For example, the insulating layer 280 may be formed by plasma CVD. The insulating layer 280 may include, for example, $Si_3N_4$ or $SiO_2$. The thickness of the insulating layer 280 may be, for example, 0.1 μm to 2.0 μm.

Figure 2N:
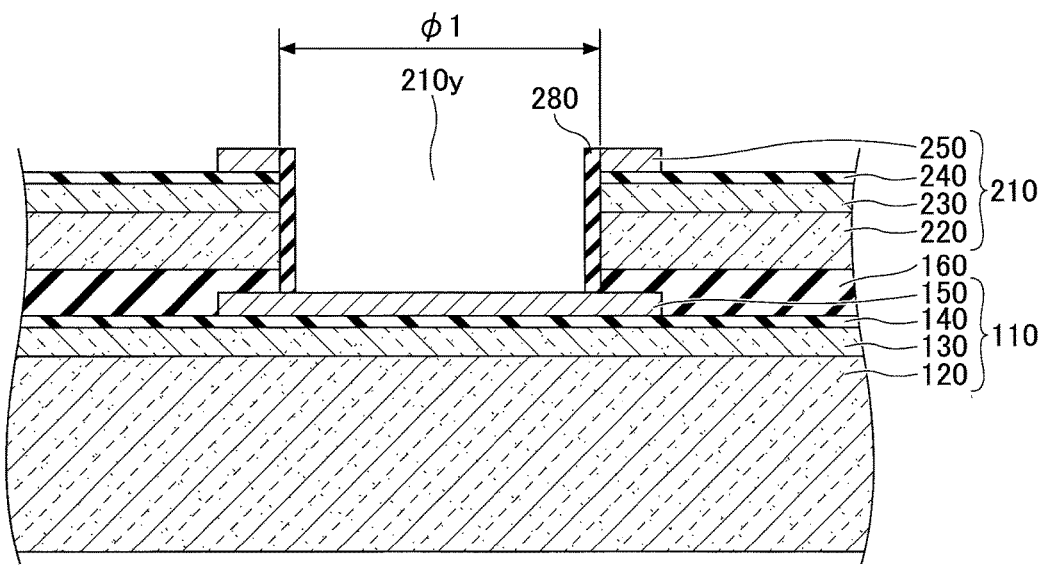
FIG. 2N is a drawing (14) used to describe an exemplary process of producing a semiconductor device according to the first embodiment.

At a step illustrated by FIG. 2N, parts of the insulating layer 280 other than those on the wall surface of the via hole 210y are removed. For example, parts of the insulating layer 280 may be removed by reactive ion etching (RIE). This step, where parts of the insulating layer 280 are removed without using a photomask, may be referred to as a "self-aligned process". With the self-aligned process, it is possible to accurately position the via hole 210y and the electrode pad 250. Also, it is possible to employ a design where electrode pads are omitted in some layers. In this case, etching proceeds through a layer where no electrode pad is provided up to an electrode pad of another semiconductor chip at a lower layer. Accordingly, such a design makes it possible to form via holes with different depths.

Figure 2O:
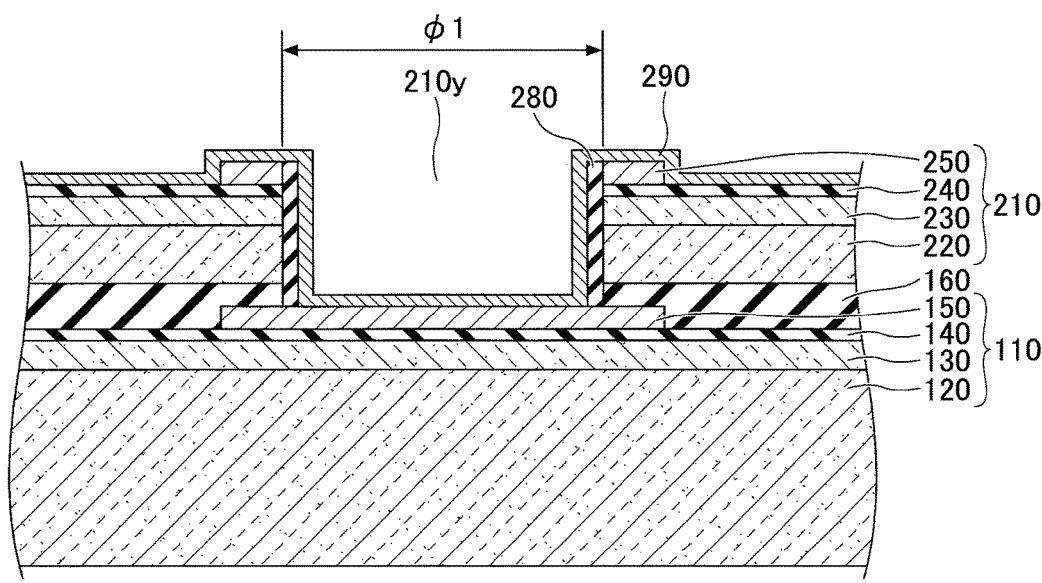
FIG. 2O is a drawing (15) used to describe an exemplary process of producing a semiconductor device according to the first embodiment.

At a step illustrated by FIG. 2O, a metal layer 290 is formed to cover the upper surface of the insulating layer 240, the upper and side surfaces of the electrode pad 250, the upper and side surfaces of the insulating layer 280, and the upper surface of the electrode pad 150 exposed at the bottom of the via hole 210y. For example, the metal layer 290 may be formed by electroless plating. Also, the metal layer 290 may be formed by sputtering or CVD. The metal layer 290 may be implemented, for example, by a laminated structure where a Cu layer is laminated on a Ti layer. Also, the metal layer 290 may be implemented by a laminated structure where a Cu layer is laminated on a Ta layer. Also, any conductor that satisfies design criteria may be used as an embedded material. For example, instead of Cu, one of W, Al, doped polysilicon, a carbon material such as carbon nanotube, and a conductive polymer may be used. Also, when the insulation performance of the insulating layer is sufficient, a combination of embedded wirings using no Bayer metal layer may be selected.

Figure 2P:
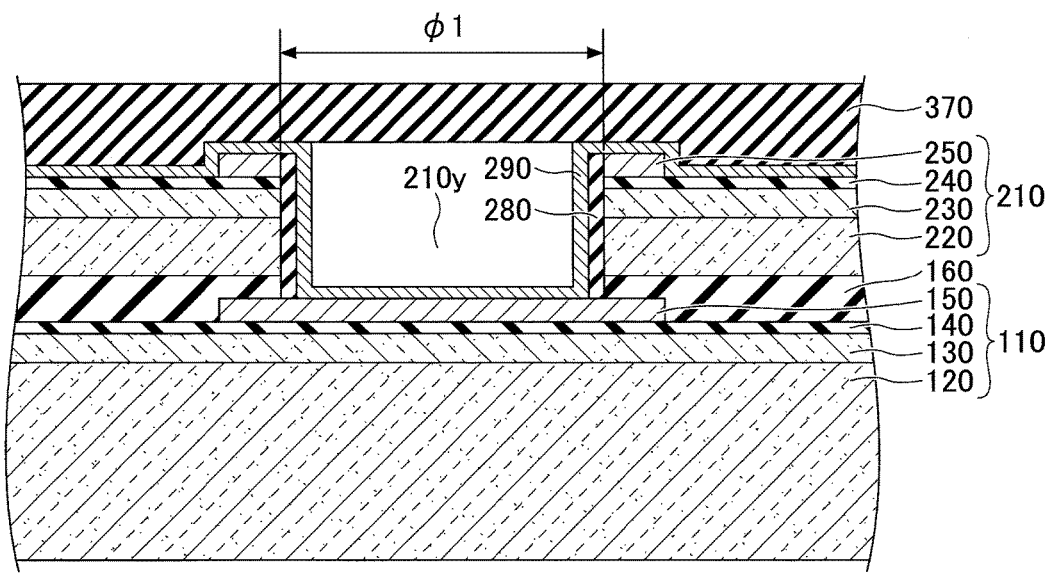
FIG. 2P is a drawing (16) used to describe an exemplary process of producing a semiconductor device according to the first embodiment.

At a step illustrated by FIG. 2P, a photosensitive resist film 370 is formed to cover the upper surface of the metal layer 290 excluding a part of the metal layer 290 in the via hole 210y. For example, the resist film 370 may be formed by pasting a dry film resist to the upper surface of the metal layer 290. The thickness of the resist film 370 may be, for example, about 10 μm. At a step illustrated by FIG. 2Q, the resist film 370 illustrated in FIG. 2P is exposed via a mask and the exposed resist film 370 is developed to form an opening 370x in the resist film 370. The opening 370x is formed such that the upper surface of the metal layer 290 in and around the via hole 210y is exposed. The opening 370x may have a circular shape in plan view, and a diameter φ2 of the opening 370x may be, for example, about 1 μm to about 30 μm.

Figure 2Q:
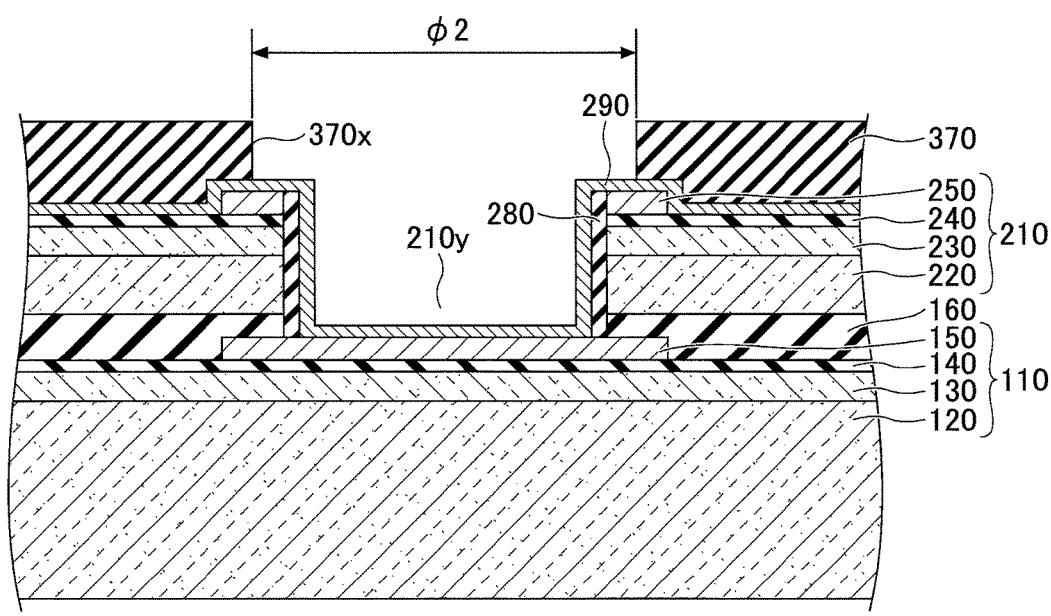
FIG. 2Q is a drawing (17) used to describe an exemplary process of producing a semiconductor device according to the first embodiment.
Figure 2R:
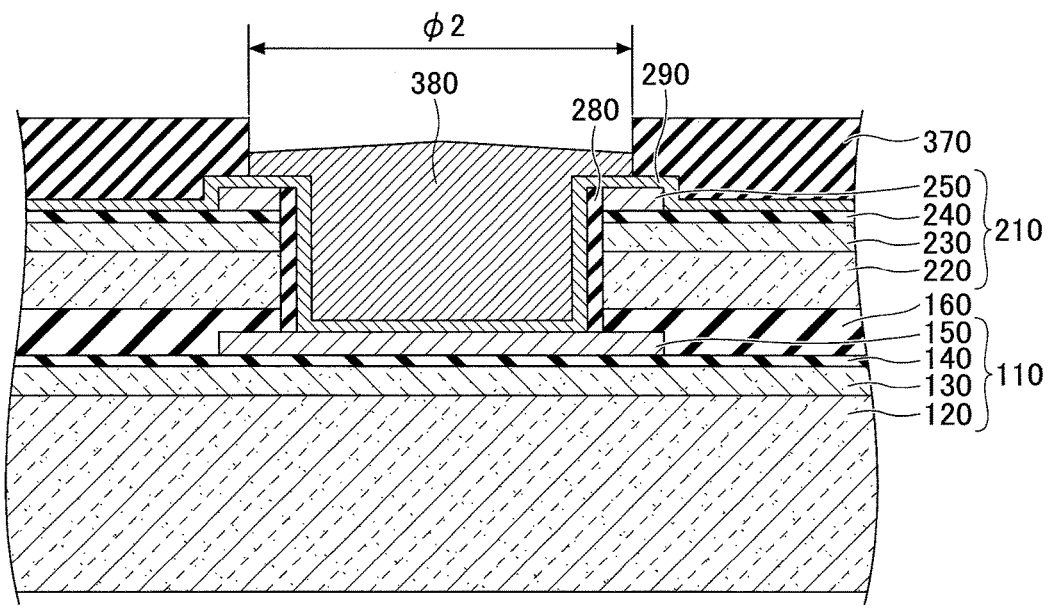
FIG. 2R is a drawing (18) used to describe an exemplary process of producing a semiconductor device according to the first embodiment.
Figure 2S:
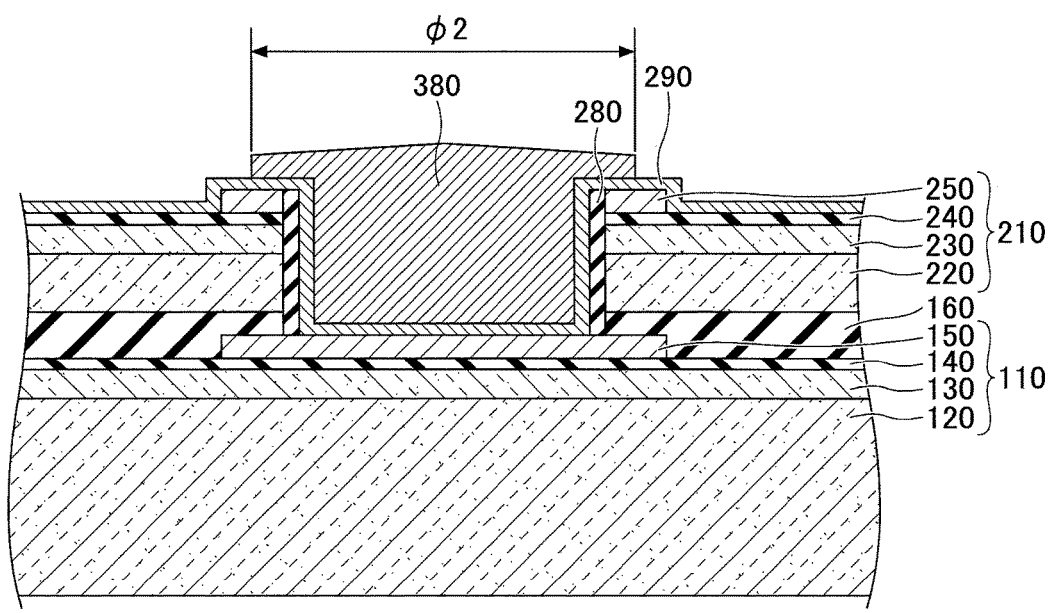
FIG. 2S is a drawing (19) used to describe an exemplary process of producing a semiconductor device according to the first embodiment.

At a step illustrated by FIG. 2R, the metal layer 380 is formed in the via hole 210y and in a part of the opening 370x illustrated in FIG. 2Q. For example, the metal layer 380 may be formed by depositing and growing a plating film in the via hole 210y and in a part of the opening 370x illustrated in FIG. 2Q by electroplating using the metal layer 290 as a power feed layer, The metal layer 380 may be implemented by, for example, a Cu plating film. At a step illustrated by FIG. 2S, the resist film 370 illustrated in FIG. 2R is removed.

Figure 2T:
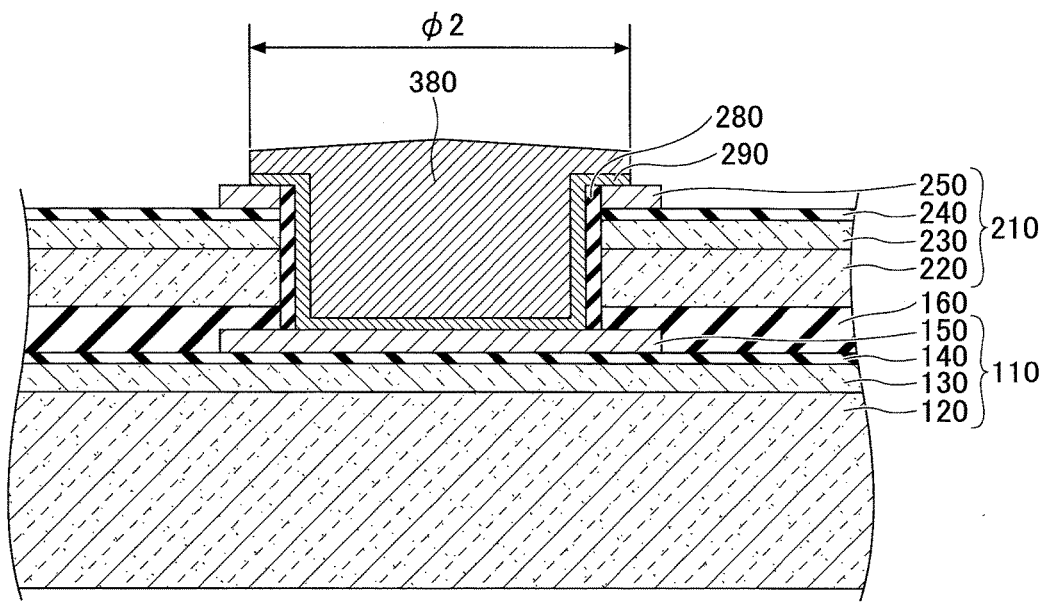
FIG. 2T is a drawing (20) used to describe an exemplary process of producing a semiconductor device according to the first embodiment.
Figure 2U:
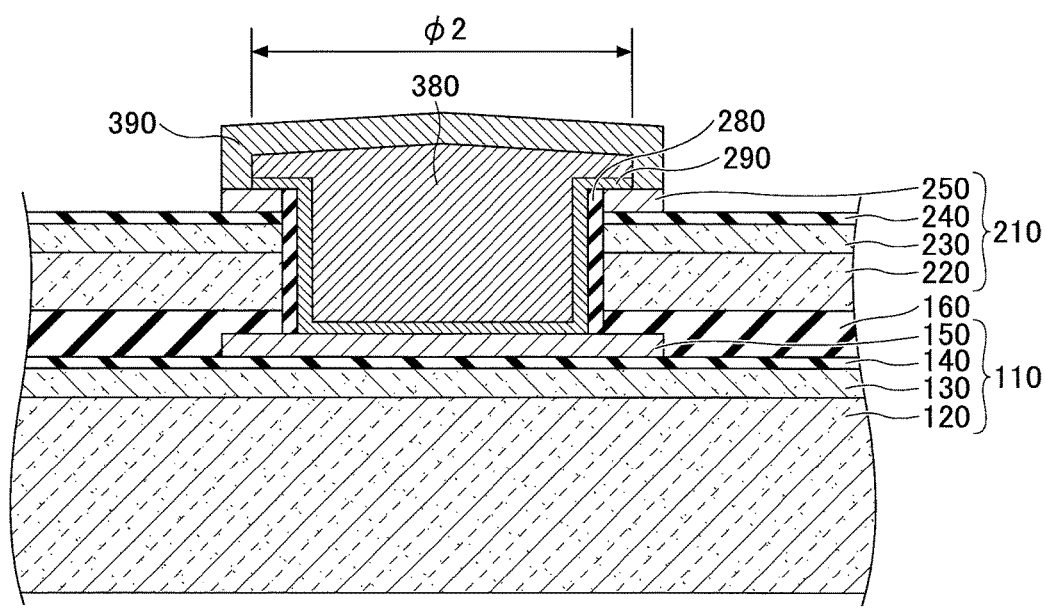
FIG. 2U is a drawing (21) used to describe an exemplary process of producing a semiconductor device according to the first embodiment.

At a step illustrated by FIG. 2T, a part of the metal layer 290 not covered by the metal layer 380 is removed. For example, the metal layer 290 may be removed by wet etching. At a step illustrated by FIG. 2U, a metal layer 390 is formed to cover the electrode pad 250 and the metal layer 380. For example, the metal layer 390 may be formed by forming, on the insulating layer 240, a resist film with an opening that exposes the electrode pad 250 and the metal layer 380, depositing and growing a plating film in the opening by electroplating using the electrode pad 250 and the metal layer 380 as power feed layers, and then removing the resist film. The metal layer 390 may be implemented, for example, by a laminated structure where an Au layer is laminated on a Ti layer. Also, the metal layer 390 may be implemented by a laminated structure where a Pd layer and an Au layer are laminated sequentially on an Ni layer; a laminated structure where a Cu layer or an Al layer is laminated on a layer made of a refractory metal such as Co, Ta, Ti, or TiN instead of Ni; or wiring having a damascene structure.

Figure 2V:
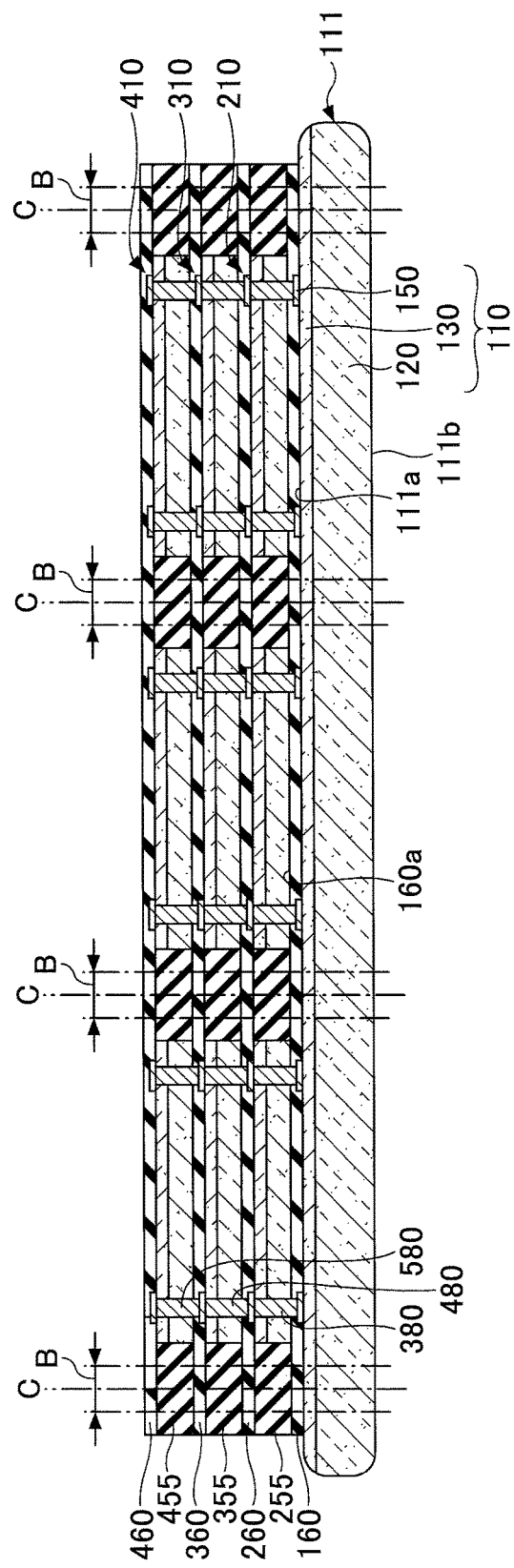
FIG. 2V is a drawing (22) used to describe an exemplary process of producing a semiconductor device according to the first embodiment.
Figure 2X:
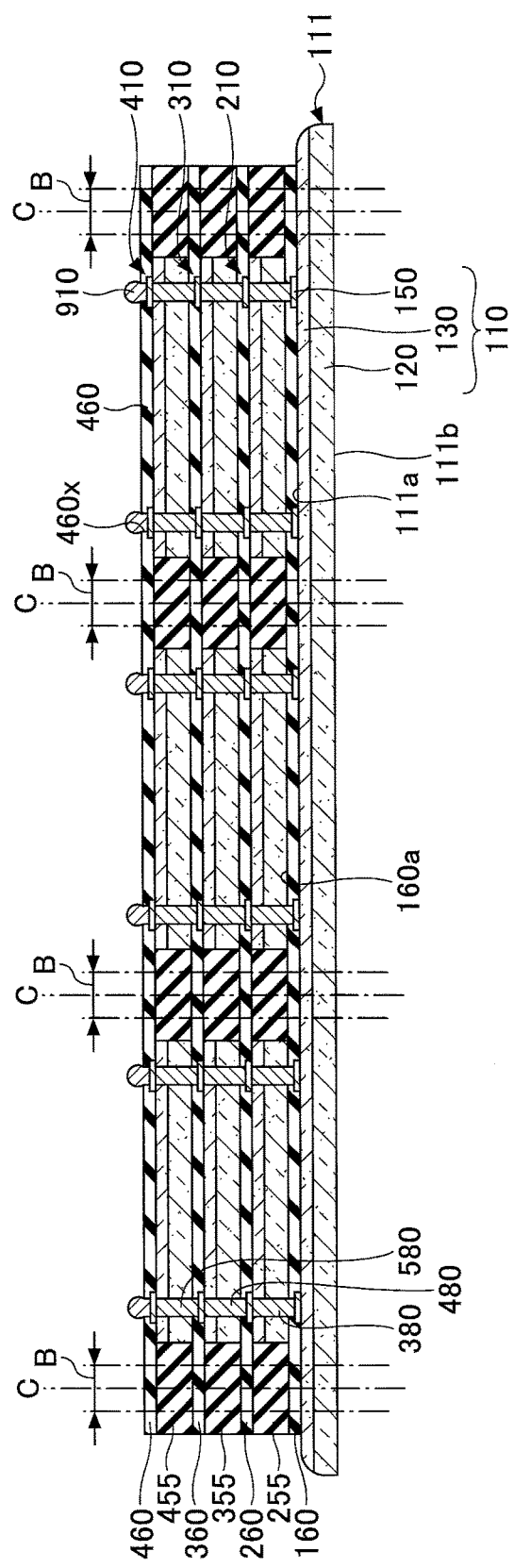
FIG. 2X is a drawing (24) used to describe an exemplary process of producing a semiconductor device according to the first embodiment.

At a step illustrated by FIG. 2V, steps illustrated by FIGS. 2I through 2U are repeated to stack the semiconductor chips 310 and 410. In the above example, three layers of semiconductor chips 210, 310, and 410 are stacked on the semiconductor substrate 111. However, the number of semiconductor chip layers stacked on the semiconductor substrate 111 may be one, two, four, or more. Also, semiconductor chips to be stacked may have the same function or different functions.

In FIG. 2V, the semiconductor chips 210 (310, 410) have the same shape. However, the semiconductor chips may not necessarily have the same shape. For example, in FIG. 2V, the three semiconductor chips 210 may have different shapes.

At a step illustrated by FIG. 2W, the external connection terminal 910 is formed using a known method. For example, to form the external connection terminal 910, an Ni layer is formed as the metal layer 390. Next, the opening 460x is formed in the solder resist layer 460 to expose the Ni layer. Then, the external connection terminal 910 is formed on the Ni layer exposed in the opening 460x. The external connection terminal 910 electrically connects the semiconductor device 100 to, for example, a wiring board provided outside of the semiconductor device 100. The external connection terminal 910 may be implemented, for example, by a solder ball, an Au bump, or a conductive paste. When a solder ball is used as the external connection terminal 910, for example, an alloy including Pb, an alloy of Sn and Cu, an alloy of Sn and Ag, or an alloy of Sn, Ag, and Cu may be used as a material for the external connection terminal 910.

At a step illustrated by FIG. 2X, the back surface of the semiconductor substrate 111 is ground by, for example, a grinder to reduce the thickness of the semiconductor substrate 111 (thinning step). For this step, dry polishing or wet etching may be used together with grinding. The thickness of the semiconductor substrate 111 after this thinning step may be, for example, about 1 µm to about 100 µm.

After the step of FIG. 2X, the structure illustrated by FIG. 2X is cut at the cutting positions C by, for example, a dicing blade to produce separate semiconductor devices 100 as illustrated by FIG. 1. The cutting positions C may be set such that each semiconductor device 100 includes a plurality of stacked structures of semiconductor chips (stacked semiconductor chip structures). For example, the cutting positions C may be set such that each semiconductor device 100 includes a stacked semiconductor chip structure having a function A and a stacked semiconductor chip structure having a function B that is different from the function A. In this case, the shapes in plan view of the stacked semiconductor chip structure having the function A and the stacked semiconductor chip structure having the function B may not necessarily the same.

As described above, according to the first embodiment, a semiconductor substrate, on which multiple semiconductor chips each including a semiconductor integrated circuit on its main surface are formed, is prepared, and an insulating layer is formed on the main surface of the prepared semiconductor substrate. Next, separate semiconductor chips each including a semiconductor integrated circuit on its main surface are stacked via the insulating layer on the semiconductor chips formed on the semiconductor substrate such that the back surfaces of the separate semiconductor chips face the insulating layer. Then, via holes are formed through the separate semiconductor chips so that electrode pads of the separate semiconductor chips and electrode pads of the semiconductor chips formed on the semiconductor substrate are electrically connected to each other through metal layers filling the via holes.

By repeating the above steps, it is possible to stack multiple semiconductor chips on the semiconductor substrate and connect the semiconductor chips in different layers with each other to enable signal transmission. This process or method eliminates the need to form bumps on via holes to connect semiconductor chips with each other. Thus, the first embodiment makes it possible to provide a semiconductor device production method that is highly productive and can reduce production costs.

According to the first embodiment, semiconductor chips are bonded together such that a surface on which a semiconductor integrated circuit is formed faces a surface on which no semiconductor integrated circuit is formed. This makes it possible to stack two or more layers of semiconductor chips on a semiconductor substrate by simply repeating the same process. Thus, the first embodiment makes it possible to provide a semiconductor device production method that is highly productive and can reduce production costs.

According to the first embodiment, via holes are formed in thinned semiconductor chips and therefore it is not necessary to form deep via holes. Accordingly, the first embodiment makes it possible to reduce the time necessary to form via holes and fill the via holes with metal and reduce the amount of necessary material. This in turn makes it possible to prevent the increase in the productions costs of semiconductor devices.

According to the first embodiment, via holes are formed after reducing the thickness of semiconductor chips to a considerable extent. This in turn makes it possible to reduce the degree of variation in the diameters of the ends of via holes even when the sizes and the density of the via holes vary, and thereby makes it possible to reduce the variation in electric resistance and to improve the reliability.

Also according to the first embodiment, separate semiconductor chips are stacked on a semiconductor substrate. This makes it possible to easily stack semiconductor chips with different device sizes on each other.

First Variation of First Embodiment

According to a first variation of the first embodiment, multiple semiconductor chips whose thicknesses are reduced in advance are mounted on a semiconductor substrate without using a support, and the main and side surfaces of the semiconductor chips on the semiconductor substrate are sealed with a resin layer. Also according to the first variation, electrodes of stacked semiconductor chips are electrically connected to each other according to a method that is different from the first embodiment. In the first variation of the first embodiment, descriptions of components already described in the first embodiment are omitted.

FIGS. 3A through 3J are drawings used to describe an exemplary process of producing a semiconductor device according to the first variation of the first embodiment.

At a step illustrated by FIG. 3A, the back surface of a semiconductor wafer is ground by, for example, a grinder, and the semiconductor wafer is diced to prepare separate semiconductor chips 210. The thickness of each of the semiconductor chips 210 may be, for example, about 1 µm to about 100 µm.

Figure 3B:
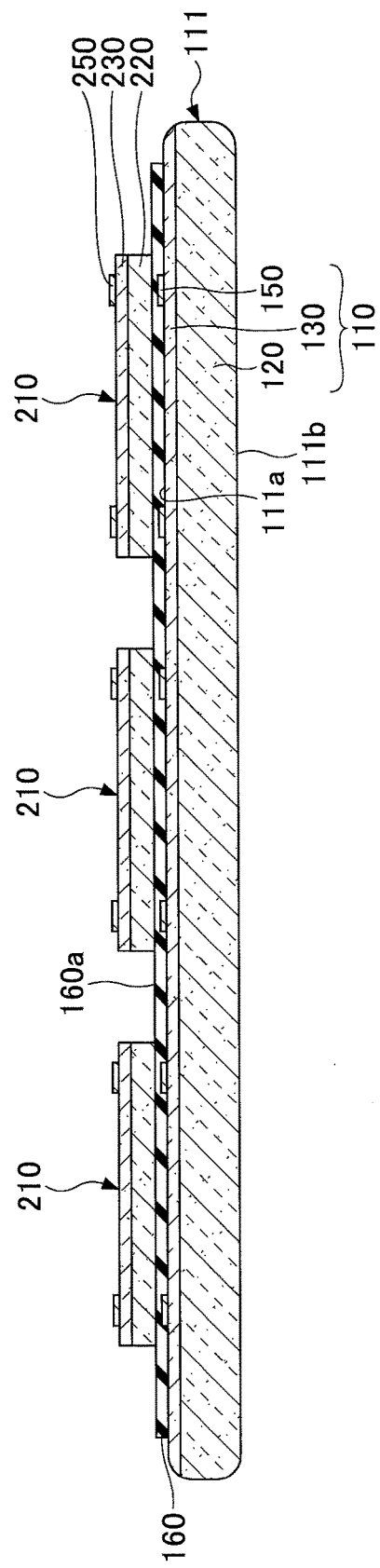
FIG. 3B is a drawing (2) used to describe an exemplary process of producing a semiconductor device according to the first variation of the first embodiment.

At a step illustrated by FIG. 3B, a semiconductor substrate 111 is prepared and a resin layer 160 is formed on a main surface 111a in a manner similar to the step of FIG. 2F. Next, the semiconductor chips 210 are bonded via the resin layer 160 onto the main surface 111a of the semiconductor substrate 111. More specifically, the semiconductor chips 210 are aligned with the semiconductor substrate 111 in a manner similar to the step of FIG. 2G, and the semiconductor chips 210 are placed such that the back surfaces of the semiconductor chips 210 contact the resin layer 160 formed on the main surface 111a of the semiconductor substrate 111. Then, the semiconductor chips 210 and the semiconductor substrate 111 are heated and pressed together in a manner similar to the step of FIG. 2G to bond the back surfaces of the semiconductor chips 210 to the surface 160a of the resin layer 160. As a result, the resin layer 160 sets, and the semiconductor chips 210 are bonded to the main surface 111a of the semiconductor substrate 111.

Figure 3C:
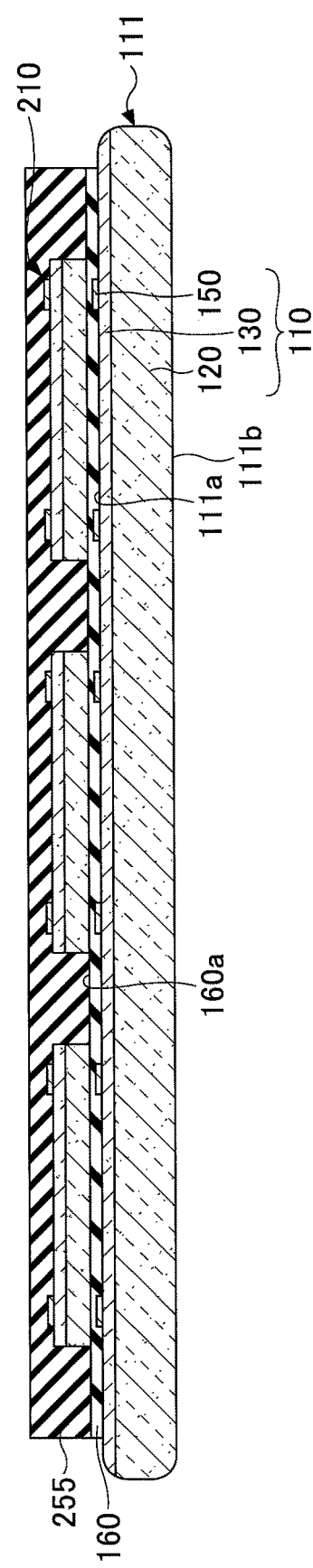
FIG. 3C is a drawing (3) used to describe an exemplary process of producing a semiconductor device according to the first variation of the first embodiment.

At a step illustrated by FIG. 3C, a resin layer 255 is formed on the surface 160a of the resin layer 160 in a manner similar to the step of FIG. 2D to seal the main and side surfaces of the semiconductor chips 210. At a step illustrated by FIG. 3D, a photosensitive resist film 270 is formed to cover the upper surface of the resin layer 255. The resist film 270 may be formed, for example, by applying a liquid resist to the upper surface of the resin layer 255. The thickness of the resist film 270 may be, for example, about 10 μm.

Figure 3D:
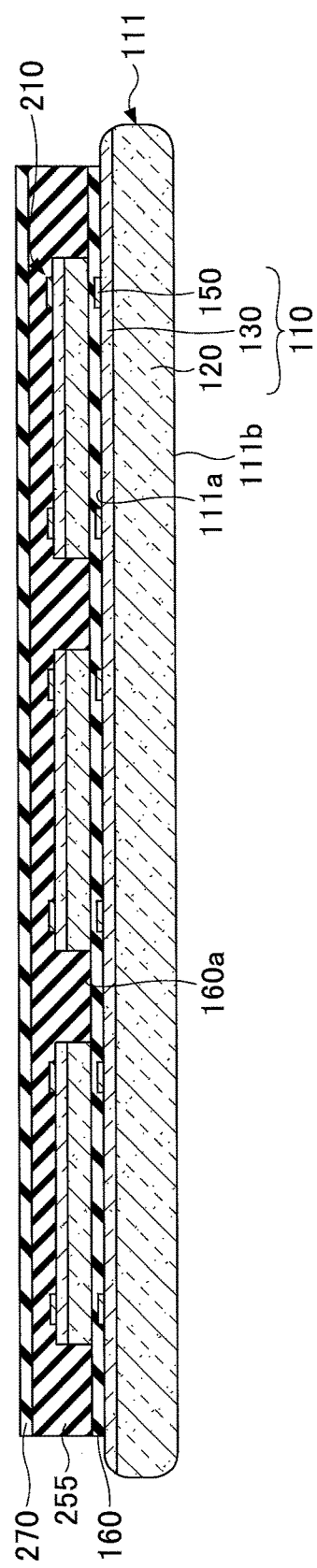
FIG. 3D is a drawing (4) used to describe an exemplary process of producing a semiconductor device according to the first variation of the first embodiment.
Figure 3E:
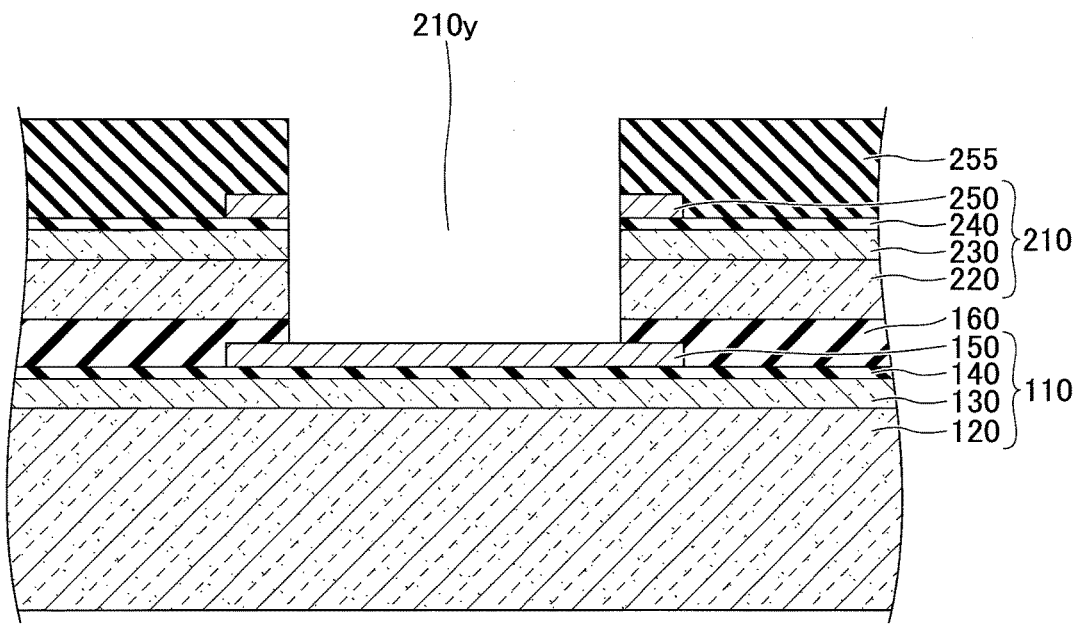
FIG. 3E is a drawing (5) used to describe an exemplary process of producing a semiconductor device according to the first variation of the first embodiment.

At a step illustrated by FIG. 3E, an opening(s) is formed in the resist film 270 illustrated in FIG. 3D in a manner similar to the step of FIG. 2J, and a via hole 210y is formed in each semiconductor chip 210 in a manner similar to the step of FIG. 2K. Then, in a manner similar to the step of FIG. 2L, the resist film 270 illustrated in FIG. 3D is removed. For brevity, FIGS. 3E through 3J illustrate only an enlarged view of a part (around the electrode pad 150 and the electrode pad 250) of the structure of FIG. 3D. In FIG. 3E, reference numbers 140 and 240 indicate insulating layers provided, respectively, on the semiconductor integrated circuit 130 and the semiconductor integrated circuit 230. The insulating layers 140 and 240 are omitted in FIGS. 3A through 3D.

Figure 3F:
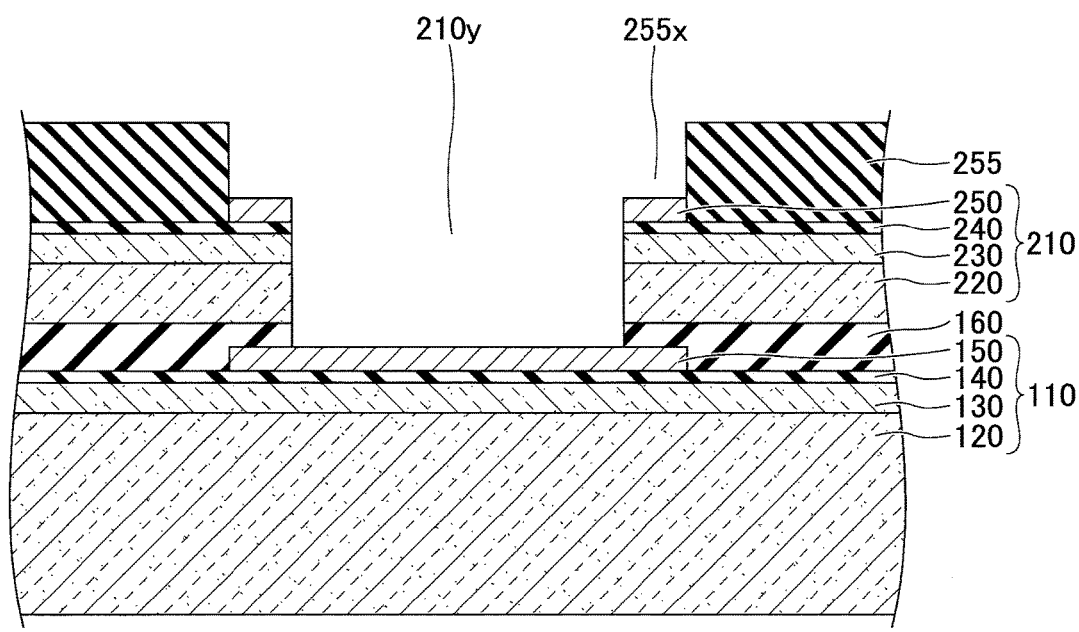
FIG. 3F is a drawing (6) used to describe an exemplary process of producing a semiconductor device according to the first variation of the first embodiment.
Figure 3G:
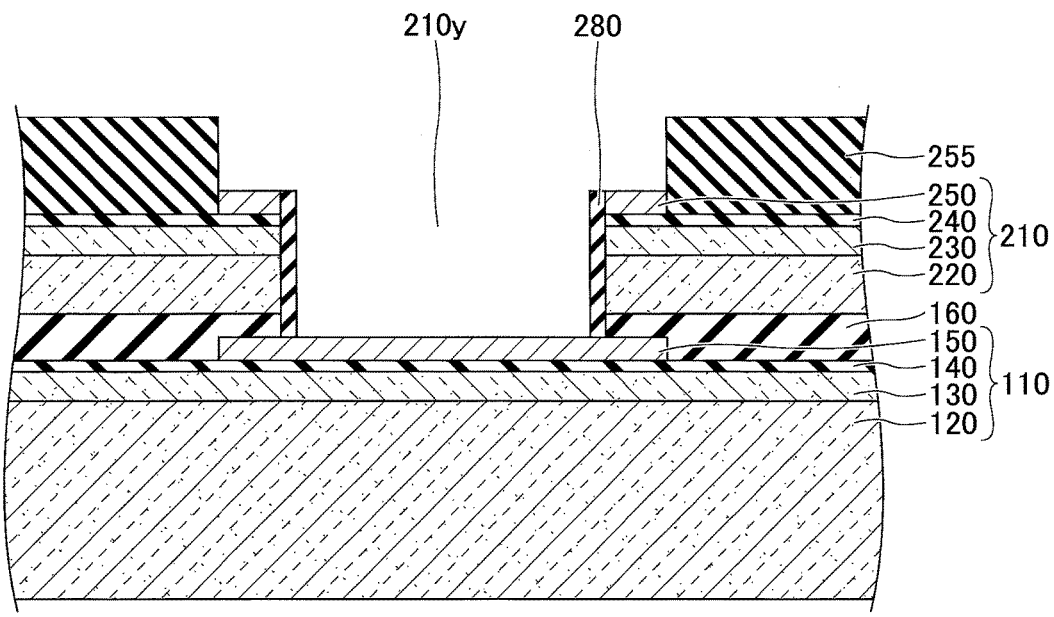
FIG. 3G is a drawing (7) used to describe an exemplary process of producing a semiconductor device according to the first variation of the first embodiment.
Figure 3H:
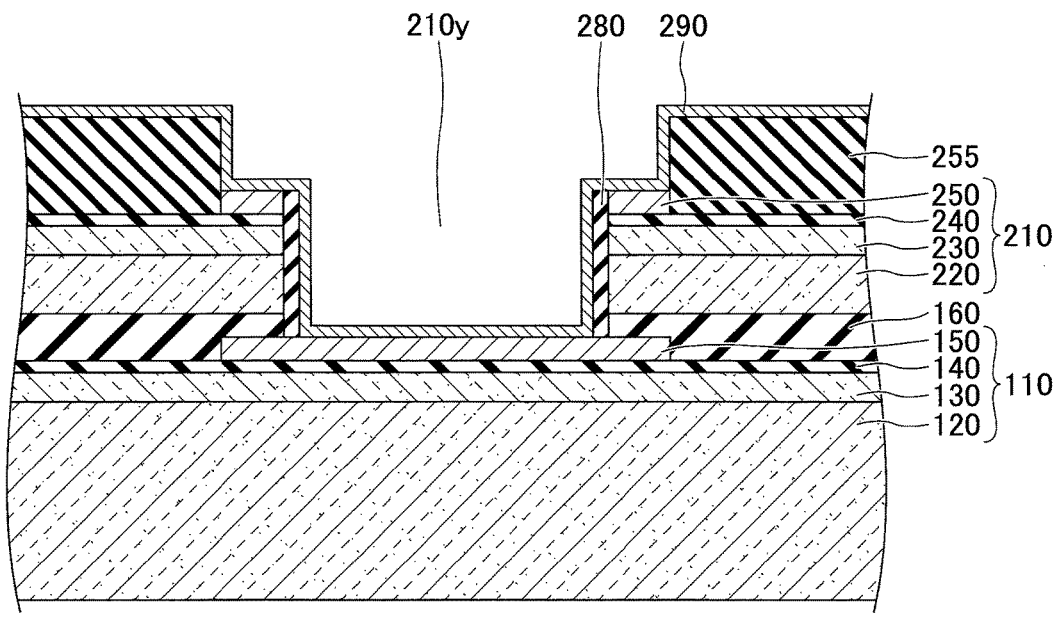
FIG. 3H is a drawing (8) used to describe an exemplary process of producing a semiconductor device according to the first variation of the first embodiment.

At a step illustrated by FIG. 3F, a resist film (not shown) is formed on the resin layer 255 illustrated in FIG. 3E. An opening (not shown) is formed in the resist film, and a part of the resin layer 255 exposed in the opening of the resist film is removed to form an opening 255x. Then, the resist film is removed. As a result, the electrode pad 250 is exposed in the opening 255x. At a step illustrated by FIG. 3G, an insulating layer 280 is formed in a manner similar to the step of FIG. 2M, and parts of the insulating layer 280 other than those on the wall surface of the via hole 210y are removed in a manner similar to the step of FIG. 2N. At a step illustrated by FIG. 3H, a metal layer 290 is formed in a manner similar to the step of FIG. 2O.

Figure 3I:
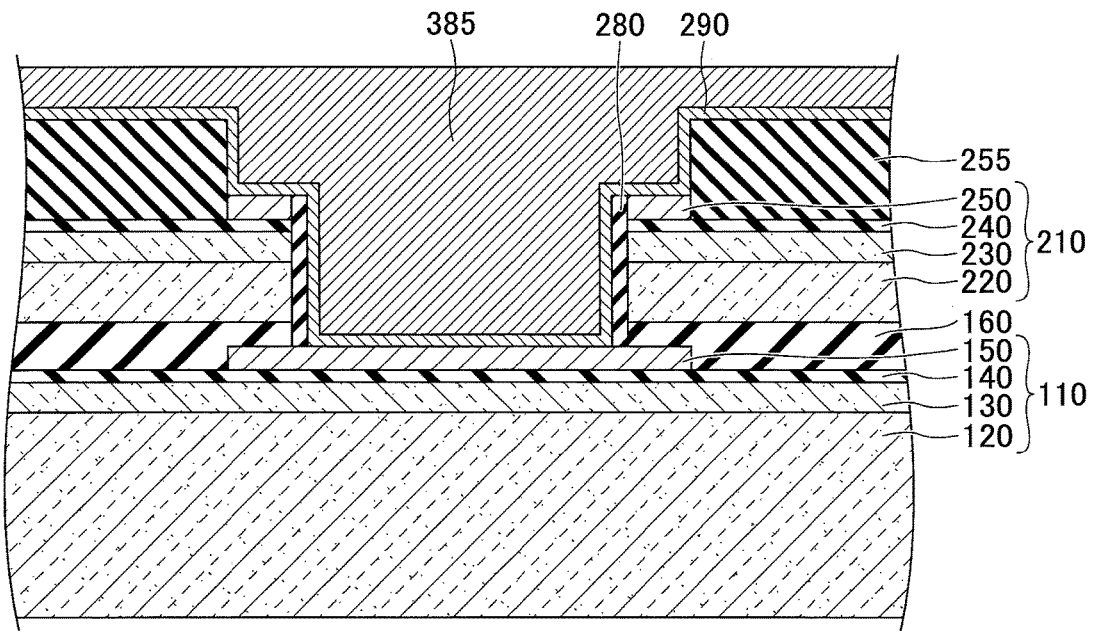
FIG. 3I is a drawing (9) used to describe an exemplary process of producing a semiconductor device according to the first variation of the first embodiment.

At a step illustrated by FIG. 3I, a metal layer 385 is formed on the metal layer 290. For example, the metal layer 385 may be formed by depositing and growing a plating film by electroplating using the metal layer 290 as a power feed layer. The metal layer 385 may be implemented by, for example, a Cu plating film. At a step illustrated by FIG. 3J, the metal layers 290 and 385 formed on the resin layer 255 are removed. For example, the metal layers 290 and 385 may be removed by CMP. As a result, the surface of the resin layer 255 and the surfaces of the metal layers 290 and 385 become substantially level.

Figure 3J:
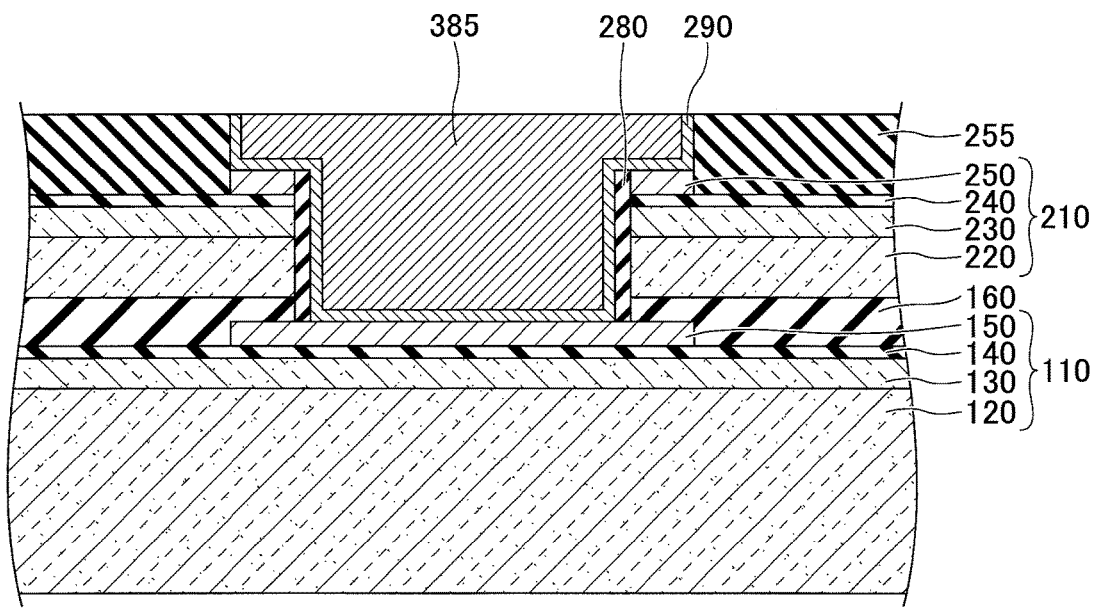
FIG. 3J is a drawing (10) used to describe an exemplary process of producing a semiconductor device according to the first variation of the first embodiment.

Next, a resin layer is formed on the structure illustrated by FIG. 3J, and steps of FIGS. 3A through 3J are repeated to stack the semiconductor chips 310 and 410. Then, an external connection terminal 910 is formed using a known method as in the step of FIG. 2W, and the resulting structure is cut by, for example, a dicing blade to produce separate semiconductor devices 100 as illustrated by FIG. 1. Here, the steps of FIGS. 3E through 3J may be replaced with the steps of FIGS. 2J through 2U.

The first variation of the first embodiment provides advantageous effects similar to those provided by the first embodiment, and also provides advantageous effects as described below. In the first variation, multiple semiconductor chips whose thicknesses are reduced in advance are mounted on a semiconductor substrate, and the main and side surfaces of the semiconductor chips on the semiconductor substrate are sealed with a resin layer. This method eliminates the need to use a support and thereby makes it possible to simplify a production process.

Second Variation of First Embodiment

According to a second variation of the first embodiment, multiple semiconductor chips whose thicknesses are reduced in advance are mounted on a semiconductor substrate without using a support, and the side surfaces of the semiconductor chips on the semiconductor substrate are sealed with a resin layer according to a method different from the first variation of the first embodiment. In the second variation of the first embodiment, descriptions of components already described in the first embodiment are omitted.

FIGS. 4A through 4D are drawings used to describe an exemplary process of producing a semiconductor device according to the second variation of the first embodiment.

At a step illustrated by FIG. 4A, a semiconductor substrate 111 is prepared and a resin layer 160 is formed on a main surface 111a in a manner similar to the step of FIG. 2F. Then, a frame part 990 is bonded via the resin layer 160 onto the main surface 111a of the semiconductor substrate 111. For example, the frame part 990 is prepared by forming, in a part having a circular shape in plan view, multiple openings 990x into each of which the semiconductor chip 210 can be inserted. The thickness of the frame part 990 is substantially the same as the thickness of the semiconductor chip 210. The frame part 990 may include, for example, silicon or glass.

Next, a step similar to the step of FIG. 3A is performed. In a step illustrated by FIG. 4B, the semiconductor chips 210 are inserted into the openings 990x of the frame part 990 and bonded via the resin layer 160 to the main surface 111a of the semiconductor substrate 111. More specifically, the semiconductor chips 210 are aligned with the semiconductor substrate 111 in a manner similar to the step of FIG. 2G, and the semiconductor chips 210 are placed such that the back surfaces of the semiconductor chips 210 contact the resin layer 160 formed on the main surface 111a of the semiconductor substrate 111. Then, the semiconductor chips 210 and the semiconductor substrate 111 are heated and pressed together in a manner similar to the step of FIG. 2G to bond the back surfaces of the semiconductor chips 210 to the surface 160a of the resin layer 160. As a result, the resin layer 160 sets, and the semiconductor chips 210 are bonded to the main surface 111a of the semiconductor substrate 111. Also, gaps 990y having a frame-like shape in plan view are formed between the side surfaces of the semiconductor chips 210 and the inner surfaces of the corresponding openings 990x of the frame part 990.

At a step illustrated by FIG. 4C, a resin layer 255 is formed on the surface 160a of the resin layer 160 to seal the side surfaces of the semiconductor chips 210. For example, the gaps 990y are filled with a resin for the resin layer 255 using, for example, a dispenser. The resin is heated to a predetermined temperature to cause the resin to set while being pressed by a pressing part 975 made of, for example, glass toward the semiconductor substrate 111. Then, the pressing part 975 is removed.

As an alternative method, a resin may be applied with a dispenser to spaces between the side surfaces of adjacent semiconductor chips 210 without using the frame part 990. With this method, however, a resin applied to the periphery of the resin layer 160 may go slack and therefore it is difficult to form a resin layer with a desired shape. For this reason, it is preferable to use the frame part 990. Here, instead of the frame part 990 having the openings 990x, a circular frame part that is disposed only on the periphery of the surface 160a of the resin layer 160. In other words, a circular frame part that surrounds all of the semiconductor chips 210 may be used.

Figure 4B:
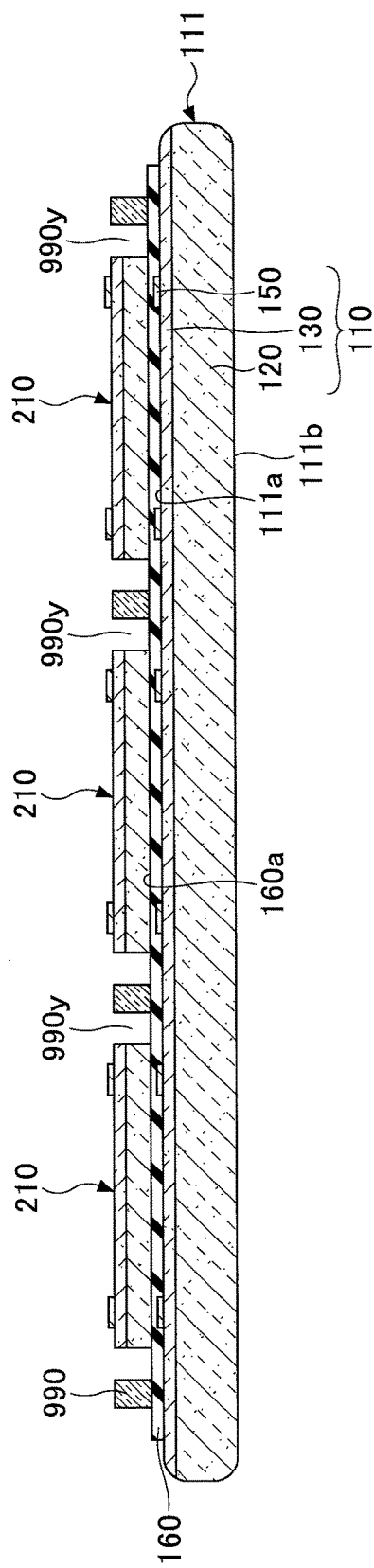
FIG. 4B is a drawing (2) used to describe an exemplary process of producing a semiconductor device according to the second variation of the first embodiment.
Figure 4D:
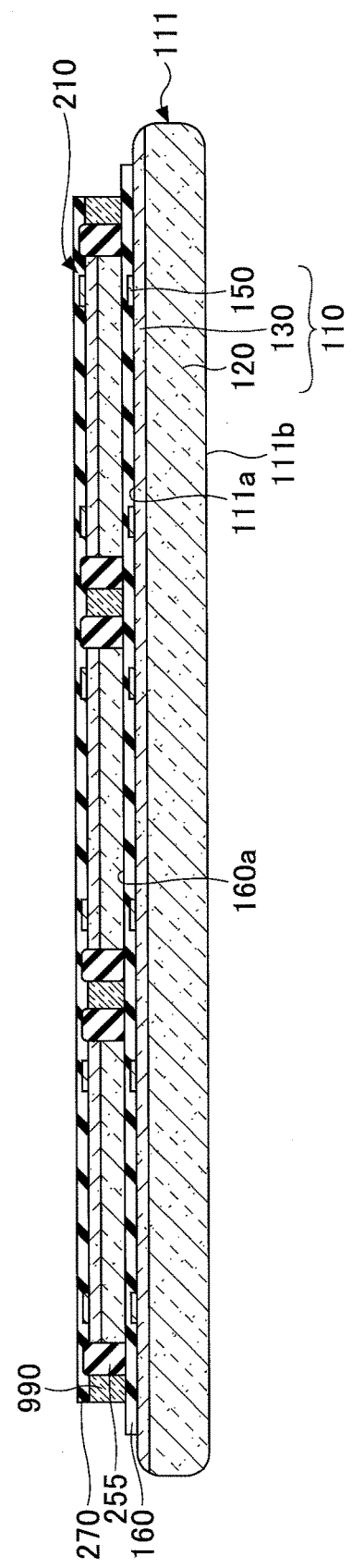
FIG. 4D is a drawing (4) used to describe an exemplary process of producing a semiconductor device according to the second variation of the first embodiment.

At a step illustrated by FIG. 4D, a photosensitive resist film 270 is formed to cover the main surfaces of the semiconductor chips 210, the upper surface of the resin layer 255, and the upper surface of the frame part 990. The resist film 270 may be formed, for example, by applying a liquid resist to the main surfaces of the semiconductor chips 210, the upper surface of the resin layer 255, and the upper surface of the frame part 990. The thickness of the resist film 270 may be, for example, about 10 μm.

Next, steps similar to the steps of FIGS. 3E through 3J are performed, and a resin layer is formed on the structure illustrated by FIG. 3J. Then, the steps of FIGS. 3A through 3J are repeated to stack the semiconductor chips 310 and 410. An external connection terminal 910 is formed using a known method as in the step of FIG. 2W, and the resulting structure is cut by, for example, a dicing blade to produce separate semiconductor devices 100 as illustrated by FIG. 1. Here, the steps of FIGS. 3E through 3I may be replaced with the steps of FIGS. 2J through 2U.

The second variation of the first embodiment provides advantageous effects similar to those provided by the first embodiment and the first variation of the first embodiment.

Second Embodiment

According to a second embodiment, electrodes of stacked semiconductor chips are electrically connected to each other via connection holes formed in a resin layer. In the second embodiment, descriptions of components already described in the above embodiments are omitted.

Structure of Semiconductor Device of Second Embodiment

First, an exemplary structure of a semiconductor device according to the second embodiment is described. FIG. 5 is a cut-away side view of a semiconductor device according to the second embodiment. Referring to FIG. 5, a semiconductor device 100A of the second embodiment has a configuration similar to the configuration of the semiconductor device 100 (see FIG. 1) of the first embodiment except that a via hole 210y used as a connecting hole is formed through a resin layer 255, and an electrode pad 250 of a semiconductor chip 210 and a wire 155 of a semiconductor chip 110 are electrically connected to each other via a metal layer 380 formed in the via hole 210y and on the resin layer 255. The wire 155 includes, for example, Cu and is electrically connected to an electrode pad 150.

Process of Producing Semiconductor Device of Second Embodiment

Next, an exemplary process of producing a semiconductor device according to the second embodiment is described. FIGS. 6A through 6G are drawings used to describe an exemplary process of producing a semiconductor device according to the second embodiment.

Figure 6A:
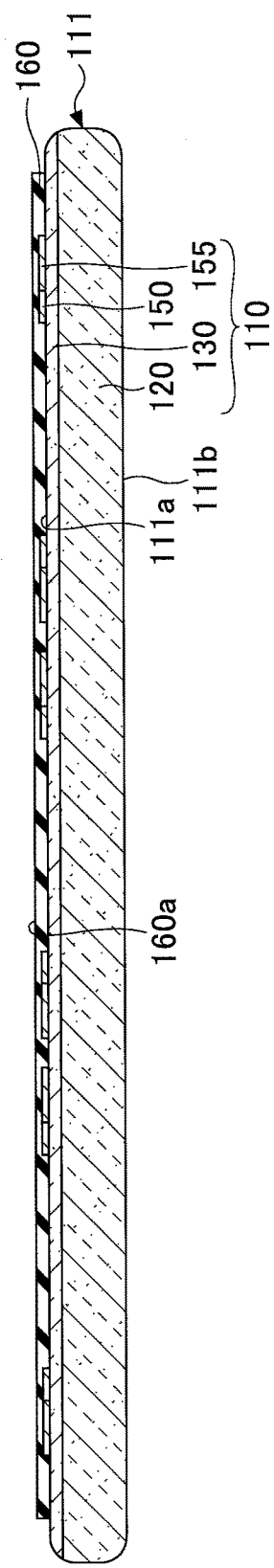
FIG. 6A is a drawing (1) used to describe an exemplary process of producing a semiconductor device according to the second embodiment.

First, steps similar to the steps of FIGS. 2A through 2E of the first embodiment are performed. At a step illustrated by FIG. 6A, a semiconductor substrate 111 is prepared in a manner similar to the step of FIG. 2F, and a resin layer 160 is formed on a main surface 111a of the semiconductor substrate 111. FIG. 6A is different from FIG. 2F in that it includes the wire 155 that is not illustrated in FIG. 2F. The wire 155 includes, for example, Cu and is electrically connected to the electrode pad 150.

Next, steps similar to the steps of FIGS. 2G through 2I of the first embodiment are performed. At a step illustrated by FIG. 6B, the resist film 270 illustrated in FIG. 2I is exposed via a mask and the exposed resist film 270 is developed to form an opening 270x in the resist film 270. Here, although the opening 270x is formed above the electrode pad 250 in the step of FIG. 2J, the opening 270x is formed above the wire 155 of the semiconductor substrate 111 in the step of FIG. 6B. For brevity, FIGS. 6B through 6G illustrate only an enlarged view of a part (around the electrode pad 150, the wire 155, and the electrode pad 250) of the structure of FIG. 6A.

Figure 6B:
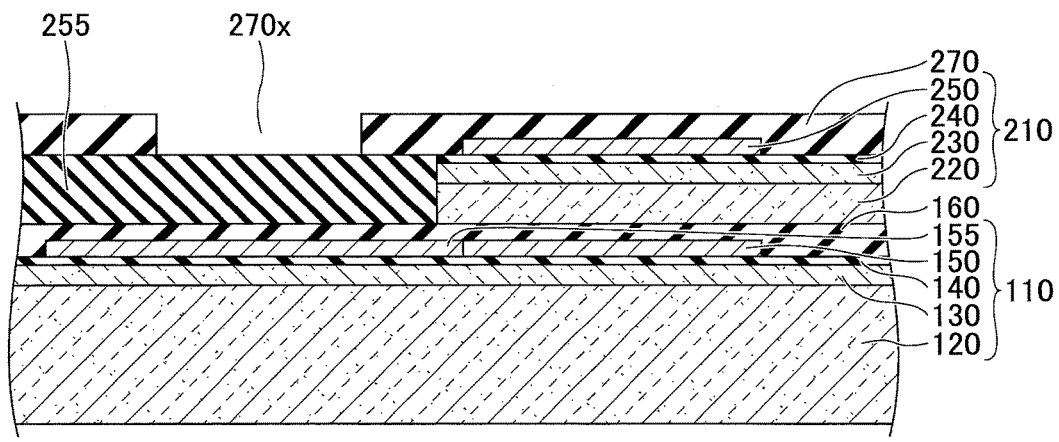
FIG. 6B is a drawing (2) used to describe an exemplary process of producing a semiconductor device according to the second embodiment.
Figure 6C:
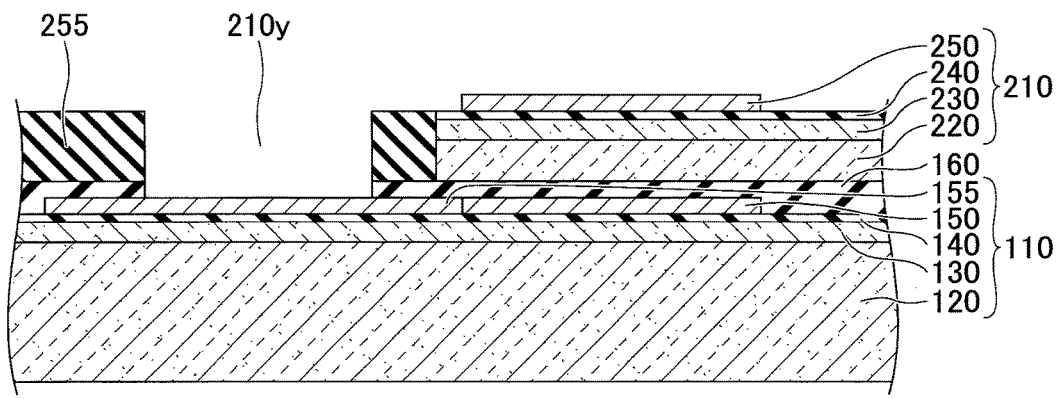
FIG. 6C is a drawing (3) used to describe an exemplary process of producing a semiconductor device according to the second embodiment.
Figure 6D:
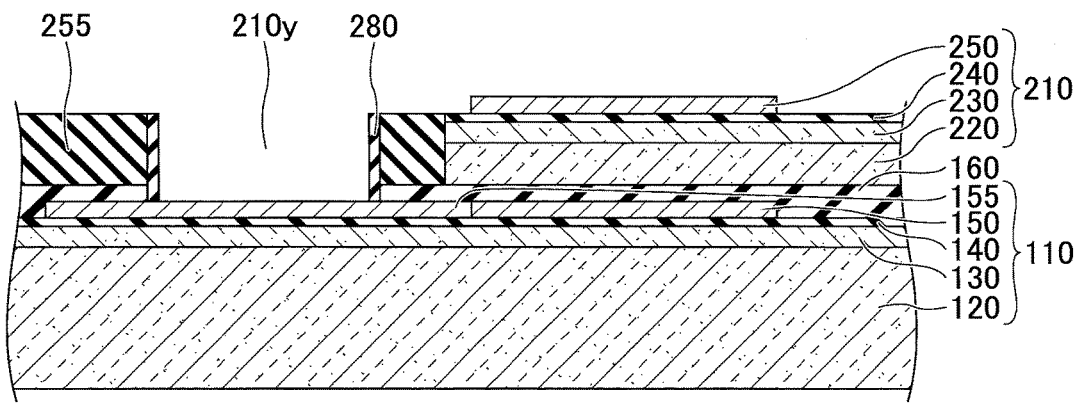
FIG. 6D is a drawing (4) used to describe an exemplary process of producing a semiconductor device according to the second embodiment.

At a step illustrated by FIG. 6C, the vial hole 210y is formed in each semiconductor chip 210 in a manner similar to the step of FIG. 2K. In this step, however, the via hole 210y is formed such that the upper surface of the wire 155 of the semiconductor substrate 111 is exposed. Next, in a manner similar to the step of FIG. 2L, the resist film 270 illustrated in FIG. 6B is removed. At a step illustrated by FIG. 6D, an insulating layer 280 is formed in a manner similar to the step of FIG. 2M, and parts of the insulating layer 280 other than those on the wall surface of the via hole 210y are removed in a manner similar to the step of FIG. 2N.

Figure 6E:
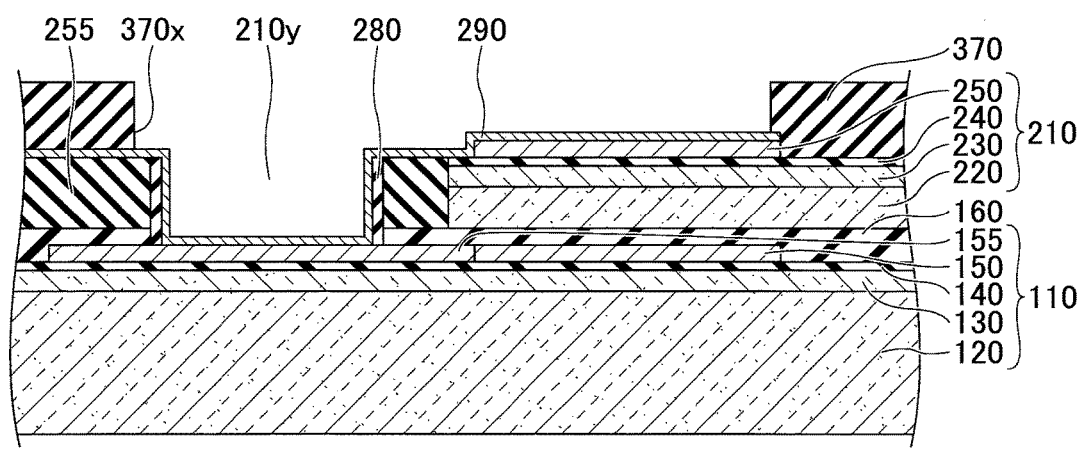
FIG. 6E is a drawing (5) used to describe an exemplary process of producing a semiconductor device according to the second embodiment.

At a step illustrated by FIG. 6E, a metal layer 290 is formed in a manner similar to the step of FIG. 2O. Then, in a manner similar to the steps of FIGS. 2P and 2Q, a resist film 370 having an opening 370x that exposes a region including the via hole 210y and the electrode pad 250 is formed. At a step illustrated by FIG. 6F, in a manner similar to the step of FIG. 2R, a metal layer 380 is formed in the via hole 210y and in a part of the opening 370x illustrated in FIG. 6E.

Figure 6F:
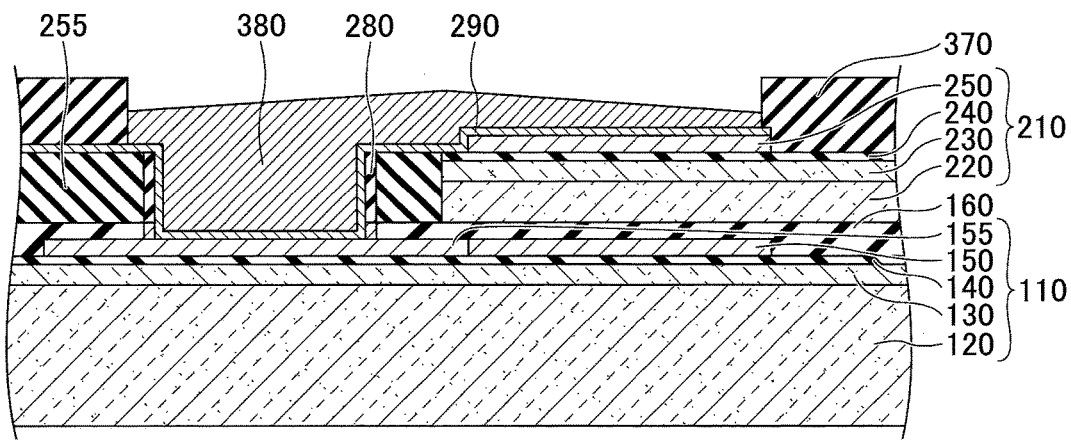
FIG. 6F is a drawing (6) used to describe an exemplary process of producing a semiconductor device according to the second embodiment.
Figure 6G:
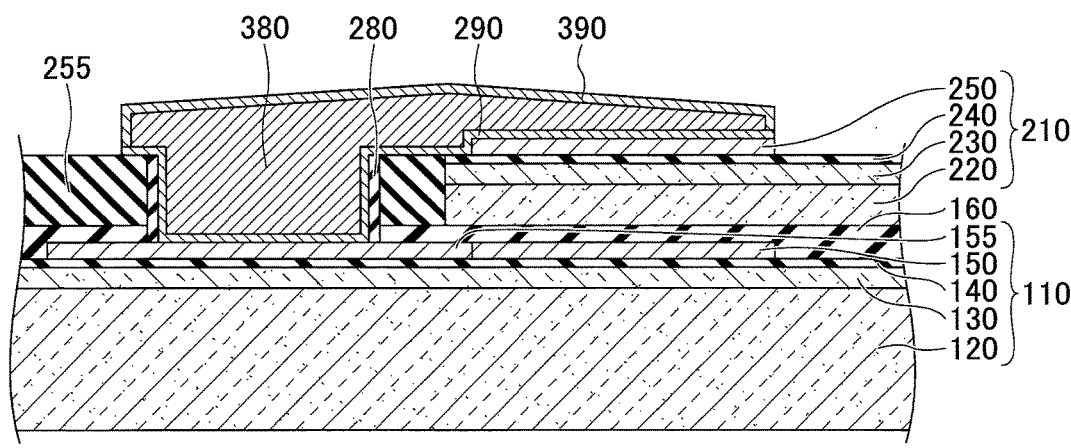
FIG. 6G is a drawing (7) used to describe an exemplary process of producing a semiconductor device according to the second embodiment.

At a step illustrated by FIG. 6G, the resist film 370 illustrated in FIG. 6F is removed, and parts of the metal layer 290 that are not covered by the metal layer 380 are removed in a manner similar to the step of FIG. 2T. Next, in a manner similar to the step of FIG. 2U, a metal layer 390 is formed to cover the metal layer 380. Next, steps similar to the steps of FIGS. 2V through 2X are performed, and the resulting structure is cut at the cutting positions C by, for example, a dicing blade to produce separate semiconductor devices 100A as illustrated by FIG. 5.

Figure 7:
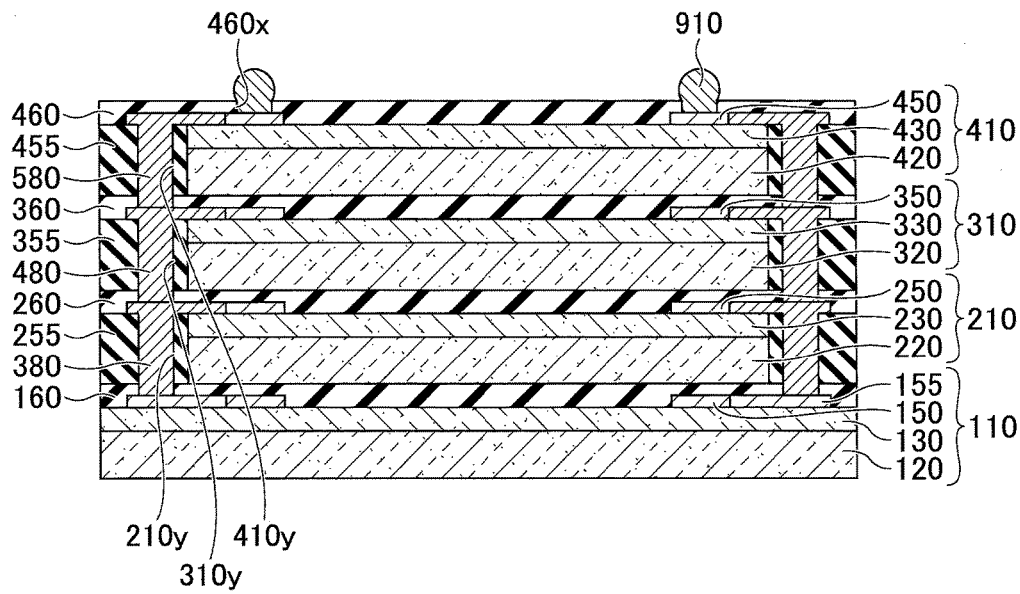
FIG. 7 is a cut-away side view (2) of a semiconductor device according to the second embodiment.

As an alternative, as in a semiconductor device 100B illustrated by FIG. 7, the semiconductor chips 210 and 310 may be electrically connected to each other through a via hole 310y formed through a resin layer 355 and the semiconductor chips 310 and the 410 may be electrically connected to each other through a via hole 410y formed through a resin layer 455 by performing steps similar to the steps of FIGS. 6B through 6G. Also, a via hole passing through a semiconductor chip and a via hole passing through a resin layer may coexist in the same layer.

The second embodiment provides advantageous effects similar to those provided by the first embodiment, and also provides advantageous effects as described below. According to the second embodiment, electrodes of stacked semiconductor chips are electrically connected to each other through via holes formed in a resin layer. This configuration or method makes it possible to electrically connect stacked semiconductor chips to each other via a bypass route even when a via hole cannot be formed in the semiconductor chips, and thereby makes it possible to improve flexibility in the wiring design.

Third Embodiment

Structure of Semiconductor Device of Third Embodiment

Figure 8:
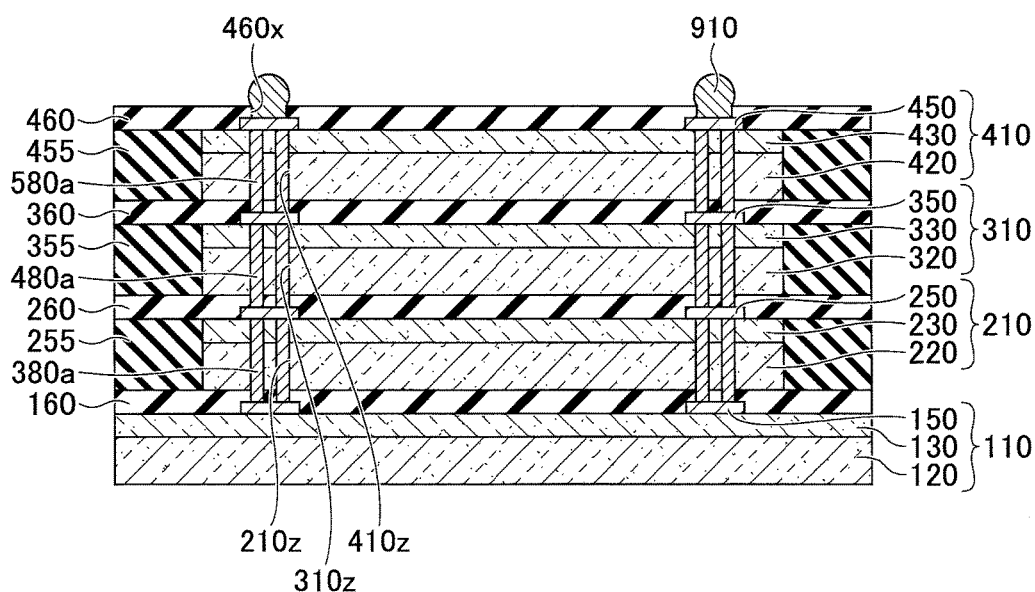
FIG. 8 is a cut-away side view of a semiconductor device according to a third embodiment.

First, an exemplary structure of a semiconductor device according to a third embodiment is described. FIG. 8 is a cut-away side view of a semiconductor device according to the third embodiment. A semiconductor device 100C of the third embodiment has a configuration similar to the semiconductor device 100 (see FIG. 1) of the first embodiment except that four sets of via holes and metal layers (instead of one set) are provided to connect a pair of metal pads (electrode pads) of vertically-adjacent semiconductor chips.

In FIG. 8, reference numbers 210z through 410z indicate via holes, 380a through 580a indicate metal layers filling the via holes 210z through 410z. Four via holes and four metal layers are provided for one metal pad of each semiconductor chip.

Providing multiple via holes and metal layers for each metal pad makes it possible to improve the reliability of connection between metal pads. Also, when no metal pad is provided in a semiconductor substrate that is directly below a given semiconductor substrate, via holes and metal layers may be provided for a semiconductor substrate that is one or more layers below the given semiconductor substrate. With this configuration, it is possible to send the same electric signal or different electric signals to a desired semiconductor substrate. Also with this configuration, because the diameter of via holes is reduced, it is possible to reduce the time necessary to form the via holes and metal layers. The number of sets of via holes and metal layers provided for one metal pad may be two, three, five, or more.

Process of Producing Semiconductor Device of Third Embodiment

Next, an exemplary process of producing a semiconductor device according to the third embodiment is described. FIGS. 9A through 9F are drawings used to describe an exemplary process of producing a semiconductor device according to the third embodiment. Descriptions of steps similar to those in the semiconductor device production process of the first embodiment may be omitted.

Figure 9A:
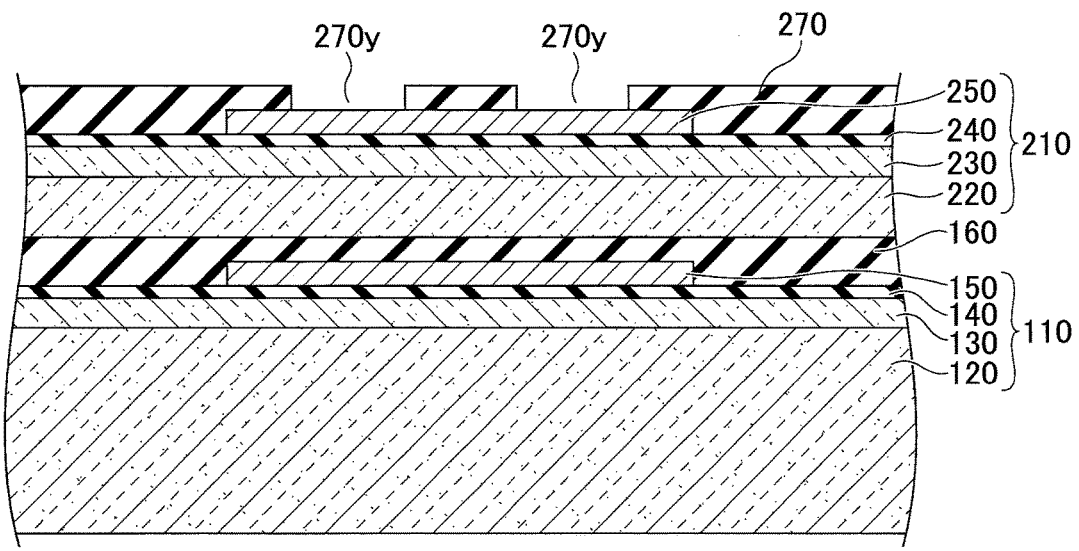
FIG. 9A is a drawing (1) used to describe an exemplary process of producing a semiconductor device according to the third embodiment.
Figure 9B:
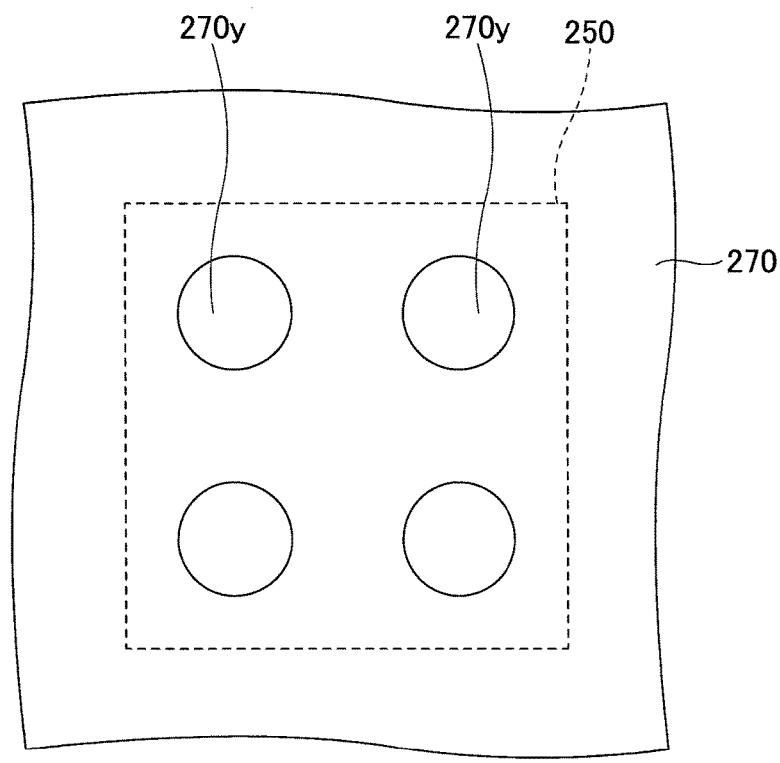
FIG. 9B is a drawing (2) used to describe an exemplary process of producing a semiconductor device according to the third embodiment.

First, steps similar to the steps of FIG. 2A through 2I are performed. At steps illustrated by FIGS. 9A and 9B, the resist film 270 illustrated in FIG. 2I is exposed via a mask and the exposed resist film 270 is developed to form openings 270x in the resist film 270. FIG. 9A is a cut-away side view, and FIG. 9B is a plan view. For brevity, FIGS. 9A through 9F illustrate only an enlarged view of a part (around the electrode pad 150 and the electrode pad 250) of the structure of FIG. 2I.

Figure 9C:
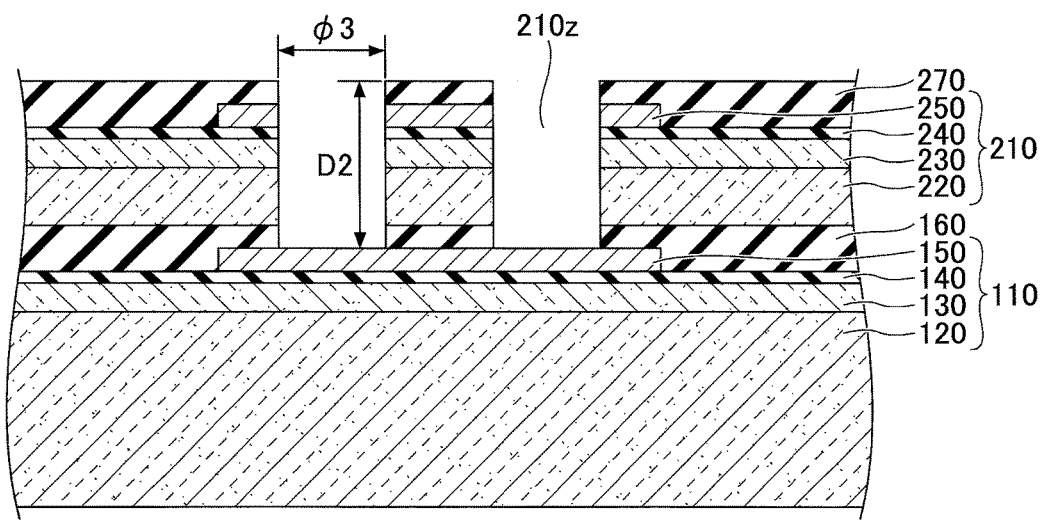
FIG. 9C is a drawing (3) used to describe an exemplary process of producing a semiconductor device according to the third embodiment.

At a step illustrated by FIG. 9C, vial holes 210z are formed in the semiconductor chip 210. The via holes 210z are formed to pass through parts of the semiconductor chip 210 (i.e., the main substrate 220, the semiconductor integrated circuit 230, the insulating layer 240, and the electrode pad 250) and parts of the resin layer 160 that correspond to the openings 270x such that the electrode pad 150 of the semiconductor chip 110 is exposed. For example, each of the via holes 210z may be formed by dry etching. The via hole 210z may have a circular shape in plan view, and a diameter $\phi 3$ of the via hole 210z may be, for example, about 1 μm to about 10 μm. Here, the diameter $\phi 3$ of the via hole 210z is preferably determined such that the aspect ratio (depth D2/diameter $\phi 3$) of the via hole 210z becomes greater than or equal to 0.5 and less than or equal to 5. Setting the diameter $\phi 3$ of the via hole 210z such that the aspect ratio (depth D2/diameter $\phi 3$) becomes greater than or equal to 0.5 and less than or equal to 5 makes it possible to improve the etching rate (throughput) in forming the via hole 210z and makes it easier to fill the via hole 210z with a metal layer 380a.

Figure 9D:
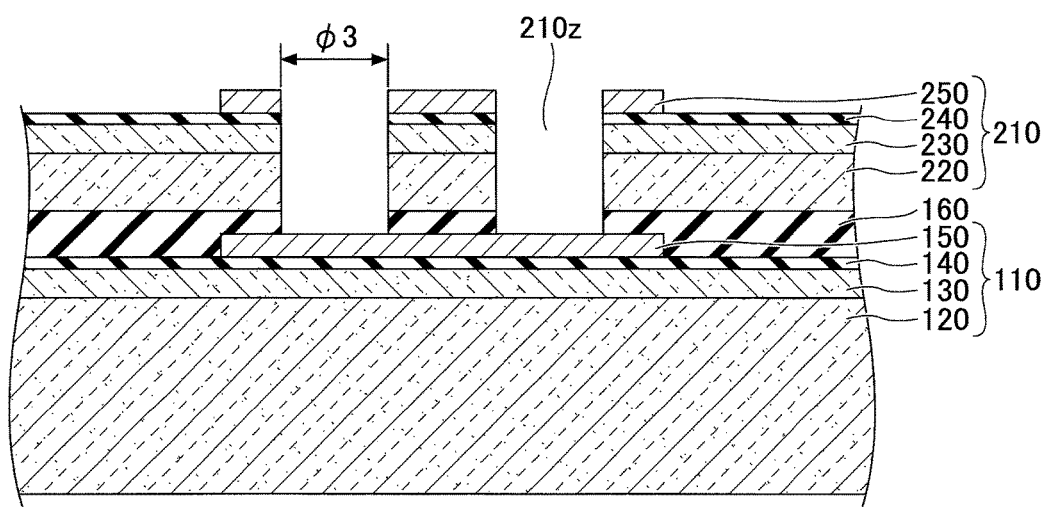
FIG. 9D is a drawing (4) used to describe an exemplary process of producing a semiconductor device according to the third embodiment.
Figure 9E:
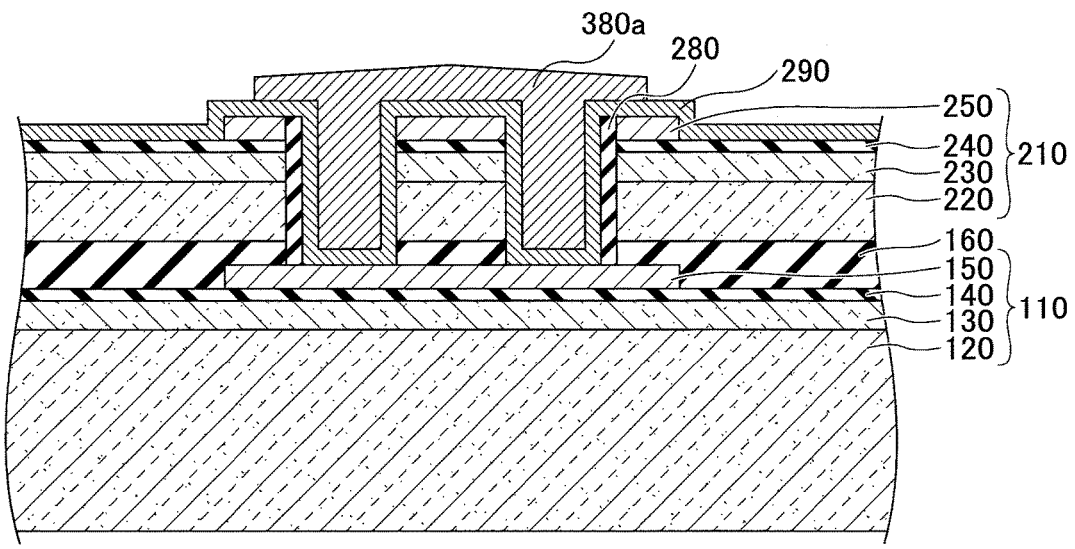
FIG. 9E is a drawing (5) used to describe an exemplary process of producing a semiconductor device according to the third embodiment.
Figure 9F:
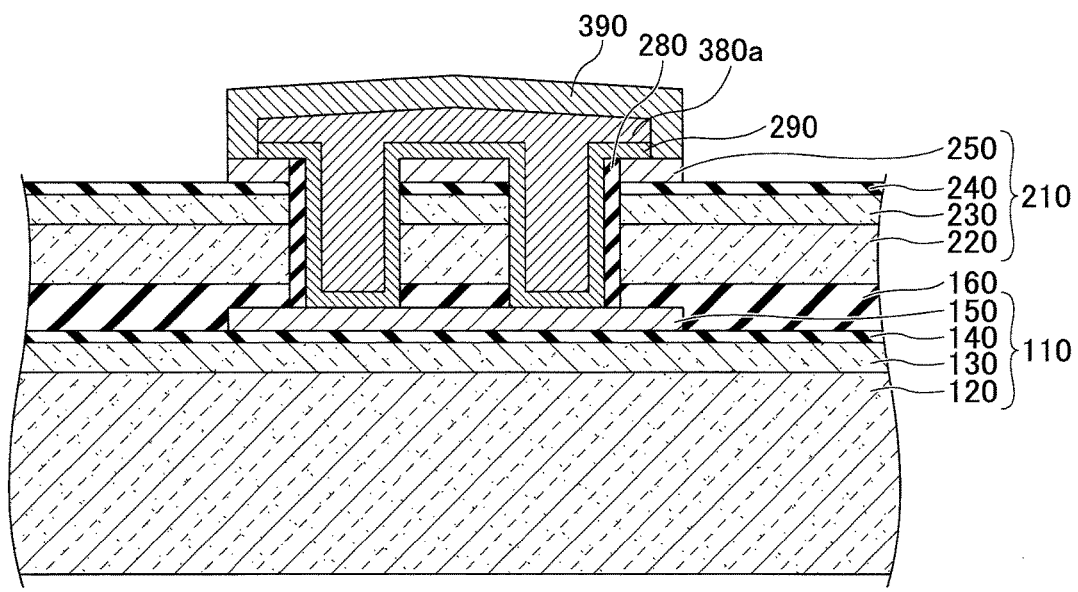
FIG. 9F is a drawing (6) used to describe an exemplary process of producing a semiconductor device according to the third embodiment.

At a step illustrated by FIG. 9D, the resist film 270 illustrated in FIG. 9C is removed. Next, steps similar to the steps of FIGS. 2M through 2S are performed, and the via holes 210z are filled with metal layers 380a as illustrated in FIG. 9E. Next, parts of the metal layer 290 not covered by the metal layers 380a are removed, for example, by wet etching, and a metal layer 390 is formed to cover the electrode pad 250 and the metal layers 380a as illustrated by FIG. 9F. For example, the metal layer 390 may be formed by forming, on the insulating layer 240, a resist film with an opening that exposes the electrode pad 250 and the metal layers 380a, depositing and growing a plating film in the opening by electroplating using the electrode pad 250 and the metal layers 380a as power feed layers, and then removing the resist film.

Then, steps similar to those in the first embodiment are repeated to produce semiconductor devices 100C as illustrated by FIG. 8.

The third embodiment provides advantageous effects similar to those provided by the first embodiment, and also provides advantageous effects as described below. The third embodiment makes it possible to reduce the diameter of via holes and thereby makes it possible to reduce the time necessary to form the via holes and metal layers. Also, because multiple via holes and metal layers are provided for one metal pad, it is possible to improve the reliability of connection between metal pads.

Fourth Embodiment

Structure of Semiconductor Device of Fourth Embodiment

Figure 10:
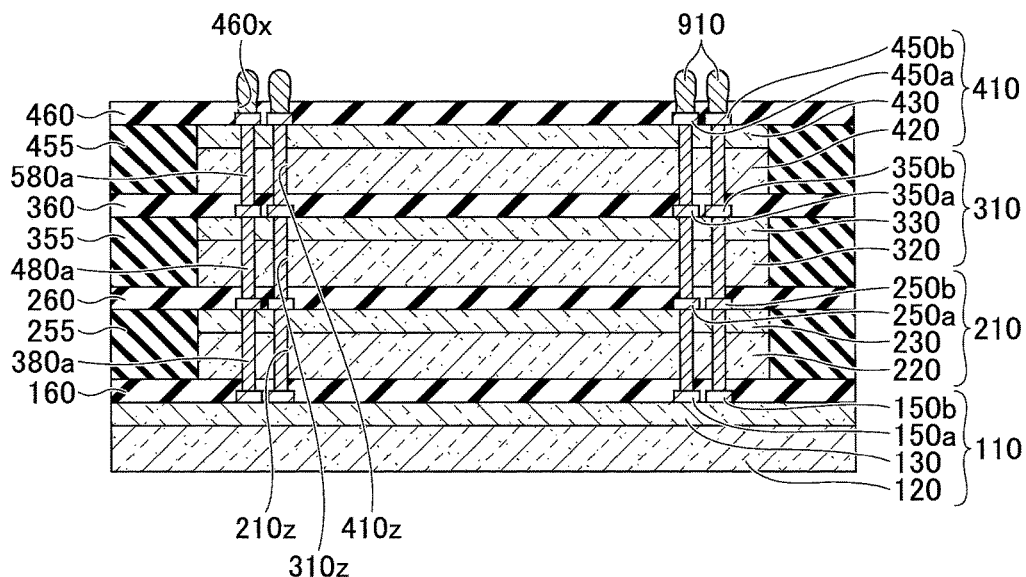
FIG. 10 is a cut-away side view of a semiconductor device according to a fourth embodiment.

First, an exemplary structure of a semiconductor device according to a fourth embodiment is described. FIG. 10 is a cut-away side view of a semiconductor device according to the fourth embodiment. A semiconductor device 100D of the fourth embodiment has a configuration similar to the configuration of the semiconductor device 100C of the third embodiment. However, while the semiconductor device 100C includes one metal pad (electrode pad) for each set of four via holes and four metal layers, the semiconductor device 100D includes one metal pad for each pair of a via hole and a metal layer.

In FIG. 10, reference numbers 150a and 150b through 450a and 450b indicate metal pads (electrode pads). One metal pad is provided for each pair of a via hole and a metal layer.

When the same signal is assigned to adjacent metal pads, similarly to the third embodiment, the configuration of the fourth embodiment makes it possible to improve the reliability of connection between metal pads. On the other hand, when different signals are assigned to adjacent metal pads, the configuration of the fourth embodiment makes it possible to improve wiring design flexibility.

Process of Producing Semiconductor Device of Fourth Embodiment

Next, an exemplary process of producing a semiconductor device according to the fourth embodiment is described. FIGS. 11A through 11F are drawings used to describe an exemplary process of producing a semiconductor device according to the fourth embodiment. Descriptions of steps similar to those in the semiconductor device production processes of the first and second embodiments may be omitted.

Figure 11A:
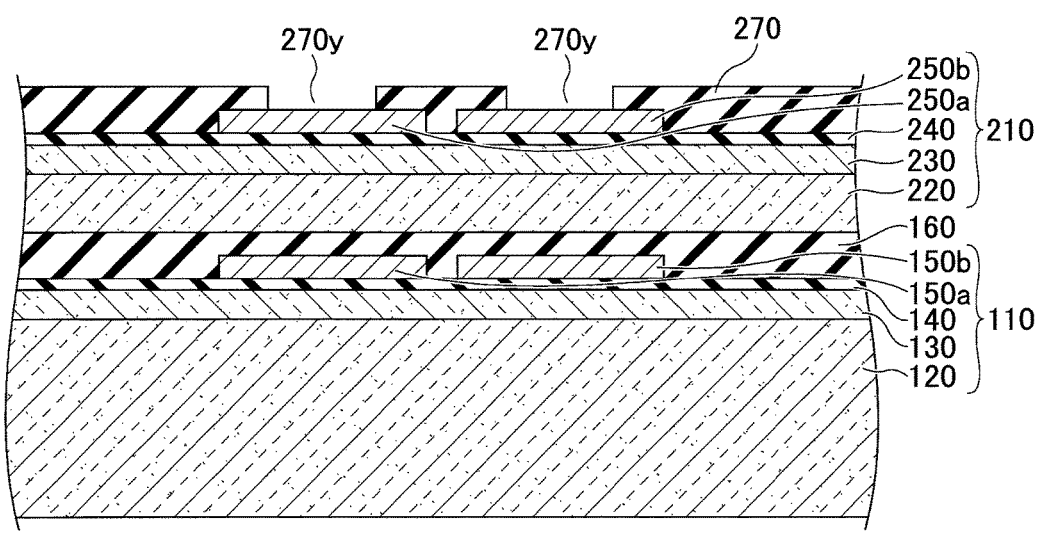
FIG. 11A is a drawing (1) used to describe an exemplary process of producing a semiconductor device according to the fourth embodiment.
Figure 11B:
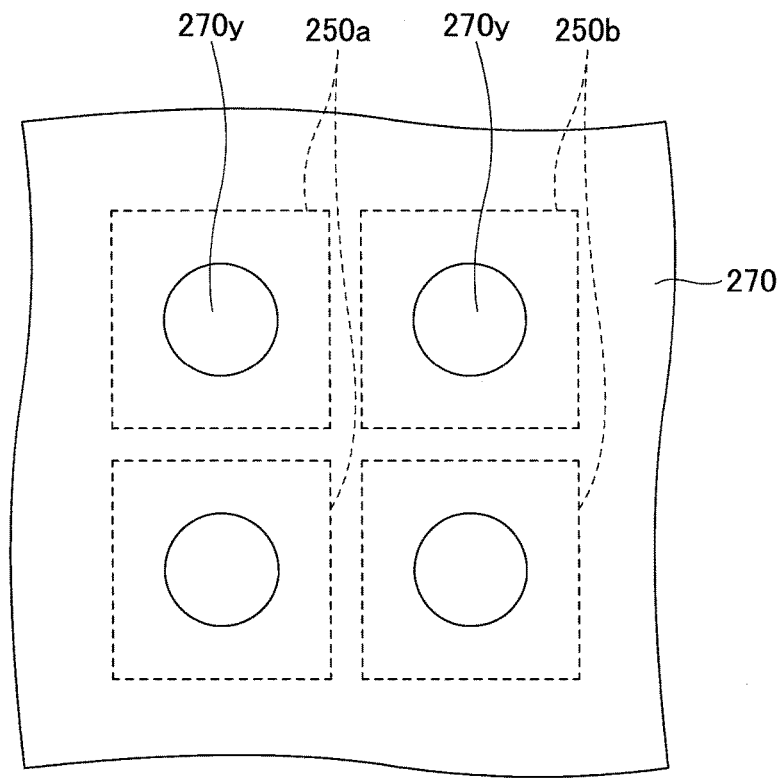
FIG. 11B is a drawing (2) used to describe an exemplary process of producing a semiconductor device according to the fourth embodiment.

First, steps similar to the steps of FIG. 2A through 2I are performed. At steps illustrated by FIGS. 11A and 11B, the resist film 270 illustrated in FIG. 2I is exposed via a mask and the exposed resist film 270 is developed to form openings 270y in the resist film 270. FIG. 11A is a cut-away side view, and FIG. 11B is a plan view. For brevity, FIGS. 11A through 11F illustrate only an enlarged view of a part (around the electrode pad 150 and the electrode pad 250) of the structure of FIG. 2I.

Figure 11C:
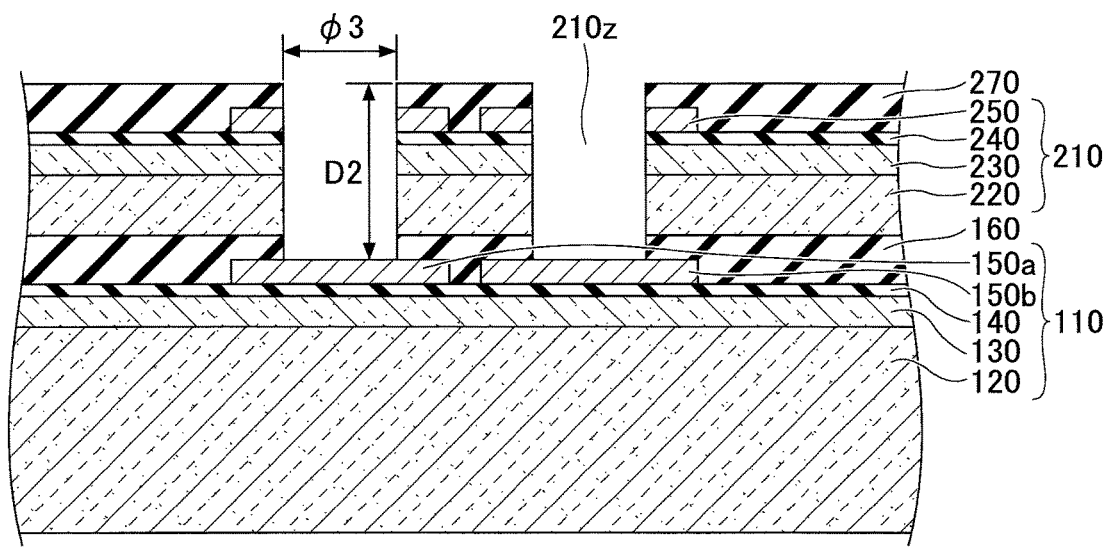
FIG. 11C is a drawing (3) used to describe an exemplary process of producing a semiconductor device according to the fourth embodiment.

At a step illustrated by FIG. 11C, vial holes 210z are formed in the semiconductor chip 210. The via holes 210z are formed to pass through parts of the semiconductor chip 210 (i.e., the main substrate 220, the semiconductor integrated circuit 230, the insulating layer 240, and the electrode pads 250) and parts of the resin layer 160 that correspond to the openings 270y such that the electrode pads 150a and 150b of the semiconductor chip 110 are exposed. For example, each of the via holes 210z may be formed by dry etching. The via hole 210z may have a circular shape in plan view, and a diameter φ3 of the via hole 210z may be, for example, about 1 µm to about 10 µm. Here, the diameter φ3 of the via hole 210z is preferably determined such that the aspect ratio (depth D2/diameter φ3) of the via hole 210z becomes greater than or equal to 0.5 and less than or equal to 5. Setting the diameter φ3 of the via hole 210z such that the aspect ratio (depth D2/diameter φ3) becomes greater than or equal to 0.5 and less than or equal to 5 makes it possible to improve the etching rate (throughput) in forming the via hole 210z and makes it easier to fill the via hole 210z with a metal layer 380b.

Figure 11D:
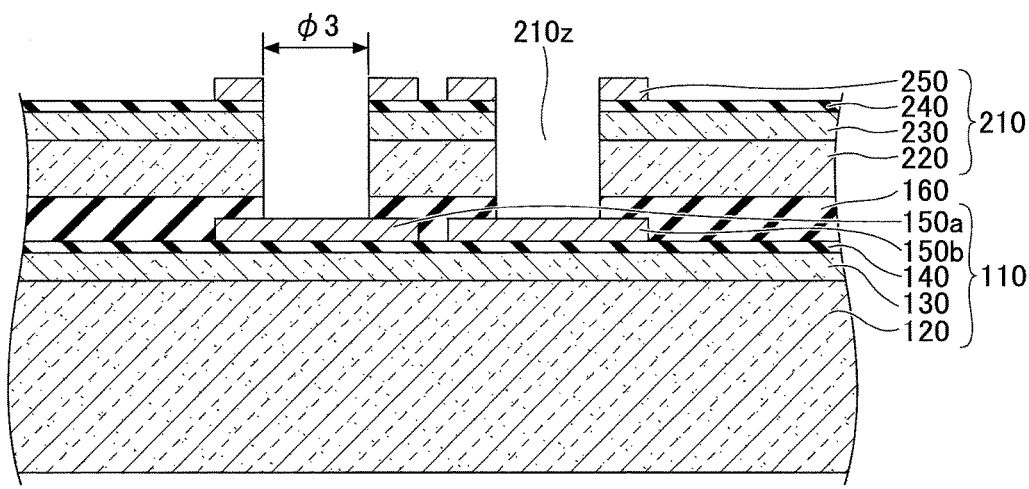
FIG. 11D is a drawing (4) used to describe an exemplary process of producing a semiconductor device according to the fourth embodiment.
Figure 11E:
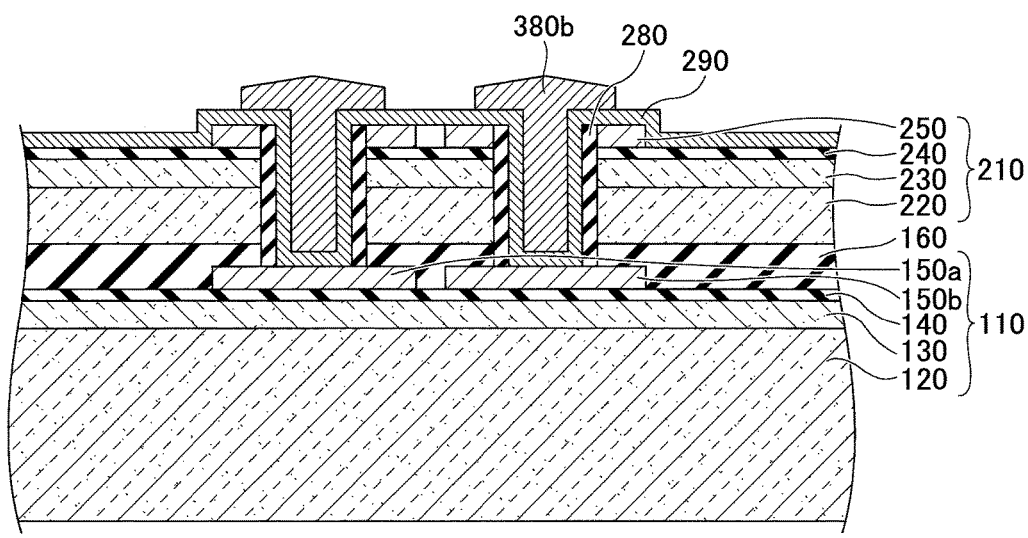
FIG. 11E is a drawing (5) used to describe an exemplary process of producing a semiconductor device according to the fourth embodiment.
Figure 11F:
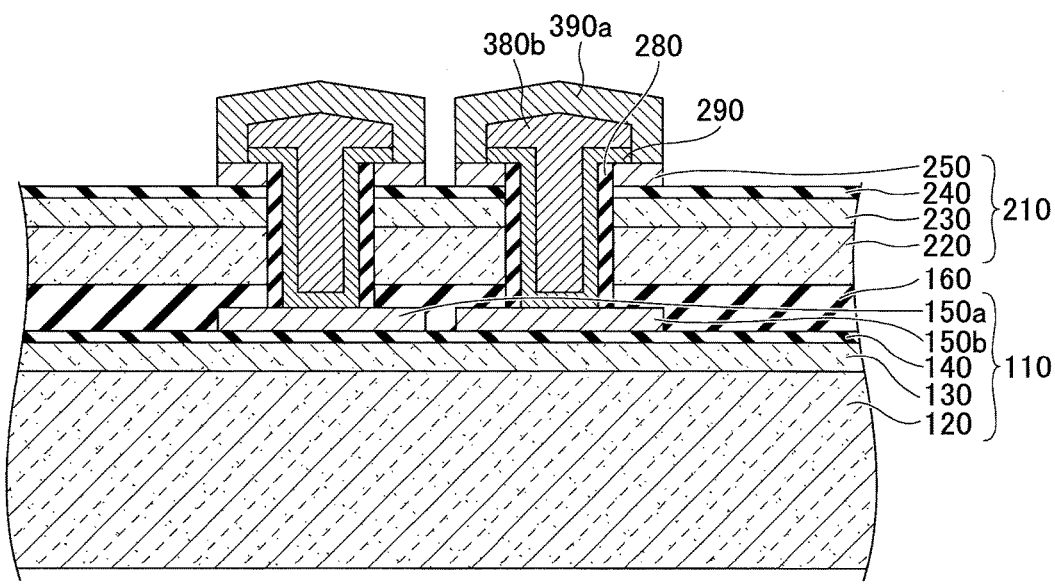
FIG. 11F is a drawing (6) used to describe an exemplary process of producing a semiconductor device according to the fourth embodiment.

At a step illustrated by FIG. 11D, the resist film 270 illustrated in FIG. 11C is removed. Next, steps similar to the steps of FIGS. 2M through 2S are performed, and the via holes 210z are filled with metal layers 380b as illustrated in FIG. 11E. Next, parts of the metal layer 290 not covered by the metal layers 380b are removed, for example, by wet etching, and metal layers 390a are formed to cover the electrode pads 250 and the metal layers 380b as illustrated by FIG. 11F. For example, the metal layers 390a may be formed by forming, on the insulating layer 240, a resist film with openings that expose the electrode pads 250 and the metal layers 380b, depositing and growing plating films in the openings by electroplating using the electrode pads 250 and the metal layers 380b as power feed layers, and then removing the resist film.

Then, steps similar to those in the first embodiment are repeated to produce semiconductor devices 100D as illustrated by FIG. 10.

The fourth embodiment provides advantageous effects similar to those provided by the first embodiment, and also provides advantageous effects as described below. When the same signal is assigned to adjacent metal pads, similarly to the third embodiment, the configuration of the fourth embodiment makes it possible to improve the reliability of connection between metal pads. On the other hand, when different signals are assigned to adjacent metal pads, the configuration of the fourth embodiment makes it possible to improve wiring design flexibility.

Fifth Embodiment

Structure of Semiconductor Device of Fifth Embodiment

Figure 12:
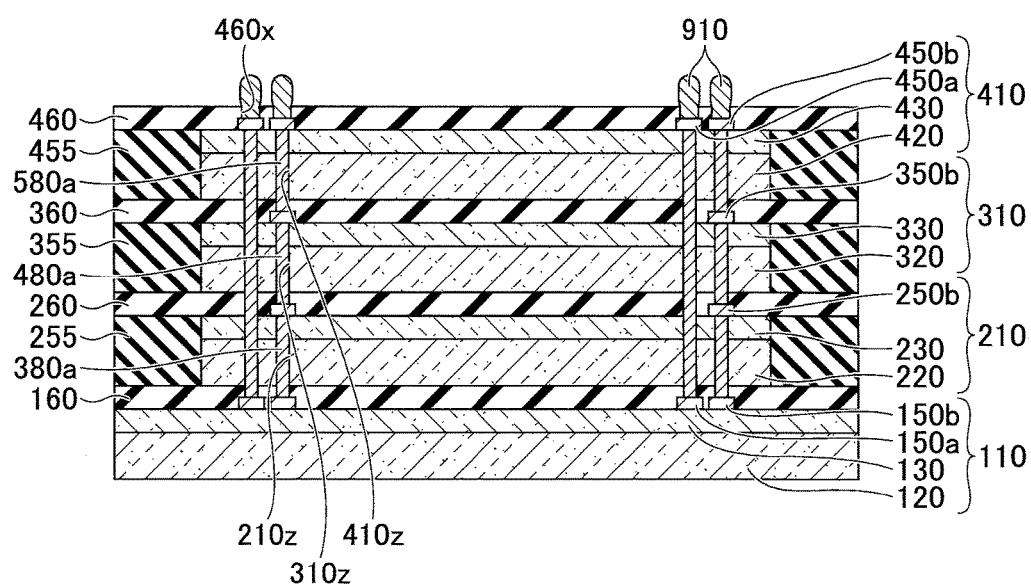
FIG. 12 is a cut-away side view of a semiconductor device according to a fifth embodiment.

First, an exemplary structure of a semiconductor device according to a fifth embodiment is described. FIG. 12 is a cut-away side view of a semiconductor device according to the fifth embodiment. A semiconductor device 100E of the fifth embodiment has a configuration similar to the configuration of the semiconductor device 100D of the fourth embodiment. However, different from the semiconductor device 100D of the fourth embodiment where metal pads (electrode pads) are provided at all positions corresponding to via holes of semiconductor chips, according to the fifth embodiment, some of the metal pads are omitted and non-adjacent semiconductor chips including metal pads are directly connected using via holes and metal layers.

Thus, according to the fifth embodiment, metal pads are provided only in some of semiconductor chips. This configuration makes it possible to directly connect nonadjacent semiconductor chips using via holes and metal layers and thereby makes it possible to improve wiring design flexibility.

Process of Producing Semiconductor Device of Fifth Embodiment

Next, an exemplary process of producing a semiconductor device according to the fifth embodiment is described. FIGS. 13A through 13H are drawings used to describe an exemplary process of producing a semiconductor device according to the fifth embodiment. Descriptions of steps similar to those in the semiconductor device production processes of the first through fourth embodiments may be omitted.

Figure 13A:
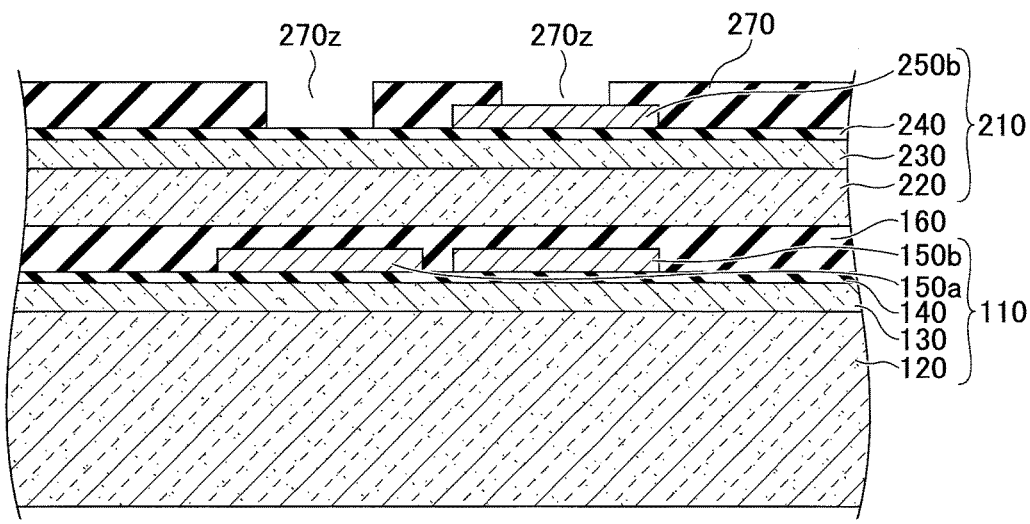
FIG. 13A is a drawing (1) used to describe an exemplary process of producing a semiconductor device according to the fifth embodiment.
Figure 13B:
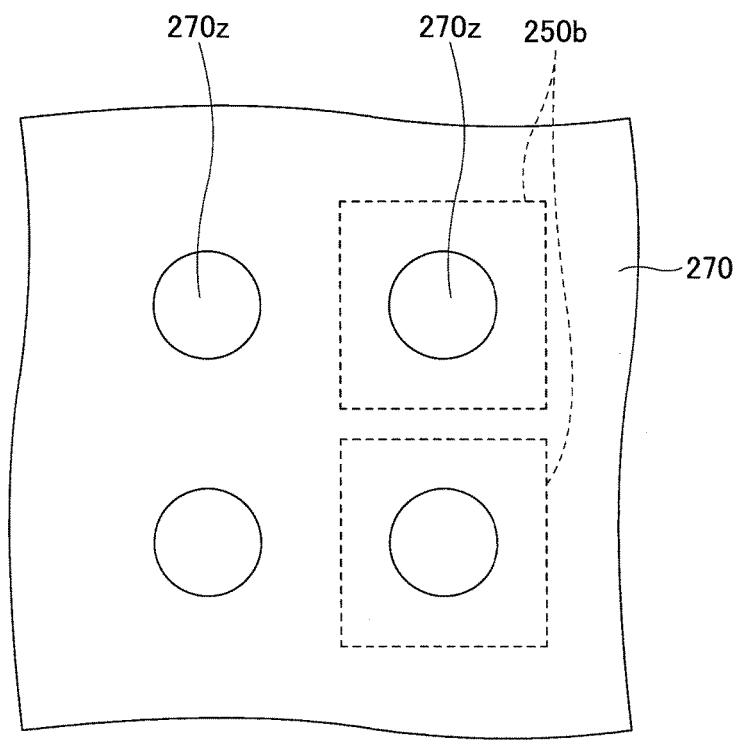
FIG. 13B is a drawing (2) used to describe an exemplary process of producing a semiconductor device according to the fifth embodiment.

First, steps similar to the steps of FIG. 2A through 2I are performed. At steps illustrated by FIGS. 13A and 13B, the resist film 270 illustrated in FIG. 2I is exposed via a mask and the exposed resist film 270 is developed to form openings 270z in the resist film 270. FIG. 13A is a cut-away side view, and FIG. 13B is a plan view. For brevity, FIGS. 13A through 13H illustrate only an enlarged view of a part (around electrode pads 150 and an electrode pad 250b) of the structure of FIG. 2I.

Figure 13C:
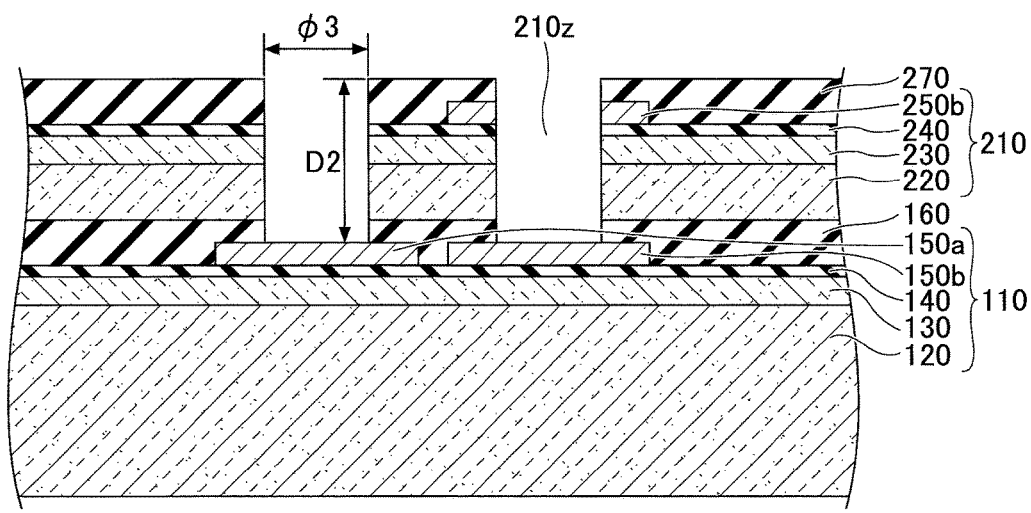
FIG. 13C is a drawing (3) used to describe an exemplary process of producing a semiconductor device according to the fifth embodiment.

At a step illustrated by FIG. 13C, vial holes 210z are formed in the semiconductor chip 210. The via holes 210z are formed to pass through parts of the semiconductor chip 210 (i.e., the main substrate 220, the semiconductor integrated circuit 230, the insulating layer 240, and the electrode pad 250b) and parts of the resin layer 160 that correspond to the openings 270z such that the electrode pads 150a and 150b of the semiconductor chip 110 are exposed. For example, each of the via holes 210z may be formed by dry etching. The via hole 210z may have a circular shape in plan view, and a diameter 3 of the via hole 210z may be, for example, about 1 μm to about 10 μm. Here, the diameter φ3 of the via hole 210z is preferably determined such that the aspect ratio (depth D2/diameter φ3) of the via hole 210z becomes greater than or equal to 0.5 and less than or equal to 5. Setting the diameter φ3 of the via hole 210z such that the aspect ratio (depth D2/diameter φ3) becomes greater than or equal to 0.5 and less than or equal to 5 makes it possible to improve the etching rate (throughput) in forming the via hole 210z and makes it easier to fill the via hole 210z with a metal layer 380b.

Figure 13D:
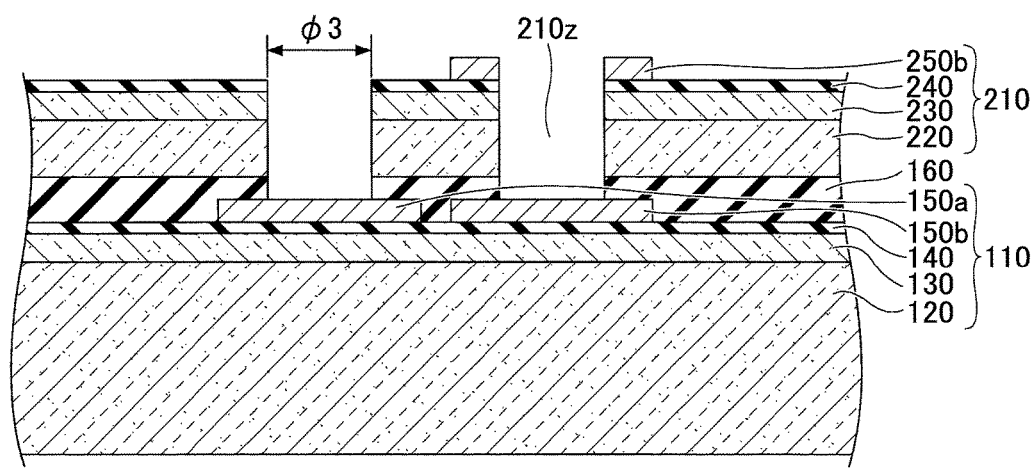
FIG. 13D is a drawing (4) used to describe an exemplary process of producing a semiconductor device according to the fifth embodiment.
Figure 13E:
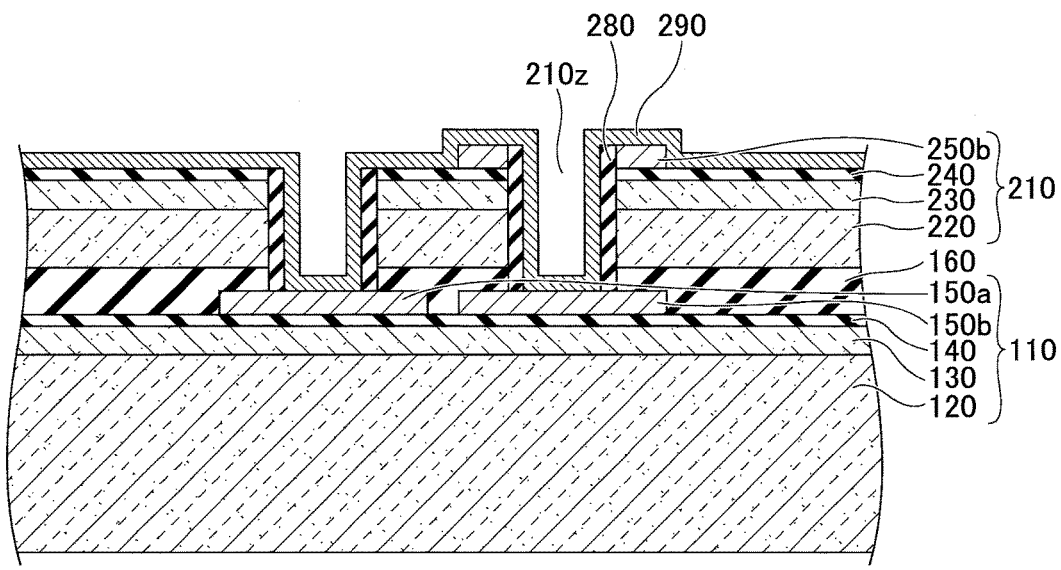
FIG. 13E is a drawing (5) used to describe an exemplary process of producing a semiconductor device according to the fifth embodiment.

At a step illustrated by FIG. 13D, the resist film 270 illustrated in FIG. 13C is removed. Next, steps similar to the steps of FIGS. 2M through 2N are performed. Then, as illustrated by FIG. 13E, a metal layer 290 is formed to cover the upper surface of the insulating layer 240, the upper and side surfaces of the electrode pad 250b, the upper surface of the insulating layer 280, and the upper surfaces of the electrode pads 150a and 150b exposed at the bottom of the via holes 210z. For example, the metal layer 290 may be formed by electroless plating. Also, the metal layer 290 may be formed by sputtering or CVD. The metal layer 290 may be implemented, for example, by a laminated structure where a Cu layer is laminated on a Ti layer. Also, the metal layer 290 may be implemented by a laminated structure where a Cu layer is laminated on a Ta layer. Also, any conductor that satisfies design criteria may be used as an embedded material. For example, instead of Cu, one of W, Al, doped polysilicon, a carbon material such as carbon nanotube, and a conductive polymer may be used. Also, when the insulation performance of the insulating layer is sufficient, a combination of embedded wirings using no Bayer metal layer may be selected.

Figure 13F:
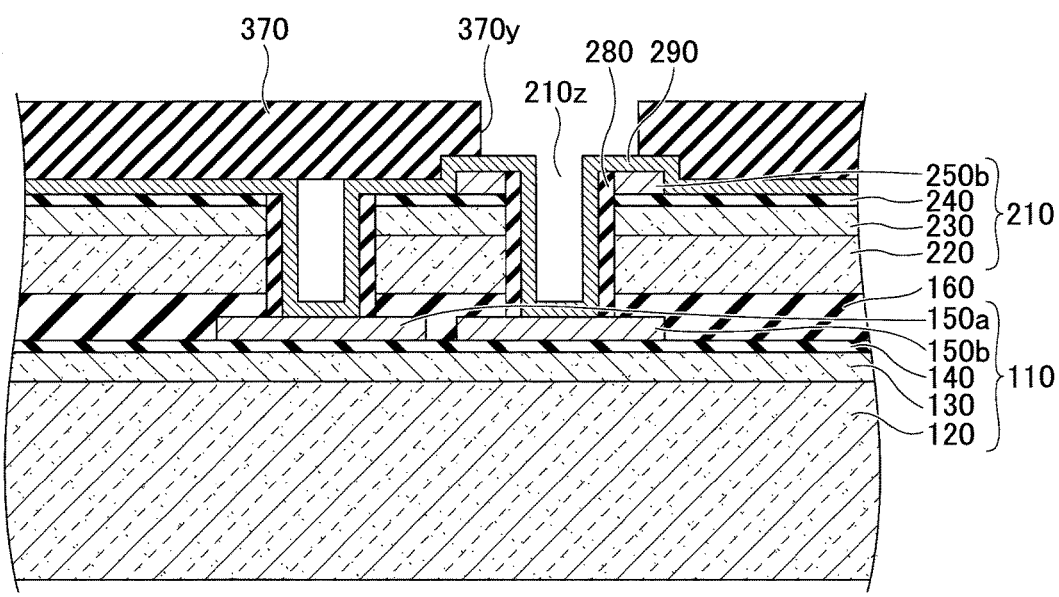
FIG. 13F is a drawing (6) used to describe an exemplary process of producing a semiconductor device according to the fifth embodiment.
Figure 13G:
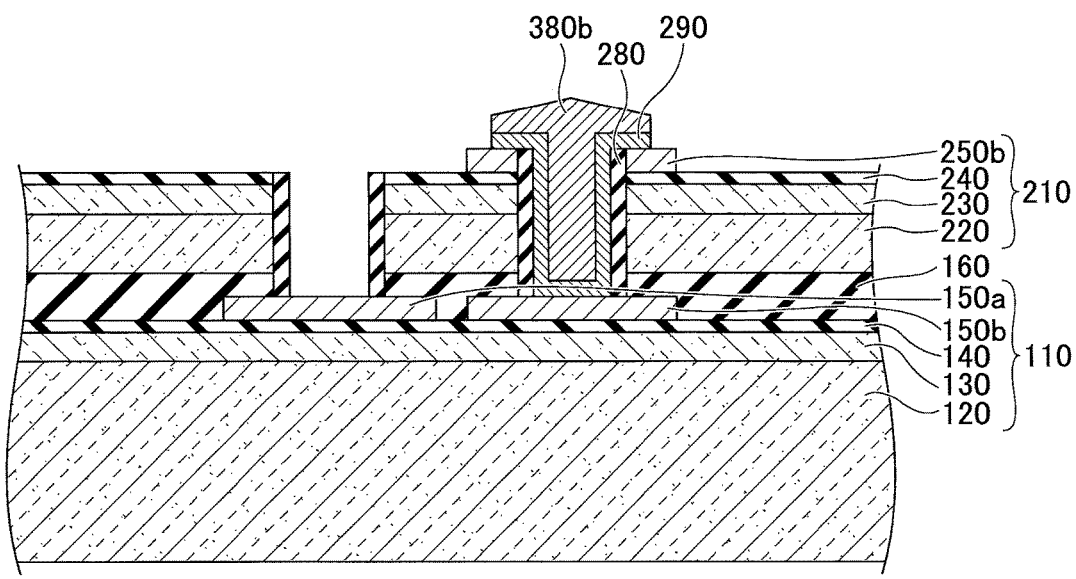
FIG. 13G is a drawing (7) used to describe an exemplary process of producing a semiconductor device according to the fifth embodiment.
Figure 13H:
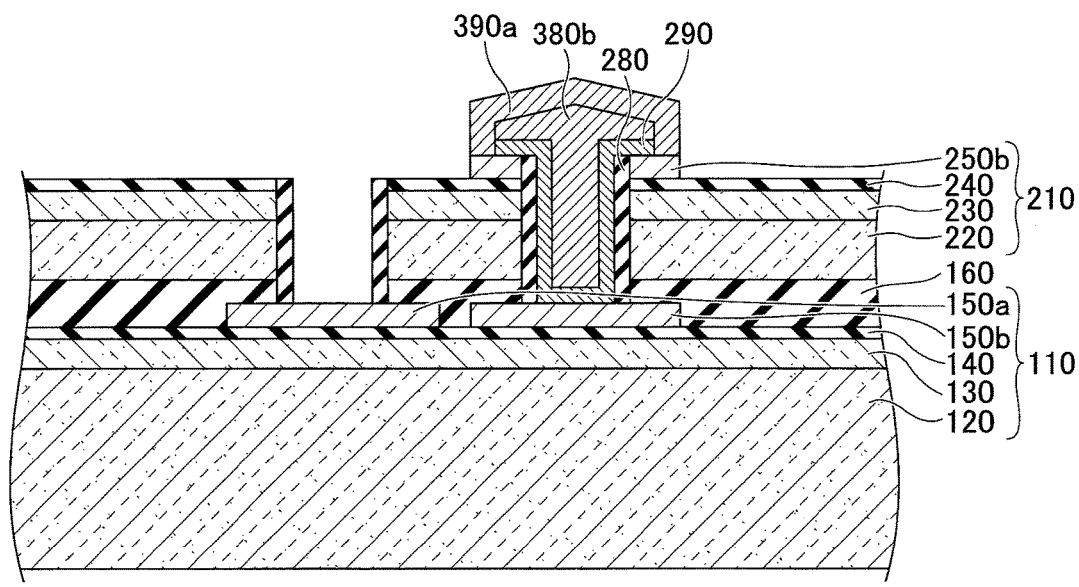
FIG. 13H is a drawing (8) used to describe an exemplary process of producing a semiconductor device according to the fifth embodiment.

At a step illustrated by FIG. 13F, a photosensitive resist film 370 is formed to cover the upper surface of the metal layer 290 excluding parts of the metal layer 290 in the via holes 210z. For example, the resist film 370 may be formed by pasting a dry film resist to the upper surface of the metal layer 290. The thickness of the resist film 270 may be, for example, about 10 μm. Next, the resist film 370 is exposed via a mask and the exposed resist film 370 is developed to form an opening 370y in the resist film 370. The opening 370y is formed only above the via hole 210z formed through the electrode pad 250b.

Next, steps similar to the steps of FIGS. 2R through 2T are performed, and parts of the metal layer 290 not covered by the metal layer 380b are removed. At a step illustrated by FIG. 13H, a metal layer 390a is formed to cover the electrode pad 250b and the metal layer 380b. For example, the metal layers 390a may be formed by forming, on the insulating layer 240, a resist film with an opening that exposes the electrode pad 250b and the metal layer 380b, depositing and growing plating films in the opening by electroplating using the electrode pad 250b and the metal layer 380b as power feed layers, and then removing the resist film.

Then, steps similar to those in the first embodiment are repeated to produce semiconductor devices 100E as illustrated by FIG. 12. Here, via holes that have not been filled with metal layers are filled with metal layers in a manner similar to the first embodiment after a semiconductor chip including electrode pads is stacked on the semiconductor chip 210.

Semiconductor substrates and positions in the semiconductor substrates where metal pads are provided or not provided can be determined freely, and are not limited to the example of FIG. 12.

The fifth embodiment provides advantageous effects similar to those provided by the first embodiment, and also provides advantageous effects as described below. According to the fifth embodiment, different from the fourth embodiment where metal pads are provided at all positions corresponding to via holes of semiconductor chips, some of the metal pads are omitted and nonadjacent semiconductor chips including metal pads can be directly connected using via holes and metal layers. This configuration makes it possible to improve wiring design flexibility.

Sixth Embodiment

The first through fifth embodiments described above provide exemplary methods of producing a semiconductor device where semiconductor chips are stacked on a semiconductor substrate and the semiconductor chips in different layers are connected to each other to enable signal transmission. However, layers to be stacked are not necessarily semiconductor chips, and a semiconductor device may partly include a structural layer including no semiconductor chip. A sixth embodiment proves an exemplary method of producing a semiconductor device that includes a structural layer including no semiconductor chip. Here, a structural layer indicates any layer that includes a silicon substrate, a metal layer, and an insulating layer and includes no semiconductor chip.

Structure of Semiconductor Device of Sixth Embodiment

Figure 14:
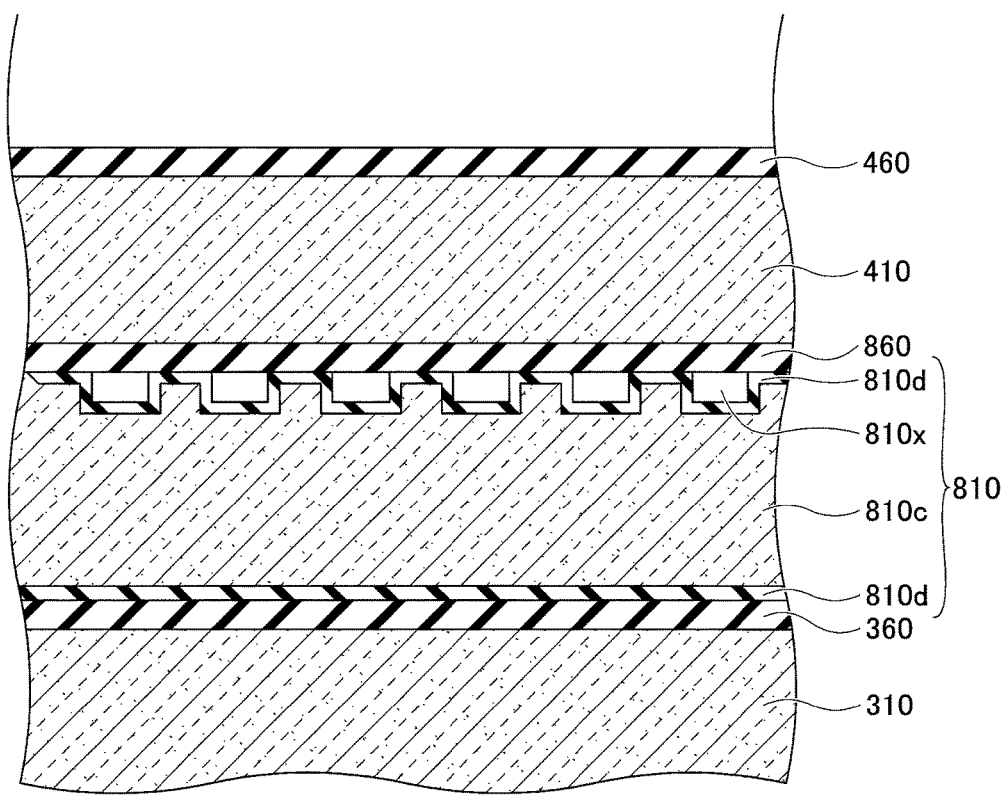
FIG. 14 is a cut-away side view of a semiconductor device according to a sixth embodiment.

First, an exemplary structure of a semiconductor device according to the sixth embodiment is described. FIG. 14 is a cut-away side view of a semiconductor device according to the sixth embodiment. A semiconductor device 100F of the sixth embodiment has a configuration similar to the semiconductor device 100 (see FIG. 1) of the first embodiment except that a structural layer 810 and a resin layer 860 are provided between the resin layer 360 and the semiconductor chip 410 of the semiconductor device 100.

In the semiconductor device 100F of FIG. 14, the structural layer 810 is stacked via the resin layer 360 on the semiconductor chip 310, and the semiconductor chip 410 is stacked via the resin layer 860 on the structural layer 810. The structural layer 810 includes a via hole (not shown) and a metal layer (not shown) for electrically connecting the semiconductor chips 310 and 410 to each other. The resin layer 860 may be composed of a material similar to that of the resin layer 160.

The structural layer 810 includes a silicon substrate 810c, an insulating film 810d, and grooves 810x. The grooves 810x are formed in a surface of the silicon substrate 810c that is closer to the semiconductor chip 410. The insulating film 810d may include, for example, $Si_3N_4$ or $SiO_2$, and is formed on the surface of the silicon substrate 810c in which the grooves 810x are formed. The silicon substrate 810c is insulated by the insulating film 810d from the adjacent semiconductor chip 410. The grooves 810x are filled with a coolant such as water or ethanol, and function as coolant passages. The shape and positions of the grooves 810*x* may be determined freely.

Thus, layers to be stacked in a semiconductor device are not necessarily semiconductor chips, and a semiconductor device may partly include a structural layer including no semiconductor chip. For example, a structural layer including a silicon substrate having coolant passages can provide a semiconductor device with a cooling function for transferring heat generated by a semiconductor chip. Such a structural layer having a cooling function is preferably disposed adjacent to a semiconductor chip including a device such as a CPU that generates much heat. A semiconductor device may include multiple structural layers including no semiconductor chip.

Process of Producing Semiconductor Device of Sixth Embodiment

Next, an exemplary process of producing a semiconductor device according to the second embodiment is described.

First, the structural layer 810 is prepared. More specifically, the silicon substrate 810*c* is processed to have a predetermined external diameter, and the grooves 810*x* are formed in one surface of the silicon substrate 810*c*. For example, the grooves 810*x* may be formed by deep reactive ion etching (DRIE). The insulating film 810*d* is formed on the surface of the silicon substrate 810*c* in which the grooves 810*x* are formed. For example, the insulating film 810*d* may be formed by plasma CVD. Through the above steps, the structural layer 810 is prepared.

Next, the semiconductor chip 110, the semiconductor chip 310, the resin layer 360, the structural layer 810, the resin layer 860, and the semiconductor chip 410 are stacked in sequence and via holes and metal layers are formed to produce the semiconductor device 100F.

An exemplary method of producing a semiconductor device that includes a structural layer including a silicon substrate that includes no semiconductor chip is described above. However, a structural layer may include, instead of or in addition to a silicon substrate including no semiconductor chip, a metal layer including, for example, Cu and/or an insulating layer including, for example, epoxy resin. Also, a structural layer may include a MEMS. Examples of MEMS may include a pressure sensor and a acceleration sensor.

The sixth embodiment provides advantageous effects similar to those provided by the first embodiment, and also provides advantageous effects as described below. By providing a structural layer including no semiconductor chip in a semiconductor device, it is possible to provide, for example, a cooling function for transferring heat generated by a semiconductor chip.

Seventh Embodiment

Figure 15A:
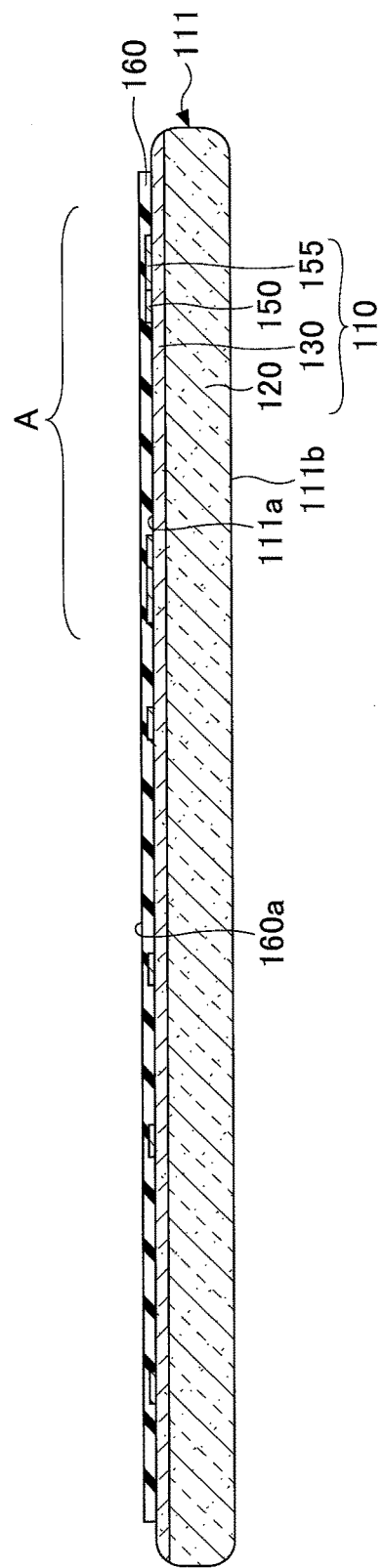
FIG. 15A is a drawing (1) used to describe an exemplary process of producing a semiconductor device according to a seventh embodiment.
Figure 15B:
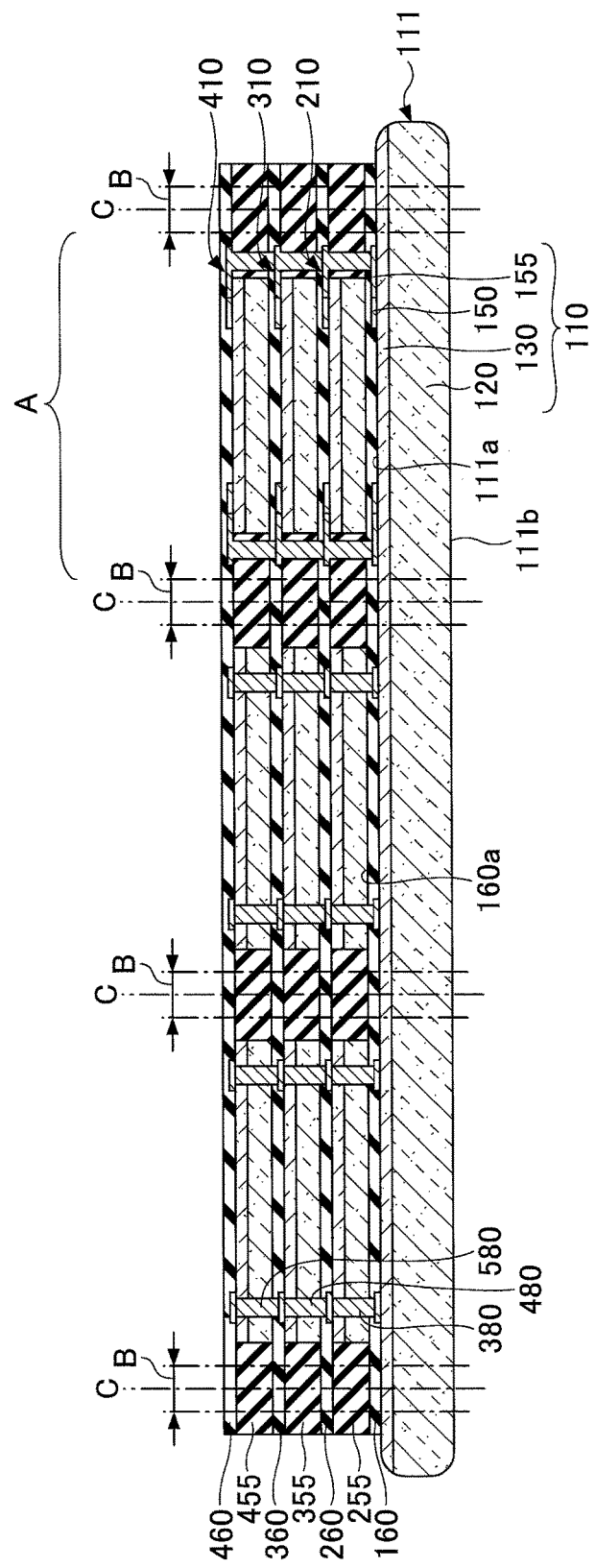
FIG. 15B is a drawing (2) used to describe an exemplary process of producing a semiconductor device according to the seventh embodiment.

A seventh embodiment provides an exemplary method of generating the semiconductor device 100 of FIG. 1 and the semiconductor device 100B of FIG. 7 at the same time. In the seventh embodiment, descriptions of components already described in the above embodiments are omitted. FIGS. 15A through 15B are drawings used to describe an exemplary process of producing semiconductor devices according to the seventh embodiment.

First, steps similar to the steps of FIGS. 2A through 2E of the first embodiment are performed. At a step illustrated by FIG. 15A, a semiconductor substrate 111 is prepared in a manner similar to the step of FIG. 2F, and a resin layer 160 is formed on a main surface 111*a* of the semiconductor substrate 111. As illustrated by FIG. 15A, a wire 155 (a part that is to be electrically connected to a metal layer 380 formed in a resin layer as illustrated by FIG. 15B), which is electrically connected to the electrode pad 150, is formed in a region A.

Next, steps similar to the steps of FIGS. 2G through 2I of the first embodiment are performed. Then, for the region A, steps similar to the steps of FIGS. 6B through 6G of the second embodiment are performed. On the other hand, for regions other than the region A, steps similar to the steps of FIGS. 2J through 2V of the first embodiment are performed. As a result, a structure illustrated by FIG. 15B is produced. In the region A of the structure, electrodes of stacked semiconductor chips are electrically connected to each other through connecting holes (via holes) formed through resin layers. In the regions other than the region A of the structure, electrodes of stacked semiconductor chips are electrically connected to each other through connecting holes (via holes) formed through the semiconductor chips.

Then, an external connection terminal 910 is formed using a known method as in the step of FIG. 2W, and the resulting structure is cut by, for example, a dicing blade at positions C to produce a semiconductor device 100B (corresponding to the region A) as illustrated by FIG. 7 and semiconductor devices 100 (corresponding to the other regions) as illustrated by FIG. 1.

The seventh embodiment provides advantageous effects similar to those provided by the first embodiment, and also provides advantageous effects as described below. The seventh embodiment makes it possible to produce at the same time a semiconductor device where electrodes of stacked semiconductor chips are electrically connected to each other through connecting holes (via holes) formed through resin layers, and a semiconductor device where electrodes of stacked semiconductor chips are electrically connected to each other through connecting holes (via holes) formed through the semiconductor chips. Accordingly, the seventh embodiment makes it possible to improve the efficiency of a production process.

Eighth Embodiment

According to an eighth embodiment, semiconductor substrates (wafers), on each of which multiple semiconductor chips are formed, are stacked, and the resulting structure is diced to produce multiple stacked structures in each of which multiple semiconductor chips are stacked (i.e., wafer on wafer (WOW) technology). Then, the stacked structures produced by the WOW technology are further stacked on another semiconductor substrate (wafer), and the resulting structure is diced again into separate semiconductor devices. In the eighth embodiment, descriptions of components already described in the above embodiments are omitted.

Structure of Semiconductor Device of Eighth Embodiment

First, an exemplary structure of a semiconductor device according to the eighth embodiment is described. FIG. 16 is a cut-away side view of a semiconductor device according to the eighth embodiment. Referring to FIG. 16, a semiconductor device 100G of the eighth embodiment has a structure where a stacked structure 600 is stacked via a resin layer 160 on a semiconductor chip 110. The side surfaces of the stacked structure 600 are sealed with resin layers 655 that are sealing insulating layers.

Electrode pads 450 of a semiconductor chip 410 are electrically connected to wires 155 of the semiconductor chip 110 via metal layers 680 formed on the resin layers 655 and in via holes 600y passing through the resin layers 655. A solder resist layer 460, which is an insulating layer and has openings 460x, is formed on the main surface of the semiconductor chip 410. External connection terminals 910 are formed on the electrode pads 450 exposed in the openings 460x.

Process of Producing Semiconductor Device of Eighth Embodiment

Next, an exemplary process of producing a semiconductor device according to the eighth embodiment is described. FIGS. 17A through 17L are drawings used to describe an exemplary process of producing a semiconductor device according to the eighth embodiment.

Figure 17A:
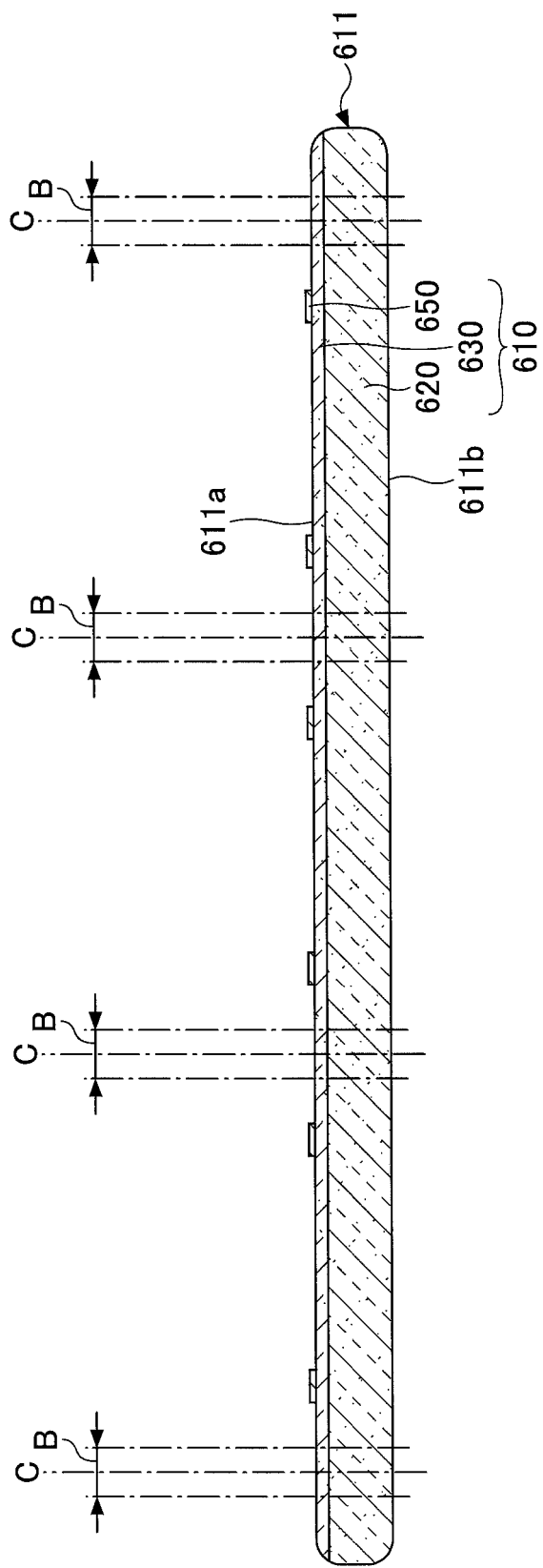
FIG. 17A is a drawing (1) used to describe an exemplary process of producing a semiconductor device according to the eighth embodiment.

At a step illustrated by FIG. 17A, a semiconductor substrate 611 having a structure similar to that of the semiconductor substrate 111 of FIG. 2F is prepared. The semiconductor substrate 611 includes multiple semiconductor chips 610. Each of the semiconductor chips 610 includes a main substrate 620, a semiconductor integrated circuit 630, and electrode pads 650. In the eighth embodiment, it is assumed that a silicon wafer with a diameter of 8 inches (about 200 mm) is used as the semiconductor substrate 611.

Figure 17B:
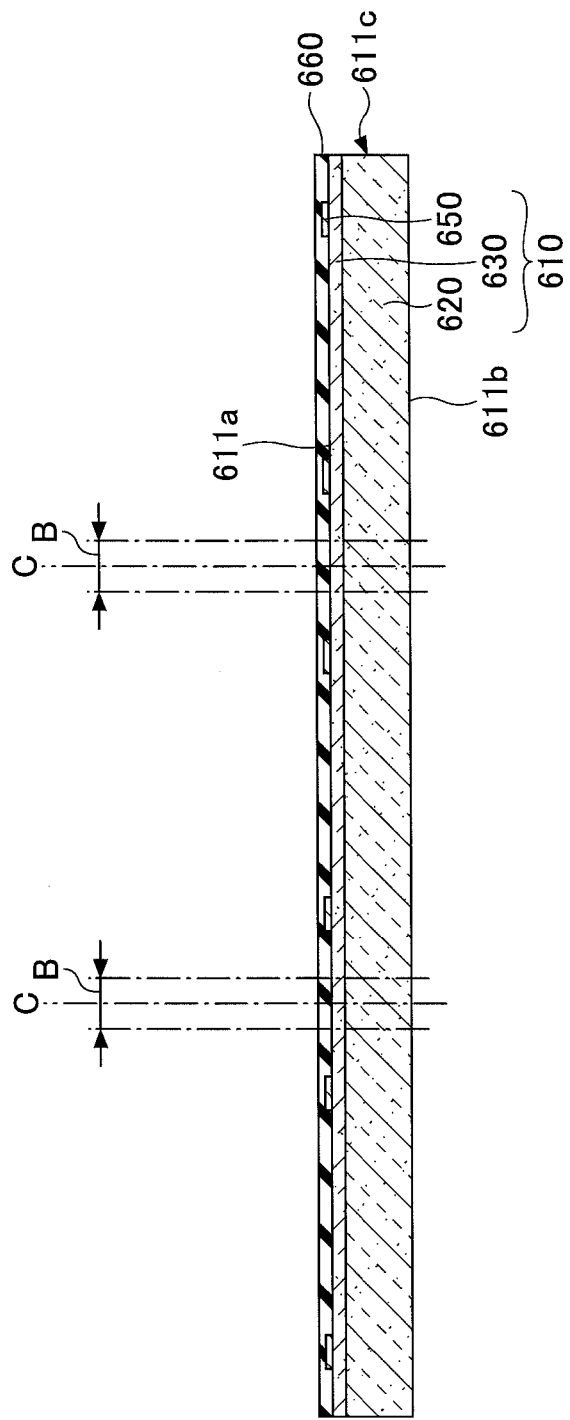
FIG. 17B is a drawing (2) used to describe an exemplary process of producing a semiconductor device according to the eighth embodiment.

At a step illustrated by FIG. 17B, the peripheral part of the semiconductor substrate 611 of FIG. 17A is removed, and a resin layer 660 is formed on a main surface 611a of the semiconductor substrate 611. The semiconductor substrate 611 the peripheral part of which has been removed is referred to as a semiconductor substrate 611c. The peripheral part of the semiconductor substrate 611 may be removed, for example, by grinding the peripheral part using a grinder such that the semiconductor substrate 611c has a circular shape in plan view. For this step, dry polishing or wet etching may be used together with grinding.

Here, dry polishing is a process where a surface is ground (or polished) using a polishing cloth formed by compacting fibers impregnated with, for example, silica. Wet etching is a process where etching is performed by supplying, for example, fluoric nitric acid while rotating the semiconductor substrate 611 with a spinner. When the semiconductor substrate 611c has a circular shape in plan view, the diameter of the semiconductor substrate 611c may be, for example, 193.0±0.1 mm). In this case, the diameter "8 inches (about 200 mm)" of the semiconductor substrate 611 has been reduced to the diameter "193.0±0.1 mm" of the semiconductor substrate 611c.

At a step illustrated by FIG. 17C, a semiconductor substrate 211 having a structure similar to that of the semiconductor substrate 611 of FIG. 17A is prepared. The semiconductor substrate 211 includes multiple semiconductor chips 210. Each of the semiconductor chips 210 includes a main substrate 220, a semiconductor integrated circuit 230, and electrode pads 250.

A recess 211x is formed in a surface 211b (on which the electrode pads 250 are not formed) of the semiconductor substrate 211. The recess 211x is formed such that the thickness of a central part of the semiconductor substrate 211 is reduced and the thickness of a peripheral part of the semiconductor substrate 211 is unchanged. For example, the recess 211x may be formed by grinding the surface 211b of the semiconductor substrate 211 using a grinder. For this step, dry polishing or wet etching may be used together with grinding.

The recess 211x has, for example, a circular shape in plan view, but may have any other shape. When the recess 211x has a circular shape in plan view, the diameter of the recess 211x may be, for example, 195.2±0.1 mm. The thickness of the thinned part (i.e., the central part) of the semiconductor substrate 211 is, for example, about 3 μm to about 100 μm. Preferably, the thickness of the thinned part of the semiconductor substrate 211 is set at about 10 μm to about 50 μm to prevent a damage caused by mechanical vibration and to reduce stress applied to semiconductor chips. The side surfaces of the recess 211x are not necessarily vertical to the bottom surface.

By forming the recess 211x in the surface 211b of the semiconductor substrate 211 such that the thickness of the peripheral part of the semiconductor substrate 211 is unchanged and the thickness of the central part is reduced, the semiconductor substrate 211 maintains a sufficient strength even after the recess 211x is formed. This eliminates the need to use a support for supporting the semiconductor substrate 211, and makes it possible to treat the semiconductor substrate 211 whose thickness has been reduced by forming the recess 211x in a manner similar to treating the semiconductor substrate 211 whose thickness has not been reduced. This in turn eliminates the need to add steps for bonding and removing a support to and from a semiconductor substrate which are different from normal wafer processing for a semiconductor device, and thereby makes it possible to improve productivity.

Figure 17D:
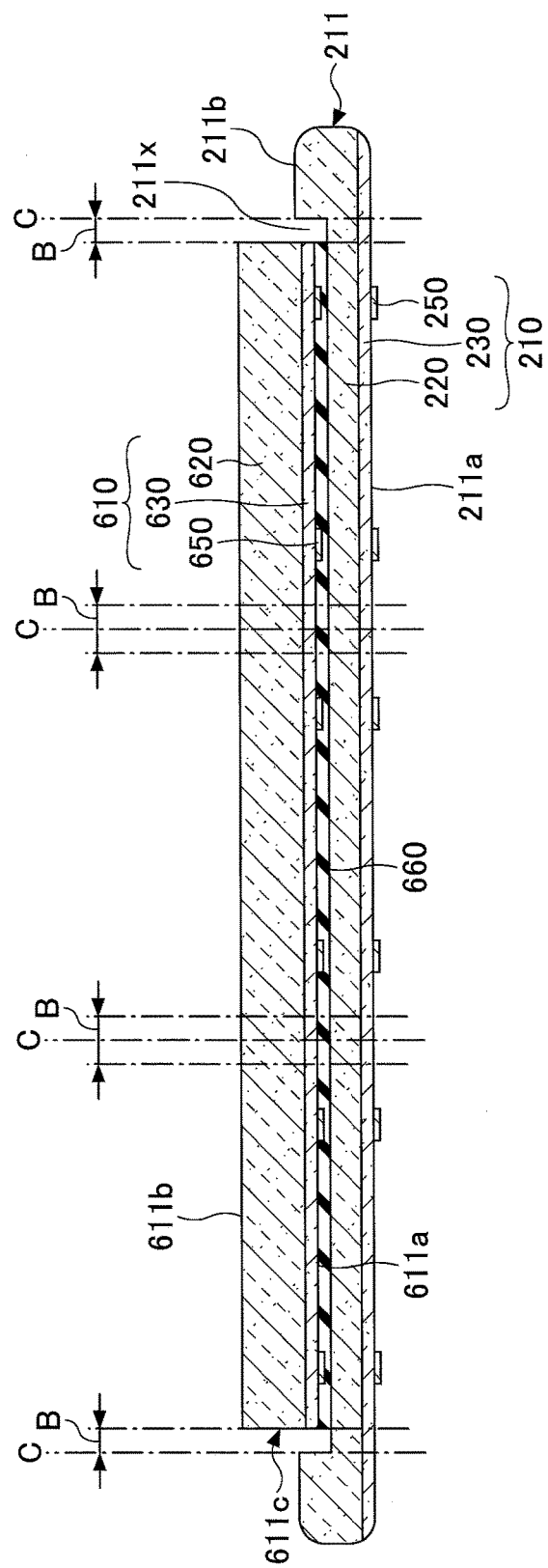
FIG. 17D is a drawing (4) used to describe an exemplary process of producing a semiconductor device according to the eighth embodiment.

At a step illustrated by FIG. 17D, the semiconductor substrate 611c is bonded to the recess 211x of the semiconductor substrate 211. First, the semiconductor substrate 611c is placed such that the resin layer 660 formed on the surface 611a of the semiconductor substrate 611c contacts the bottom surface of the recess 211x of the semiconductor substrate 211. Here, alignment marks are formed in advance in scribe regions B of the semiconductor substrate 611c and the semiconductor substrate 211 to accurately align them with each other. The semiconductor substrate 611c may be placed in the recess 211x based on the alignment marks according to a known method. The alignment accuracy is, for example, less than or equal to 2 μm.

A gap is formed between the side surface of the recess 211x of the semiconductor substrate 211 and the side surface of the semiconductor substrate 611c. When both of the recess 211x of the semiconductor substrate 211 and the semiconductor substrate 611c have a circular shape in plan view, the gap has a ring shape in plan view. Next, the structure illustrated by FIG. 17D is heated at, for example, 250° C., and the surface 611b of the semiconductor substrate 611c is pressed to bond the resin layer 660 formed on the surface 611a of the semiconductor substrate 611c to the bottom surface of the recess 211x of the semiconductor substrate 211. As a result, the resin layer 660 sets, and the semiconductor substrate 611c is bonded to the recess 211x of the semiconductor substrate 211. Although a heating temperature greater than or equal to 300° C. can be used, the heating temperature is preferably less than or equal to 200° C. When a high temperature of, for example, 300° C. is used, stress is generated due to variation in thermal expansion. As the number of stacked layers increases, the stress may cause the layers to come apart and cause cracks in semiconductor substrates.

Figure 17E:
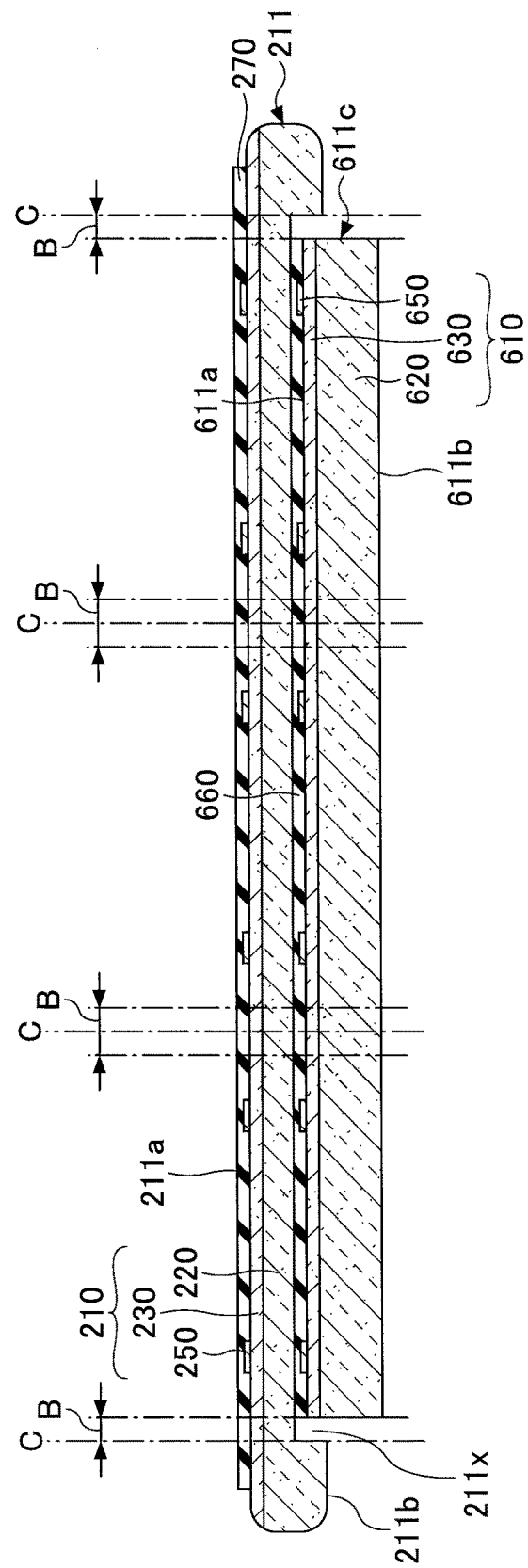
FIG. 17E is a drawing (5) used to describe an exemplary process of producing a semiconductor device according to the eighth embodiment.

At a step illustrated by FIG. 17E, a photosensitive resist film 270 is formed to cover a surface 211a of the semiconductor substrate 211. The resist film 270 may be formed, for example, by applying a liquid resist to the surface 211a of the semiconductor substrate 211. The thickness of the resist film 270 may be, for example, about 10 μm.

Figure 17F:
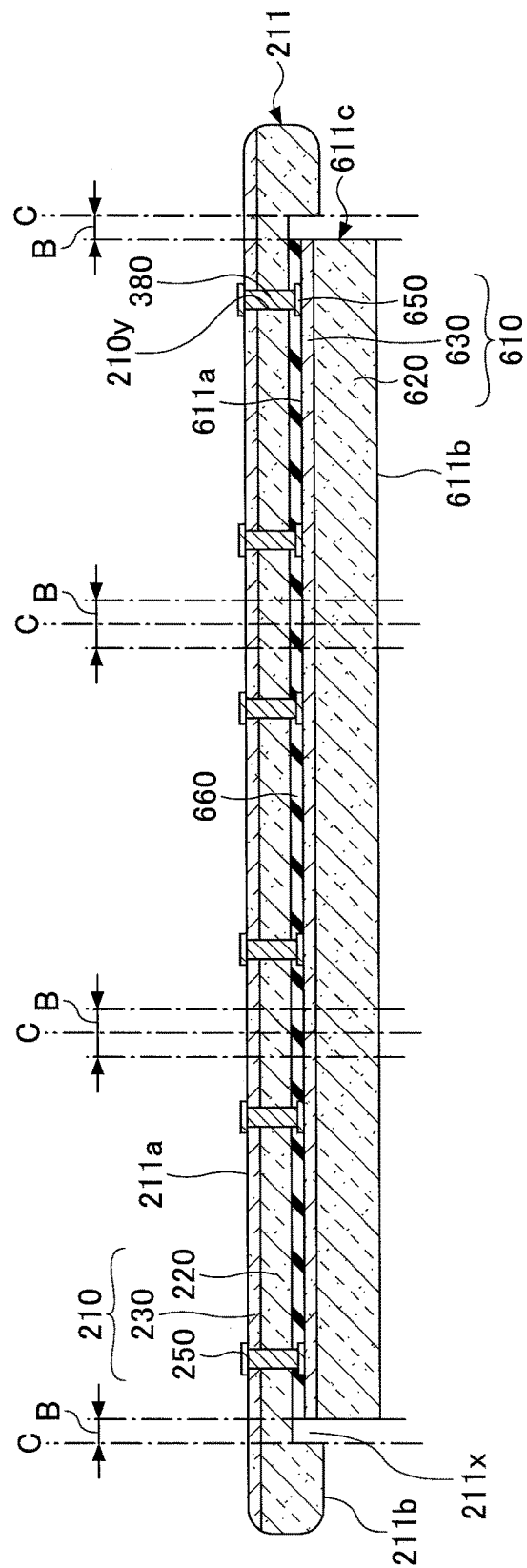
FIG. 17F is a drawing (6) used to describe an exemplary process of producing a semiconductor device according to the eighth embodiment.

Next, referring to FIG. 17F, steps similar to the steps of FIGS. 2J through 2U of the first embodiment are performed to electrically connect the electrode pads 250 of each semiconductor chip 210 to the electrode pads 650 of the corresponding semiconductor chip 610 via the metal layers 380 formed in the via holes 210y.

Figure 17G:
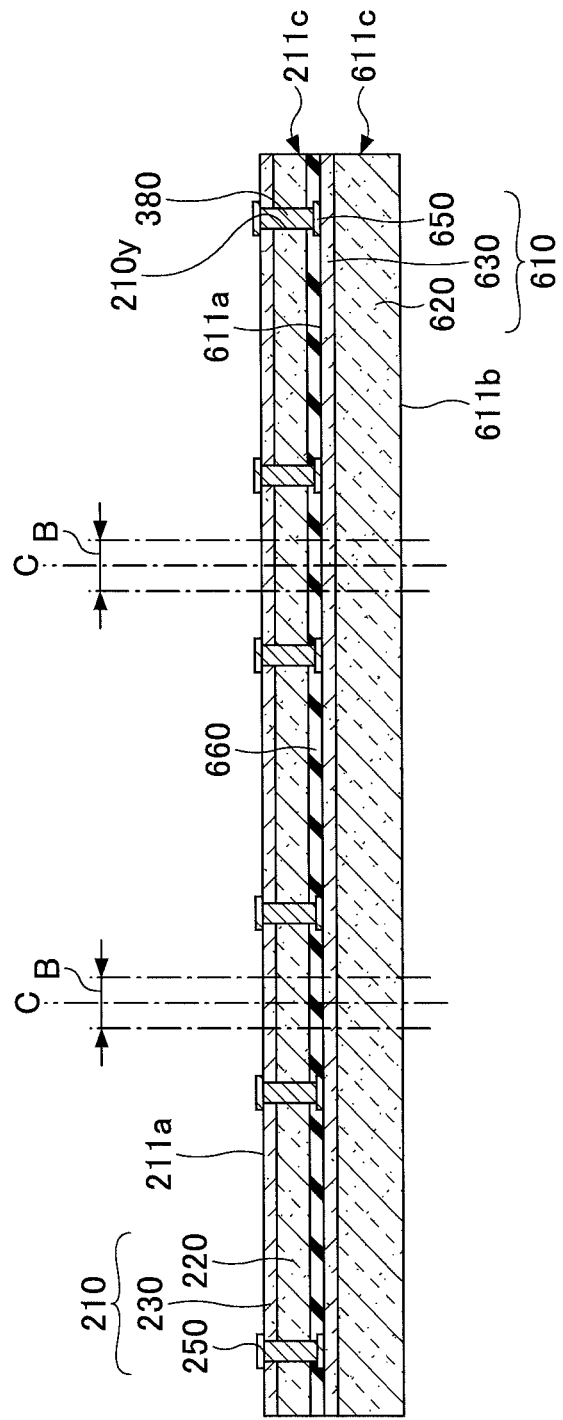
FIG. 17G is a drawing (7) used to describe an exemplary process of producing a semiconductor device according to the eighth embodiment.

At a step illustrated by FIG. 17G, a peripheral part of the semiconductor substrate 211 is removed. The semiconductor substrate 211 the peripheral part of which has been removed is referred to as a semiconductor substrate 211c. The peripheral part of the semiconductor substrate 211 may be removed, for example, by grinding the peripheral part using a grinder such that the semiconductor substrate 211c has a circular shape in plan view. For this step, dry polishing or wet etching may be used together with grinding. When the semiconductor substrate 211c has a circular shape in plan view, the diameter of the semiconductor substrate 211c may be, for example, 193.0±0.1 mm that is the same as the diameter of the semiconductor substrate 611c.

At a step illustrated by FIG. 17H, after a resin layer 260 is formed on the surface 211a of the semiconductor substrate 211c illustrated in FIG. 17G, steps similar to the steps of FIGS. 17C through 17G are repeated to stack multiple semiconductor substrates on the semiconductor substrate 211 and connect the semiconductor substrates to each other. Then, the resulting structure is cut at cutting positions C with, for example, a dicing blade to form multiple stacked structures 600. The above steps constitute a WOW process.

Figure 17I:
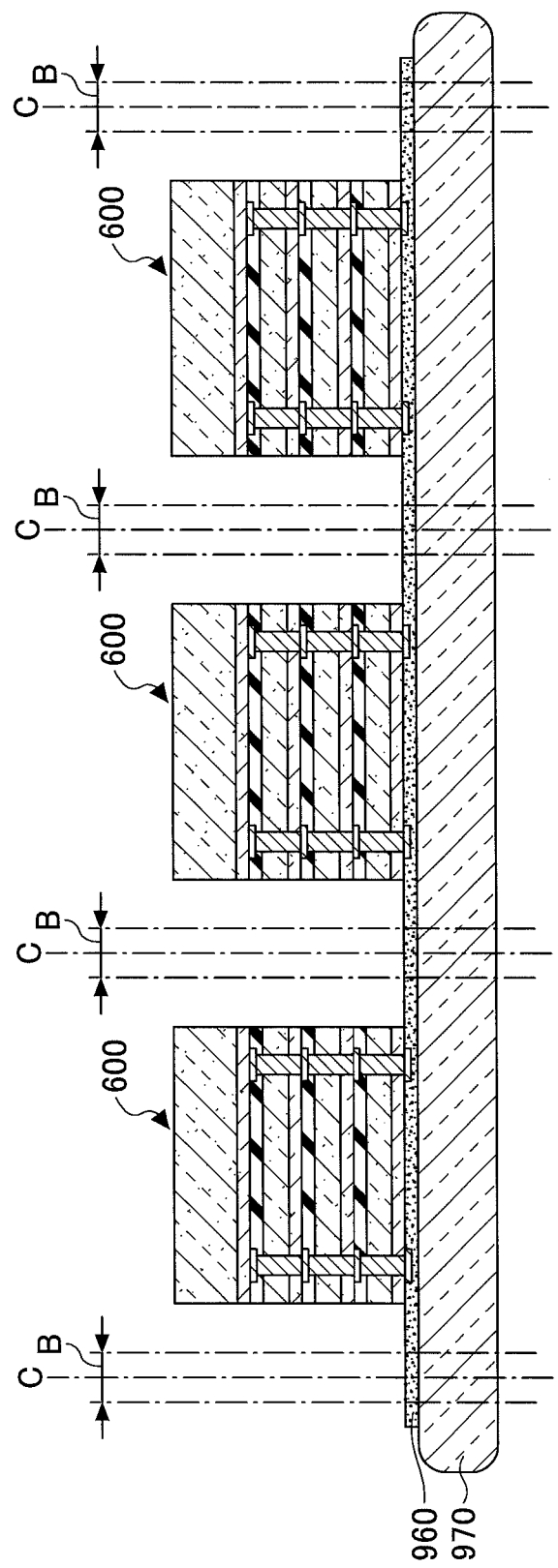
FIG. 17I is a drawing (9) used to describe an exemplary process of producing a semiconductor device according to the eighth embodiment.

At a step illustrated by FIG. 17I, a support 970 is prepared and an adhesive layer 960 is formed on one surface of the support 970 in a manner similar to the step of FIG. 2B of the first embodiment. Next, in a manner similar to the step of FIG. 2C of the first embodiment, the stacked structures 600 are (temporarily) bonded, with their faces down, via the adhesive layer 960 onto the surface of the support 970. The stacked structures 600 are bonded at positions corresponding to a device layout of a semiconductor substrate 111 that is stacked at a step of FIG. 17K described later.

Figure 17J:
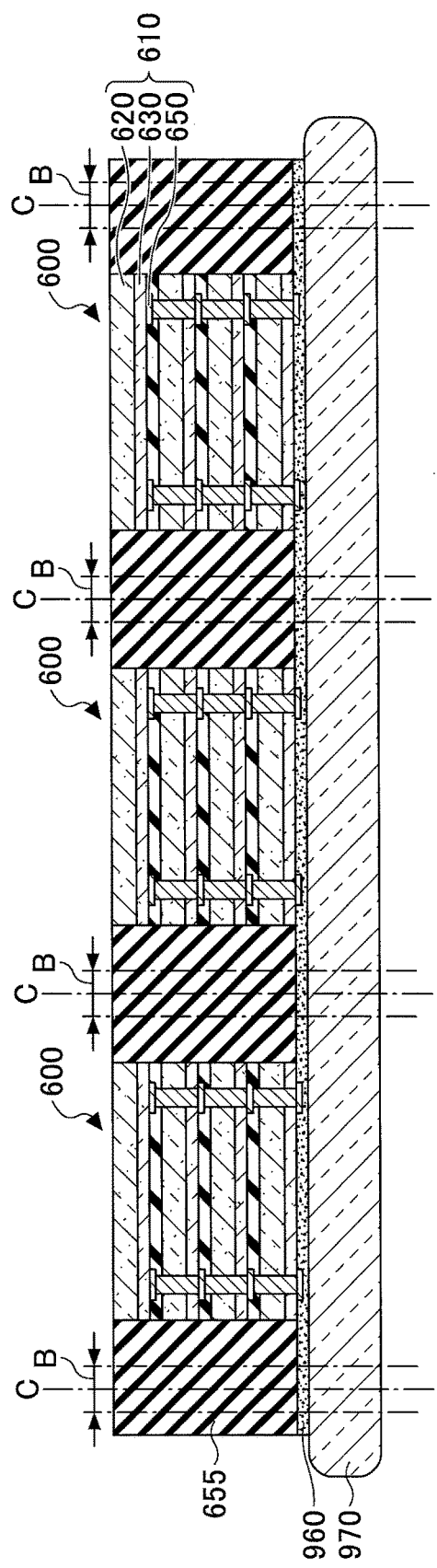
FIG. 17J is a drawing (10) used to describe an exemplary process of producing a semiconductor device according to the eighth embodiment.

At a step illustrated by FIG. 17J, a resin layer 655 is formed on the adhesive layer 960 in a manner similar to the step of FIG. 2D of the first embodiment to seal at least parts of the side surfaces of the stacked structures 600. Next, in a manner similar to the step of FIG. 2E of the first embodiment, unnecessary parts of the resin layer 655 and a part of the main substrate 620 at the back of each semiconductor chip 600 are ground by, for example, a grinder to reduce the thickness of each semiconductor chip 610 (thinning step. As a result of the thinning step, the thickness of each semiconductor chip 610 is reduced and the side surfaces of the semiconductor chip 610 with a reduced thickness are sealed by the resin layer 655. For the thinning step, dry polishing or wet etching may be used together with grinding. The thickness of each of the semiconductor chips 610 after the thinning step is, for example, about 1 μm to about 100 μm.

Figure 17K:
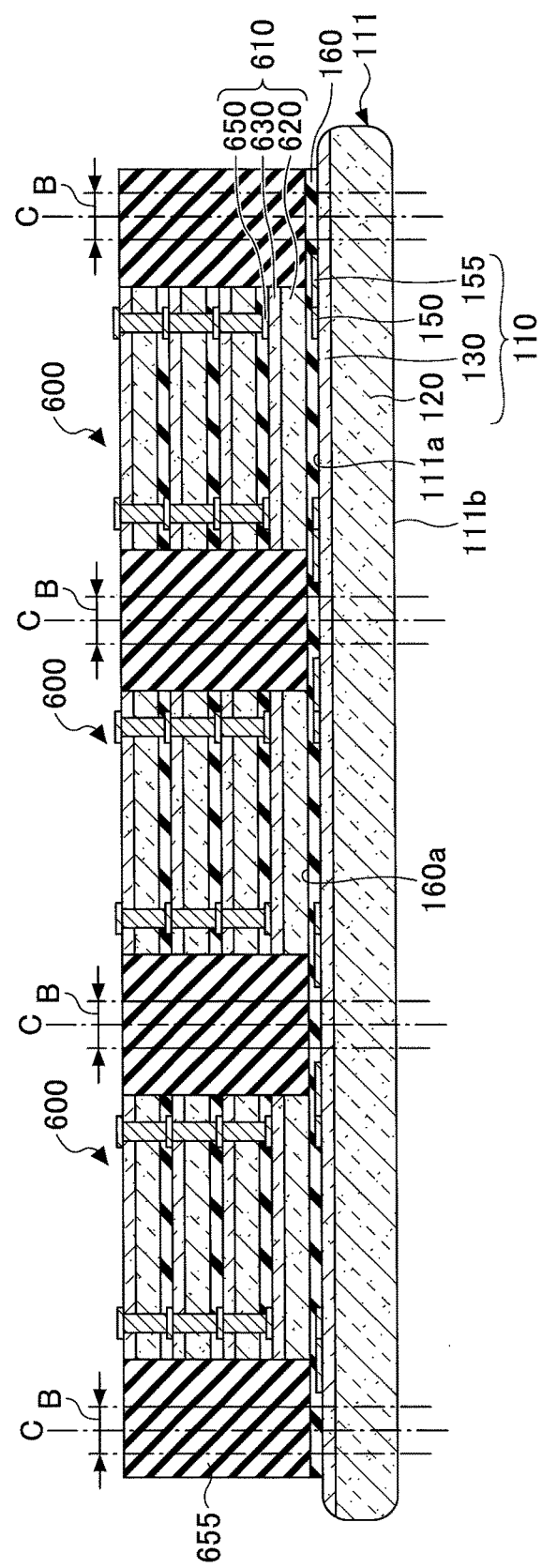
FIG. 17K is a drawing (11) used to describe an exemplary process of producing a semiconductor device according to the eighth embodiment.

At a step illustrated by FIG. 17K, a semiconductor substrate 111 is prepared and a resin layer 160 is formed on a main surface 111a of the semiconductor substrate 111 in a manner similar to the step of FIG. 2F of the first embodiment. Next, in a manner similar to the step of FIG. 2G of the first embodiment, the structure illustrated by FIG. 17J is turned upside down and bonded via the resin layer 160 onto the main surface 111a of the semiconductor substrate 111. Then, in a manner similar to the step of FIG. 2H of the first embodiment, the adhesive layer 960 and the support 970 are removed.

Figure 17L:
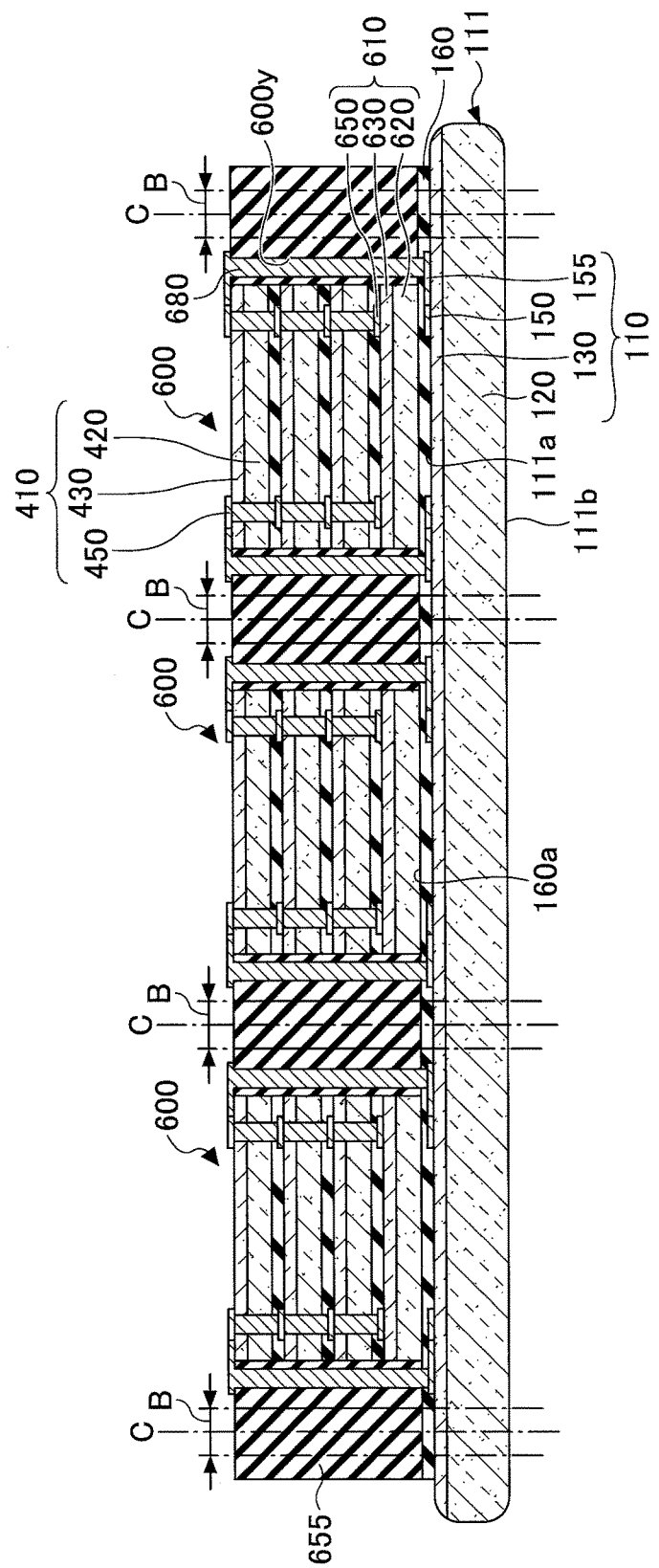
FIG. 17L is a drawing (12) used to describe an exemplary process of producing a semiconductor device according to the eighth embodiment.

At a step illustrated by FIG. 17L, steps similar to the steps of FIGS. 6B through 6G of the second embodiment are performed to electrically connect the electrode pads 450 of each semiconductor chip 410 to the wires 155 of the corresponding semiconductor chip 110 via the metal layers 680 formed on the resin layers 655 and in the via holes 600y passing through the resin layers 655.

After the step of FIG. 17L, external connection terminals 910 are formed in a manner similar to the step of FIG. 2W according to a known method. Then, the structure illustrated by FIG. 17L is cut at cutting positions C by, for example, a dicing blade to produce separate semiconductor devices 100G as illustrated by FIG. 16.

Figure 18:
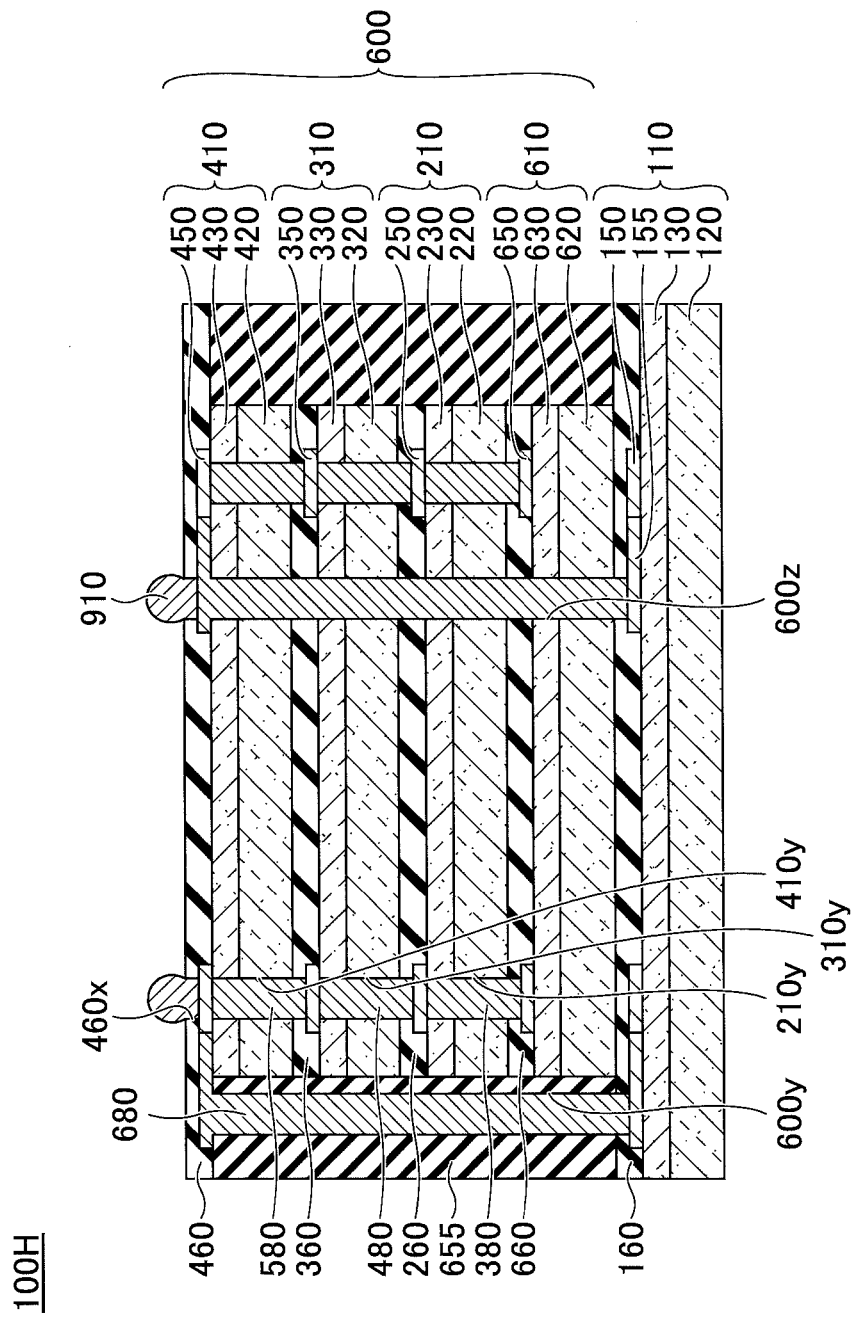
FIG. 18 is a cut-away side view of a semiconductor device according to a variation of the eighth embodiment.

The semiconductor device 100G of the eighth embodiment illustrated by FIG. 16 may be changed as illustrated by FIG. 18. FIG. 18 is a cut-away side view of a semiconductor device according to a variation of the eighth embodiment. As illustrated by FIG. 18, a semiconductor device 100H includes a via hole 600z that passes through the stacked structure 600.

In FIG. 18, one of the electrode pads 450 of the semiconductor chip 410 is electrically connected to the wire 155 of the semiconductor chip 110 via the metal layer 680 formed on the resin layer 655 and in the via hole 600y passing through the resin layer 655, and another one of the electrode pads 450 is electrically connected to the wire 155 of the semiconductor chip 110 via the metal layer 680 formed in the via hole 600z passing through the stacked structure 600.

Thus, as illustrated by FIGS. 16 and 18, a via hole may be formed to pass through either one of the resin layer 655 and the stacked structure 600. Here, for example, when the thickness of each of semiconductor chips constituting the stacked structure 600 is about 10 μm, the thickness of the stacked structure 600 becomes about 40 μm. Unlike a via hole formed through a structure with a thickness of about several hundreds μm, the via hole 600z passing through the stacked structure 600 with a thickness of about 40 μm can be easily formed. For example, the via hole 600z is formed after the step of FIG. 17K.

As still another configuration, only the via hole 600z passing through the stacked structure 600 may be formed without forming the via hole 600y passing through the resin layer 655.

The eighth embodiment provides advantageous effects similar to those provided by the first embodiment, and also provides advantageous effects as described below. In the process of forming the stacked structure 600 according to the eighth embodiment, semiconductor substrates are bonded together such that a surface on which a semiconductor integrated circuit is formed faces a surface on which no semiconductor integrated circuit is formed. This makes it possible to stack three or more semiconductor substrates by simply repeating the same process. Thus, the eighth embodiment makes it possible to improve productivity and reduce production costs. Also according to the eighth embodiment, via holes are formed only in thinned parts of semiconductor substrates and therefore it is not necessary to form deep via holes. This makes it possible to reduce the time necessary to form via holes and fill the via holes with metal and reduce the amount of necessary material. Thus, the eighth embodiment makes it possible to prevent the increase in the productions costs of semiconductor devices. Also according to the eighth embodiment, via holes are formed after reducing the thickness of semiconductor substrates to a considerable extent. This in turn makes it possible to reduce the degree of variation in the diameters of the ends of via holes even when the sizes and the density of the via holes vary, and thereby makes it possible to reduce the variation in electric resistance and improve the reliability.

In the process of forming the stacked structure 600, instead of forming the recess 211x, the thickness of the entire surface 211b of the semiconductor substrate 211 may be reduced. In this case, the stacked structure 600 may be formed as described below.

First, the semiconductor substrate 611 is prepared, and the resin layer 660 is formed on the surface 611a of the semiconductor substrate 611 without removing the peripheral part of the semiconductor substrate 611. Next, the semiconductor substrate 211 is prepared, and a support is bonded to the surface 211a of the semiconductor substrate 211. For example, the support may be implemented by a glass substrate. Next, the thickness of the entire surface 211b of the semiconductor substrate 211 is reduced. The support is used to support the semiconductor substrate 211 whose strength is reduced as a result of reducing the thickness.

First, the semiconductor substrate 611 is placed such that the resin layer 660 formed on the surface 611a of the semiconductor substrate 611 contacts the surface 211b of the semiconductor substrate 211. Here, alignment marks are formed in advance in the scribe regions B of the semiconductor substrate 611 and the thinned semiconductor substrate 211 to accurately align them with each other. The semiconductor substrate 611 may be placed on the semiconductor substrate 211 based on the alignment marks according to a known method. The alignment accuracy is, for example, less than or equal to 2 μm.

Next, the semiconductor substrate 611 and the semiconductor substrate 211 are heated at, for example, 250° C., and the surface 611b of the semiconductor substrate 611 is pressed to bond the resin layer 660 formed on the surface 611a of the semiconductor substrate 611 to the surface 211b of the semiconductor substrate 211. As a result, the resin layer 660 sets, and the semiconductor substrate 611 is bonded to the surface 211b of the semiconductor substrate 211. Although a heating temperature greater than or equal to 300° C. can be used, the heating temperature is preferably less than or equal to 200° C. When a high temperature of, for example, 300° C. is used stress is generated due to variation in thermal expansion. As the number of stacked layers increases, the stress may cause the layers to come apart and cause cracks in semiconductor substrates. After the above steps, the support is removed, a photosensitive resist film 270 is formed to cover the surface 211a of the semiconductor substrate 211, and the rest of steps similar to those of the above embodiments are performed.

Ninth Embodiment

In a ninth embodiment, exemplary arrangements of electrode pads and via holes in semiconductor chips are discussed. In the ninth embodiment, descriptions of components already described in the above embodiments are omitted.

Figure 19:
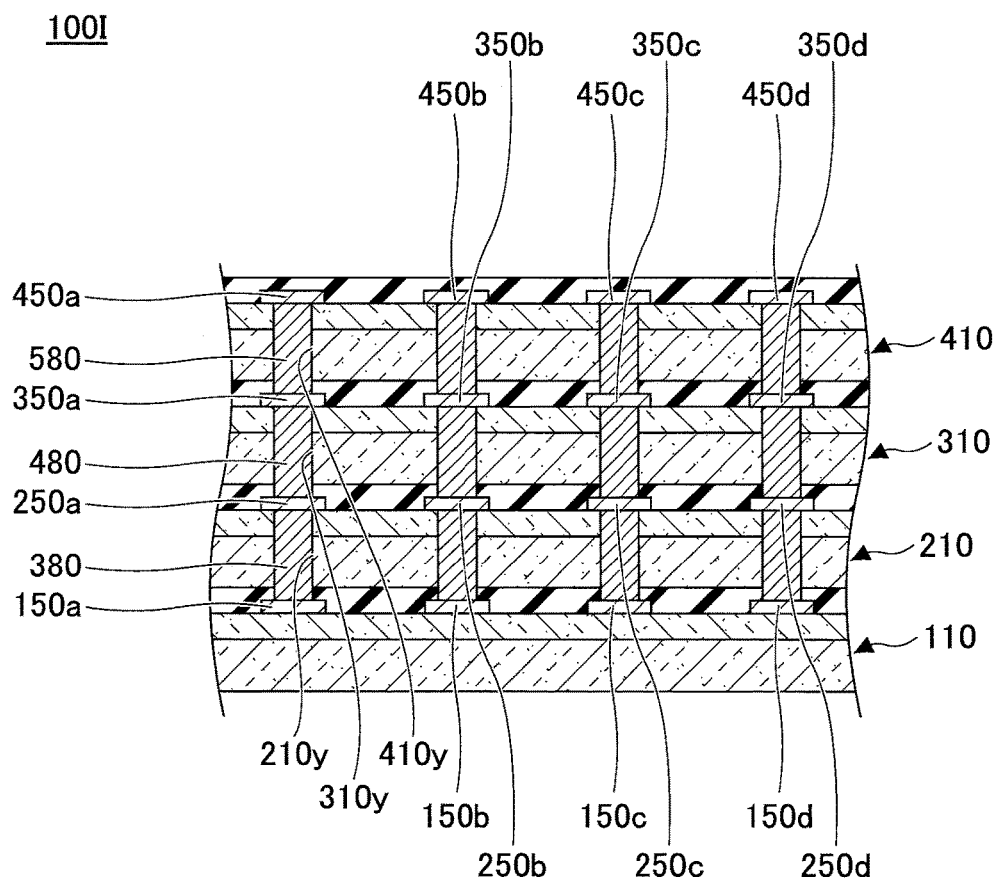
FIG. 19 is a partial cut-away side view of a semiconductor device according to a ninth embodiment.
Figure 20:
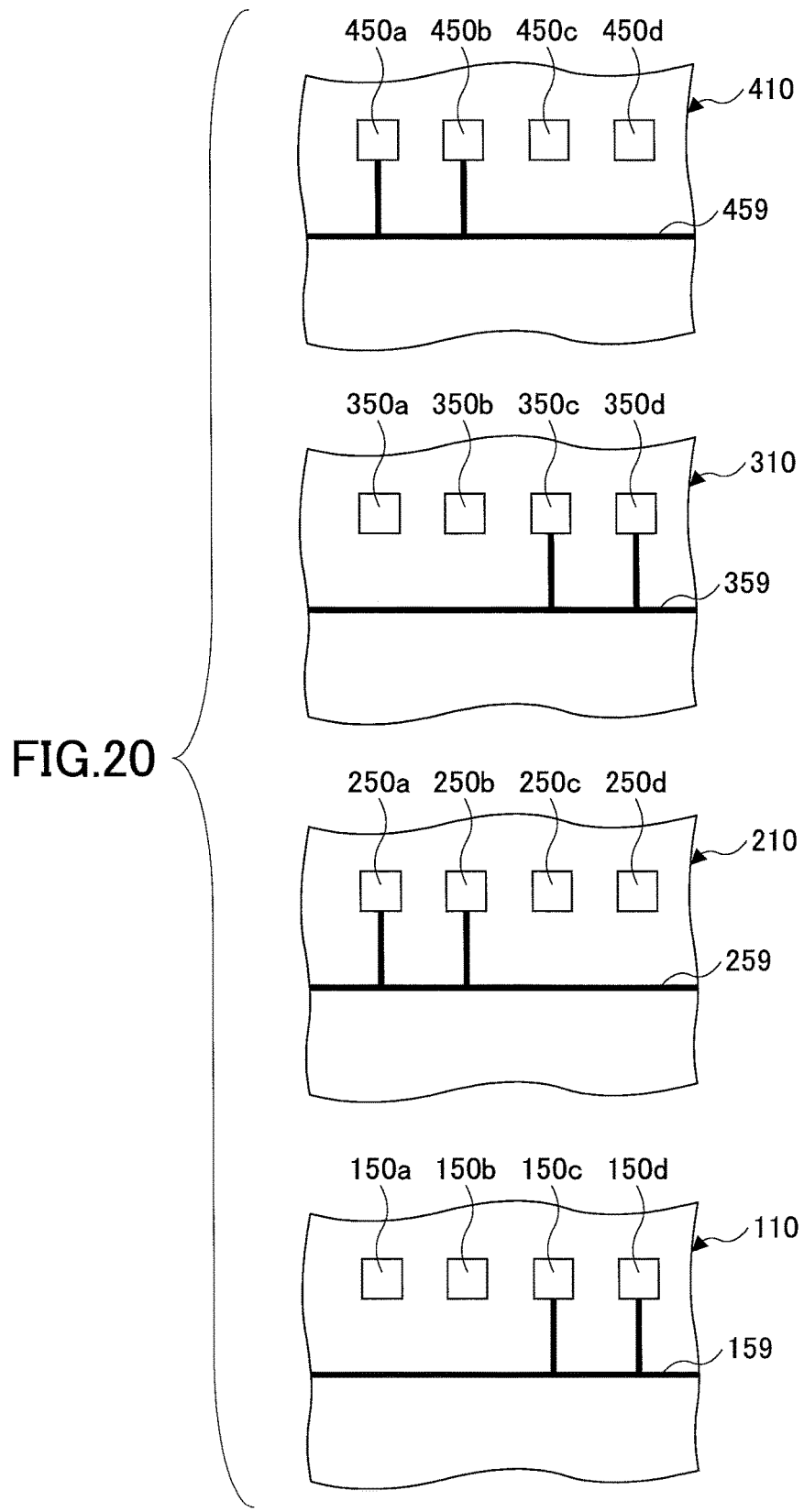
FIG. 20 is a partial plan view of semiconductor chips constituting a semiconductor device according to the ninth embodiment.

FIG. 19 is a cut-away side view of a semiconductor device according to the ninth embodiment. FIG. 20 is a partial plan view of semiconductor chips constituting a semiconductor device according to the ninth embodiment.

Referring to FIGS. 19 and 20, in each semiconductor chip constituting a semiconductor device 100I, multiple electrode pads corresponding to the number of semiconductor chips to be stacked are assigned to each wire to be connected to another semiconductor chip in a different layer. In the semiconductor device 100I, four semiconductor chips 110, 210, 310, and 410 are stacked on each other. Therefore, in each of the semiconductor chips 110, 210, 310, and 410, four electrode pads are assigned to each wire to be connected to a semiconductor chip in a different layer. For example, assuming that each of the semiconductor chips 110, 210, 310, and 410 includes 100 wires to be connected to semiconductor chips in different layers, the number of electrode pads formed in each of the semiconductor chips 110, 210, 310, and 410 becomes 400.

In the example of FIG. 20, four electrode pads 150a, 150b, 150c, and 150d are assigned to a wire 159 of the semiconductor chip 110. Similarly, four electrode pads 250a, 250b, 250c, and 250d are assigned to a wire 259 of the semiconductor chip 210. Also, four electrode pads 350a, 350b, 350c, and 350d are assigned to a wire 359 of the semiconductor chip 310. Further, four electrode pads 450a, 450b, 450c, and 450d are assigned to a wire 459 of the semiconductor chip 410.

Here, however, all electrode pads assigned to a wire are not necessarily connected to the wire, i.e., only necessary electrode pads are connected to the wire. In other words, some of the electrode pads are not connected to any wire. In the example of FIG. 20, the wire 159 of the semiconductor chip 110 is connected to the electrode pads 150c and 150d. The wire 259 of the semiconductor chip 210 is connected to the electrode pads 250a and 250b. The wire 359 of the semiconductor chip 310 is connected to the electrode pads 350c and 350d. The wire 459 of the semiconductor chip 410 is connected to the electrode pads 450a and 450b.

Electrode pads placed at the corresponding positions in adjacent layers are connected to each other via metal layers formed in via holes. Accordingly, in the example of FIG. 20, the wire 159 of the semiconductor chip 110 and the wire 359 of the semiconductor chip 310 are connected to each other, and the wire 259 of the semiconductor chip 210 and the wire 459 of the semiconductor chip 410 are connected to each other. According to the ninth embodiment, via holes and metal layers are formed even for electrode pads not connected to wires. Compared with a configuration where via holes and metal layers are formed only for specific electrode pads, the configuration of the ninth embodiment makes it possible to simplify a production process and improve the radiation performance.

As described above, according to the ninth embodiment, multiple electrode pads corresponding to the number of semiconductor chips to be stacked are assigned to each wire of each semiconductor chip which wire is to be connected to another semiconductor chip in a different layer. The ninth embodiment may also be combined with any one of the first through eighth embodiments.

Preferred embodiments of the present invention are described above. However, the present invention is not limited to the specifically disclosed embodiments, and variations and modifications may be made without departing from the scope of the present invention.

For example, although a semiconductor substrate (silicon wafer) in the above embodiments is assumed to have a circular shape in plan view, the shape of a semiconductor substrate is not limited to a circular shape. For example, a panel-like semiconductor substrate having a rectangular shape in plan view may be used.

Also, instead of a semiconductor substrate on which semiconductor chips are mounted, a substrate including a structural layer having no semiconductor chip may be used.

The material of a substrate where a semiconductor integrated circuit is formed is not limited to silicon, and may instead be, for example, gallium nitride or sapphire.

Also in the above embodiments, stacked semiconductor chips are connected to each other using electric signals that are sent through metal layers formed in via holes. However, the present invention is not limited to the above described embodiments. For example, stacked semiconductor chips may be connected to each other using optical signals. In this case, instead of metal layers, optical waveguides may be formed in the via holes.

In the above embodiments, via holes are formed after electrode pads are formed in semiconductor chips. Alternatively, electrode pads may be formed after via holes are formed. Also, a step (damascene process) of grinding the upper surface of a metal layer filling a via hole by, for example, chemical mechanical polishing (CMP) may be added.

Two or more of the connection patterns of electrode pads and via holes described in the above embodiments may be combined and used in one semiconductor device.

Variations similar to the variations of the first embodiment described above may also be applied to the second through sixth embodiments.

The present international application claims priority from International Application PCT/JP2011/055486 filed on Mar. 9, 2011, the entire contents of which are hereby incorporated herein by reference.

EXPLANATION OF REFERENCES 100, 100A, 100B, 100C, 100D, 100E, 100F, 100G, 100H, 100I Semiconductor device
111, 211, 211c, 611, 611c Semiconductor substrate
111a Main surface
111b Back surface
160a Surface
120, 220, 320, 420, 620 Main substrate
130, 230, 330, 430, 630 Semiconductor integrated circuit
140, 240, 280 Insulating layer
150, 150a, 150b, 250, 250a, 250b, 350, 350a, 350b, 450, 450a, 450b, 650 Electrode pad
155, 159, 259, 359, 459 Wire
160, 255, 260, 355, 360, 455, 460, 660, 655, 860 Resin layer
210y, 210z, 310y, 310z, 410y, 410z, 600y, 600z Via hole
211x Recess
270, 370 Resist film
290, 380, 380a, 390, 390a, 380b, 385, 480, 480a, 680 Metal layer
270x, 270y, 270z, 370x, 370y, 460x, 990x Opening
600 Stacked structure
810 Structural layer
810c Silicon substrate
810d Insulating film
810x Groove
910 External connection terminal
960 Adhesive layer
970 Support
975 Pressing part
990 Frame part
990y Gap
B Scribe region
C Cutting position
D1, D2 Depth
H1 Height
$\phi 1$-$\phi 3$ Diameter

The invention claimed is:

1. A semiconductor device production method, comprising:

preparing separate first semiconductor chips including first main surfaces and first semiconductor integrated circuits on the first main surfaces;
temporarily fixing, to a support, the first main surfaces of the first semiconductor chips;
forming a sealing insulating layer that seals at least parts of side surfaces of the first semiconductor chips temporarily fixed to the support;
preparing a semiconductor substrate including a second main surface and second semiconductor chips formed on the second main surface, the second semiconductor chips including second semiconductor integrated circuits;
stacking the first semiconductor chips, which are temporarily fixed to the support, via an insulating layer on the second semiconductor chips such that opposite surfaces of the first semiconductor chips, which are opposite to the first main surfaces and exposed from the sealing insulating layer, are disposed between the first main surfaces and the second main surface of the semiconductor substrate;
removing the support after stacking the first semiconductor chips on the second semiconductor chips;
forming via holes that pass through the first semiconductor chips; and
forming connecting parts through the via holes, the connecting parts enabling signal transmission between the first semiconductor chips and the second semiconductor chips in different layers.

2. The semiconductor device production method as claimed in claim 1, wherein in the forming the connecting parts, second via holes that pass through the sealing insulating layer are also formed, and the connecting parts enabling signal transmission between the first semiconductor chips and the second semiconductor chips in the different layers are also formed through the second via holes.

3. The semiconductor device production method as claimed in claim 1, wherein in the stacking, instead of the first semiconductor chips, stacked structures formed by stacking multiple separate semiconductor chips are stacked via the insulating layer on the second semiconductor chips formed on the semiconductor substrate such that opposite surfaces of the stacked structures opposite to main surfaces thereof face the second main surface of the semiconductor substrate.

4. The semiconductor device production method as claimed in claim 3, further comprising:

stacking semiconductor substrates each having a main surface on which multiple semiconductor chips including semiconductor integrated circuits are formed, connecting the semiconductor chips of the semiconductor substrates in different layers to each other to enable signal transmission, and separating a structure formed thereby into stacks of the semiconductor chips to form the stacked structures.

5. The semiconductor device production method as claimed in claim 4, wherein the stacked structures are formed by preparing a first semiconductor substrate and a second semiconductor substrate;
thinning the second semiconductor substrate;
bonding an opposite surface opposite to a main surface of the thinned second semiconductor substrate via an insulating layer to a main surface of the first semiconductor substrate;

forming via holes that pass through the thinned second semiconductor substrate from the main surface to the opposite surface of the second semiconductor substrate;

forming connecting parts through the via holes to enable signal transmission between the semiconductor chips of the first semiconductor substrate and the semiconductor chips of the second semiconductor substrate; and separating a structure formed thereby into stacks of the semiconductor chips.

6. The semiconductor device production method as claimed in claim 1, wherein the first semiconductor chips have different functions or shapes.

7. The semiconductor device production method as claimed in claim 1, wherein in each of the first semiconductor chips and the second semiconductor chips, multiple electrode pads corresponding to a number of semiconductor chips to be stacked are assigned to each of wires to be connected to the semiconductor chips to be stacked;

the electrode pads are connected to the corresponding connecting parts; and some of the electrode pads are not connected to any one of the wires.

8. The semiconductor device production method as claimed in claim 1, further comprising:

preparing separate third semiconductor chips including third main surfaces and third semiconductor integrated circuits on the third main surfaces;

stacking the third semiconductor chips via a second insulating layer on the first semiconductor chips such that opposite surfaces opposite to the third main surfaces face the second insulating layer; and forming connecting parts that enable signal transmission between the third semiconductor chips and the first semiconductor chips.

9. The semiconductor device production method as claimed in claim 8, further comprising:

thinning at least one of the semiconductor substrate, the first semiconductor chips, and the third semiconductor chips.

10. The semiconductor device production method as claimed in claim 1, wherein the semiconductor substrate has a substantially-circular shape in plan view.

11. The semiconductor device production method as claimed in claim 1, wherein the connecting parts connect the first semiconductor chips and the second semiconductor chips in the different layers to each other via electric signals.

12. The semiconductor device production method as claimed in claim 1, wherein the connecting parts connect the first semiconductor chips and the second semiconductor chips in the different layers to each other via optical signals.

13. The semiconductor device production method as claimed in claim 1, wherein a structural layer is provided between the first semiconductor chips and the second semiconductor chips, the structural layer including no semiconductor chip and being insulated from the first semiconductor chips and the second semiconductor chips.

14. The semiconductor device production method as claimed in claim 13, wherein the structural layer is a substrate, a metal layer, or an insulating layer.

15. The semiconductor device production method as claimed in claim 13, wherein the structural layer includes a function to cool the semiconductor chips.

16. The semiconductor device production method as claimed in claim 13, wherein the structural layer includes a MEMS.

17. The semiconductor device production method as claimed in claim 9, wherein a thickness of the at least one of the semiconductor substrate, the first semiconductor chips, and the third semiconductor chips thinned in the thinning is five times or more greater than a device isolation depth of a device included in the at least one of the semiconductor substrate, the first semiconductor chips, and the third semiconductor chips.

18. The semiconductor device production method as claimed in claim 9, wherein a thickness of the at least one of the semiconductor substrate, the first semiconductor chips, and the third semiconductor chips thinned in the thinning is greater than or equal to 1 μm.

19. The semiconductor device production method as claimed in claim 1, wherein the via holes have an aspect ratio of greater than or equal to 0.5 and less than or equal to 5.

* * * * *